(12) United States Patent
Fujimori et al.

(10) Patent No.: US 6,630,280 B1
(45) Date of Patent: Oct. 7, 2003

(54) POSITIVE PHOTORESIST COMPOSITION

(75) Inventors: Toru Fujimori, Shizuoka (JP); Shiro Tan, Shizuoka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 09/512,664

(22) Filed: Feb. 24, 2000

(30) Foreign Application Priority Data

| Feb. 24, 1999 | (JP) | ............ 11-046524 |
| Dec. 28, 1999 | (JP) | ............ 11-372757 |
| Apr. 13, 1999 | (JP) | ............ 11-105485 |
| Oct. 20, 1999 | (JP) | ............ 11-298608 |

(51) Int. Cl.$^7$ ............................. G03F 7/00

(52) U.S. Cl. ............. 430/270.1; 430/905; 430/914; 430/326

(58) Field of Search .............. 430/270.1, 905, 430/914, 326

(56) References Cited

U.S. PATENT DOCUMENTS

| 5,558,971 | A | * | 9/1996 | Urano et al. ............... 430/170 |
| 5,629,136 | A | * | 5/1997 | Higashi et al. ............ 430/272.1 |
| 5,843,624 | A | * | 12/1998 | Houlihan et al. ............ 430/296 |
| 6,165,678 | A | * | 12/2000 | Allen et al. .............. 430/270.1 |
| 6,265,135 | B1 | * | 7/2001 | Kodama et al. ............ 430/286.1 |

FOREIGN PATENT DOCUMENTS

JP 3-192173 * 8/1991

OTHER PUBLICATIONS

English abstract for JP 3–192173, published by Japan Patent office, Aug. 22, 1991.*

* cited by examiner

*Primary Examiner*—Janet Baxter
*Assistant Examiner*—Sin J. Lee
(74) *Attorney, Agent, or Firm*—Sughrue Mion, PLLC

(57) ABSTRACT

A positive photoresist composition comprising:
  (a) a resin having structural units represented by the following formulae (X) and being capable of decomposing by, the action of an acid to increase the solubility in an alkali developer, and
  (b) a compound capable of generating an acid with irradiation of actinic ray or radiation:

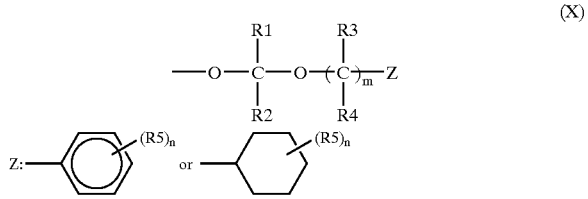

wherein R1 and R2, which may be the same or different, each represents a hydrogen atom or an alkyl group having from 1 to 4 carbon atoms, R3 and R4, which may be the same or different, each represents a hydrogen atom or a linear, branched or cyclic alkyl group which may have a substituent, R5 represents a linear, branched or cyclic alkyl group which may have a substituent, an aryl group which may have a substituent or an aralkyl group which may have a substituent, m represents an integer of from 1 to 20, and n represents an integer of from 0 to 5.

13 Claims, No Drawings

POSITIVE PHOTORESIST COMPOSITION

FIELD OF THE INVENTION

The present invention relates to a positive photoresist composition for use in the production of semiconductor integrated circuit device, mask for production of integrated circuit, printed wiring board, liquid crystal panel and the like.

BACKGROUND OF THE INVENTION

As the positive photoresist composition, chemical amplification system resist compositions described in U.S. Pat. No. 4,491,628 and European Patent No. 29,139 are known. The chemical amplification-type positive resist composition is a pattern-forming material in which a reaction takes place utilizing an acid generated on an exposed area with irradiation of actinic ray or a radiation such as far ultraviolet ray as a catalyst to thereby differentiate the solubility in a developer between the area exposed and the area not exposed, thereby providing a pattern on a substrate.

The chemical amplification-type positive resist composition can be roughly classified into a three-component system comprising an alkali-soluble resin, a compound capable of generating an acid by the exposure to a radiation (photo-acid generator) and a dissolution-inhibiting compound for the alkali-soluble resin, a two-component system comprising a resin having a group capable of decomposing by the reaction with an acid to thereby become alkali-soluble and a photo-acid generator, and a hybrid system comprising a resin having a group capable of decomposing by the reaction with an acid to thereby become alkali-soluble, a low molecular weight dissolution-inhibiting compound having an acid-decomposable group and a photo-acid generator.

JP-A-9-319092 (the term "JP-A" as used herein means an "unexamined published Japanese patent application") discloses that a resin in which an acetal group having introduced thereinto an oxy linkage is introduced is effective in reducing the standing wave.

Also, JP-A-10-221854 discloses a resin having a substituted acetal group unit.

However, these resins having an acetal group form a round top shape and the rectangular property of profile is deficient, and in particular, development defect is in need of improvement.

SUMMARY OF THE INVENTION

The object of the present invention is to provide a chemical amplification-type positive photoresist composition having high sensitivity and high resolution, being improved in the development defect and rectangular property, and causing substantially no surface roughness.

Under these circumstances, the present inventors have made extensive investigations and found that the above-described object can be attained by using a positive photoresist composition comprising a compound containing an acid-decomposable group having a specific structure. The present invention has been accomplished based on this finding.

More specifically, the object of the present invention can be attained mainly by the following positive photoresist compositions.

(1) A positive photoresist composition comprising:
  (a) a resin which has a structural unit having a group represented by the following formula (X) and is capable of decomposing by the action of an acid to increase the solubility in an alkali developer, and
  (b) a compound capable of generating an acid with irradiation of actinic ray or radiation:

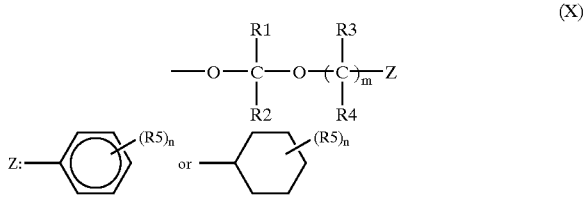

wherein R1 and R2, which may be the same or different, each represents a hydrogen atom or an alkyl group having from 1 to 4 carbon atoms, R3 and R4, which may be the same or different, each represents a hydrogen atom or a linear, branched or cyclic alkyl group which may have a substituent, R5 represents a linear, branched or cyclic alkyl group which may have a substituent, an aryl group which may have a substituent or an aralkyl group which may have a substituent, m represents an integer of from 1 to 20, and n represents an integer of from 0 to 5.

(2) A positive photoresist composition comprising:
  (a) a resin having structural units represented by the following formulae (I), (II) and (III) and being capable of decomposing by the action of an acid to increase the solubility in an alkali developer, and
  (b) a compound capable of generating an acid with irradiation of actinic ray or radiation:

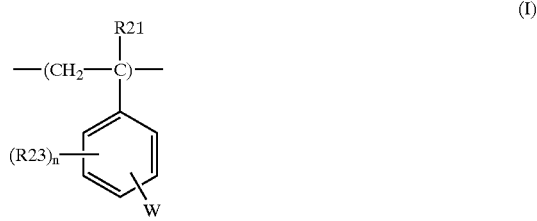

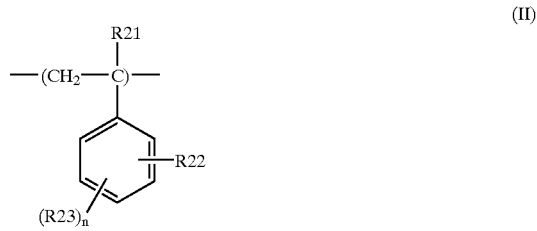

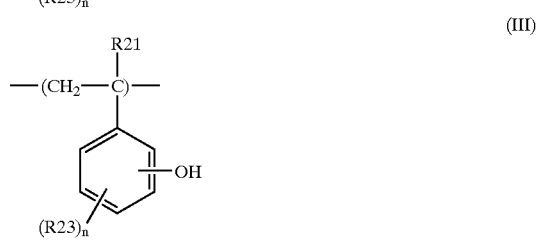

wherein R21 represents a hydrogen atom or a methyl group, R22 represents a group incapable of decomposing by the action of an acid, R23 represents a hydrogen atom, a halogen atom, an alkyl group, an aryl group, an alkoxy group, an acyl group or an acyloxy group, n represents an integer of from 1 to 3 and W represents a group represented by the above formula (X).

(3) The positive photoresist composition as described in the above item (2), wherein the ratio of structural formulae (I), (II) and (III) satisfies the following conditions (i) to (iv):

$$0.1 < (I)/[(I)+(II)+(III)] < 0.25, \quad (i)$$

$$1 < (II)/[(I)+(II)+(III)] < 0.15, \quad (ii)$$

$$(I) > (II), \text{ and} \quad (iii)$$

$$0.5 < (I)/[(I)+(II)] < 0.85 \quad (iv)$$

(wherein (I), (II) and (III) each represents a molar fraction of a structural unit having a group represented by formula (I), (II) or (III), respectively).

(4) The positive photoresist composition as described in any one of the above items (1) to (3), wherein the compound (b) capable of generating an acid with irradiation of actinic ray or radiation is at least one of the compounds capable of generating a sulfonic acid with irradiation of actinic ray or radiation, represented by the following formulae (A-1), (A-2), (A-3), (A-4), (A-5), (A-6) and (A-7);

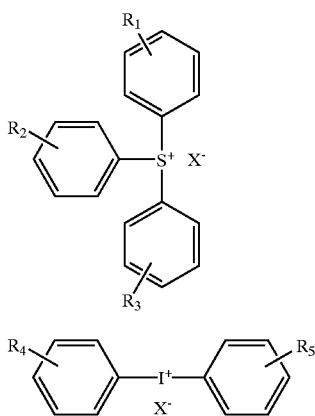

(A-1)

(A-2)

wherein $R_1$ to $R_5$, which may be the same or different, each represents a hydrogen atom, an alkyl group, a cycloalkyl group, an alkoxy group, a hydroxy group, a halogen atom, or —S—$R_6$ (wherein $R_6$ represents an alkyl group or an aryl group), and $X^-$ represents an anion of benzenesulfonic acid, naphthalenesulfonic acid or anthracenesulfonic acid having 1) at least one group selected from the group consisting of a branched or cyclic alkyl or alkoxy group having 8 or more carbon atoms, 2) at least two groups selected from the group consisting of a linear, branched or cyclic alkyl or alkoxy group having from 4 to 7 carbon atoms, 3) at least three groups selected from the group consisting of a linear or branched alkyl or alkoxy group having from 1 to 3 carbon atoms, 4) from 1 to 5 halogen atoms, or 5) a linear or branched ester group having from 1 to 10 carbon atoms;

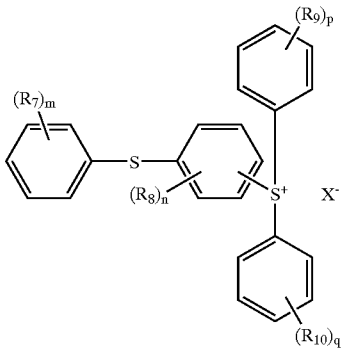

(A-3)

wherein $R_7$ to $R_{10}$, which may be the same or different, each represent a hydrogen atom, an alkyl group, a cycloalkyl group, an alkoxy group, a hydroxy group or a halogen atom, $X^-$ has the same meaning as defined above, and m, n, p and q represents an integer of from 1 to 3;

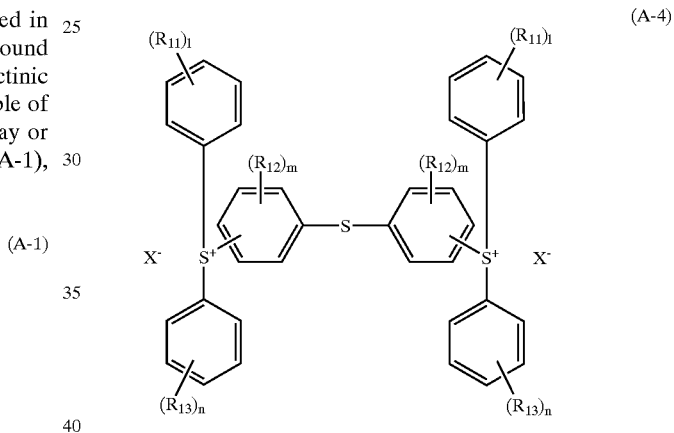

(A-4)

wherein $R_{11}$ to $R_{13}$, which may be the same or different, each represents a hydrogen atom, an alkyl group, a cycloalkyl group, an alkoxy group, a hydroxy group, a halogen atom or —S—$R_6$, $X^-$ has the same meaning as defined above, l, m and n, which may be the same or different, each represents an integer of from 1 to 3, and when l, m and n each is 2 or 3, two groups out of two or three $R_{11}$, $R_{12}$ or $R_{13}$ groups may be combined with each other to form a ring consisting of from 5 to 8 elements, including a carbocyclic, heterocyclic or aromatic ring;

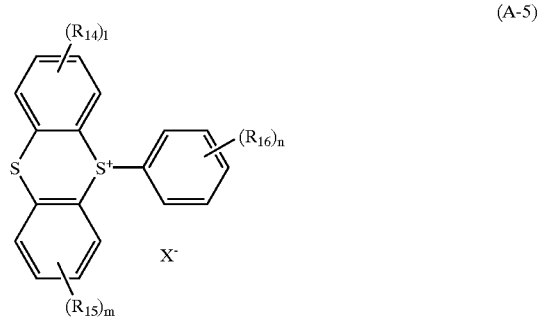

(A-5)

$R_{14}$ to $R_{16}$, which may be the same or different, each represents a hydrogen atom, an alkyl group, a cycloalkyl group, an alkoxy group, a hydroxy group, a halogen atom or —S—$R_6$, $R_6$ and $X^-$ have the same meanings as defined above, l, m and n, which may be the same or different, each represents an integer of from 1 to 3, and when l, m and n each is 2 or 3, two groups out of two or three of each of $R_{14}$, $R_{15}$ and $R_{16}$ groups may be combined with each other to form a ring consisting of from 5 to 8 elements, including a carbocyclic, heterocyclic or aromatic ring;

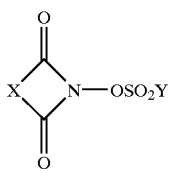

(A-6)

wherein Y represents a linear, branched or cyclic alkyl group which may be substituted, an aralkyl group which may be substituted, or

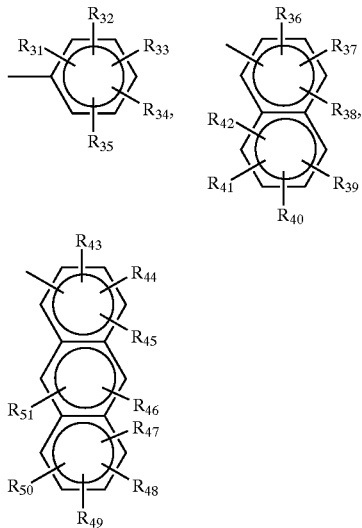

wherein $R_{31}$ to $R_{51}$, which may be the same, each represents a hydrogen atom, a linear, branched or cyclic alkyl, alkoxy, acyl, acylamino, sulfonylamino, aryl, acyloxy, aralkyl or alkoxycarbonyl group which may have a substituent, a formyl group, a nitro group, chlorine atom, bromine atom, iodine atom, a hydroxyl group or a cyano group, and two of $R_{31}$ to $R_{35}$, two of $R_{36}$ to $R_{42}$, or two of $R_{43}$ to $R_{51}$ may be combined to form a 5-, 6-, 7- or 8-membered ring consisting of a carbon and/or hetero atom, provided that Y may be combined with a residue of another imido sulfonate compound, and X represents a linear or branched alkylene group which may have a substituent, a monocyclic or polycyclic alkylene group which may have a substituent or may contain a hetero atom, a linear or branched alkylene group which may be substituent, a monocyclic or polycyclic alkenylene group which may be substituted or may contain a hetero atom, an arylene group which may be substituted, or an aralkylene group which may be substituted, provided that X may be combined with another imido sulfonate residue; and $$Ar_1—SO_2—SO_2—Ar_2 \qquad (A-7)$$

wherein $Ar_1$ and $Ar_2$, which may be the same or different, each represents a substituted or unsubstituted aryl group.

(5). The positive photoresist composition as described in any one of the above items (1) to (4), which further contains a cyclic amine compound.

(6) The positive photoresist composition as described in any one of the above items (1) to (5), which further contains at least one of a fluorine surfactant and a silicon surfactant.

(7). The positive photoresist composition as described in any one of the above items (1) to (6), which further contains a compound capable of decomposing by the action of an acid to increase the solubility in an alkali developer.

DETAILED DESCRIPTION OF THE INVENTION

The present invention is described in detail below.

(a)-1: Resin Which has a Structural Unit Having a Group Represented by the Following Formula (X) and is Capable of Decomposing by the Action of an Acid to Increase the Solubility in an Alkali Developer In formula (X), the alkyl group represented by R1 or R2 includes an alkyl group having from 1 to 4 carbon atoms, such as a methyl group, an ethyl group, a n-propyl group, an isopropyl group, an n-butyl group, an isobutyl group, a sec-butyl group and a t-butyl group.

R3 and R4, which may be the same or different, each represents a hydrogen atom or a linear, branched or cyclic alkyl group which may have a substituent.

The linear alkyl group preferably has from 1 to 30 carbon atoms, more preferably from 1 to 20 carbon atoms, and examples thereof include a methyl group, an ethyl group, a n-propyl group, a n-butyl group, a n-pentyl group, a n-hexyl group, a n-heptyl group, a n-octyl group, a n-nonyl group and a n-decanyl group.

The branched alkyl group preferably has from 1 to 30 carbon atoms, more preferably from 1 to 20 carbon atoms, and examples thereof include an i-propyl group, an i-butyl group, a t-butyl group, an i-pentyl group, a t-pentyl group, an i-hexyl group, a t-hexyl group, an i-heptyl group, a t-heptyl group, an i-octyl group, a t-octyl group, a i-nonyl group and t-decanoyl group.

The cyclic alkyl group preferably has from 3 to 30 carbon atoms, more preferably from 3 to 20 carbon atoms, and examples thereof include a cycloptopyl group, a cyclobutyl group, a cyclopentyl group, a cyclohexyl group, a cycloheptyl group, a cyclooctyl group, a cyclononyl group and a cyclodecanoyl group.

R5 represents a linear, branched or cyclic alkyl group which may have substituent, an aryl group which may have a substituent, or an aralkyl group which may have a substituent.

The linear or branched alkyl group represented by R5 preferably has from 1 to 30 carbon atoms, more preferably from 1 to 20 carbon atoms, and examples thereof include a methyl group, an ethyl group, an n-propyl group, an i-propyl group, a n-butyl group, an i-butyl group, a t-butyl group, a n-pentyl group, a i-pentyl group, a t-pentyl group, a n-hexyl group, an i-hexyl group, a t-hexyl group, a n-heptyl group, an i-heptyl group, a t-heptyl group, a n-octyl group, an i-octyl group, a t-octyl group, a n-nonyl group, an i-nonyl group, a t-nonyl group, a n-decanyl group, an i-decanyl group, a t-decanyl group, a n-undecyl group, an i-undecyl group, a n-dodecyl group, an i-dodecyl group, a n-tridecyl group, an i-tridecyl group, a n-tetradecyl group, an i-tetradecyl group, a n-pentadecyl group, an i-pentadecyl group, a n-hexadecyl group, an i-hexadecyl group, a n-heptadecyl group, an i-heptadecyl group, a n-octadecyl group, an i-octadecyl group, a n-nonadecyl group and an i-nonadecyl group.

The cyclic alkyl group represented by R5 preferably has from 3 to 30 carbon atoms, more preferably from 3 to 20 carbon atoms, and the cyclic alkyl group may form a ring having 20 or less carbon atoms or may have a substituent. Examples thereof include a cyclopropyl group, a cyclobutyl group, a cyclopentyl group, a cyclohexyl group, a cycloheptyl group, a cyclooctyl group, a cyclononyl group, a cyclodecanyl group, a cycloundecyl group, a cyclododecyl group, a cyclotridecyl group, a cyclotetradecyl group, a cyclopentadecyl group, a cyclohexadecyl group, a cycloheptadecyl group, a cyclooctadecyl group, a cyclononadecyl group, a 4-cyclohexylcyclohexyl group, a 4-n-hexylcyclohexyl group, a pentanylcyclohexyl group, a hexyloxcyclohexyl group and a pentanyloxycyclohexyl group. Other than these, substituted cyclic alkyl groups falling within the above-described range can also be used.

The aryl group represented by R5 preferably has from 6 to 30 carbon atoms, more preferably from 6 to 20 carbon atoms, and examples thereof include a phenyl group, a 4-methylphenyl group, a 3-methylphenyl group, a 2-methylphenyl group, a 4-ethylphenyl group, a 3-ethylphenyl group, a 2-ethylphenyl group, a 4-n-propylphenyl group, a 3-n-propylphenyl group, a 2-n-propylphenyl group, 4-i-propylphenyl group, a 3-i-propylphenyl group, a 2-i-propylphenyl group, 4-cyclopropylphenyl group, 3-cyclopropylphenyl group, 2-cyclopropylphenyl group, a 4-n-butylphenyl group, a 3-n-butylphenyl group, a 2-n-butylphenyl group, a 4-i-butylphenyl group, a 3-i-butylphenyl group, a 2-i-butylphenyl group, a 4-t-butylphenyl group, a 3-t-butylphenyl group, a 2-t-butylphenyl group, a 4-cyclobutylphenyl group, a 3-cyclobutylphenyl group, a 2-cyclobutylphenyl group, a 4-cyclopentylphenyl group, a 4-cyclohexylphenyl group, a 4-cycloheptenylphenyl group, a 4-cyclooctanylphenyl group, a 2-cyclopentylphenyl group, a 2-cyclohexylphenyl group, a 2-cycloheptenylphenyl group, a 2-cyclooctanylphenyl group, a 3-cyclopentylphenyl group, a 3-cyclohexylphenyl group, a 3-cycloheptenylphenyl group, a 3-cyclooctanylphenyl group, a 4-cyclopentyloxyphenyl group, a 4-cyclohexyloxyphenyl group, a 4-cycloheptenyloxyphenyl group, a 4-cyclooctanyloxyphenyl group, a 2-cyclopentyloxyphenyl group, a 2-cyclohexyloxyphenyl group, a 2-cycloheptenyloxyphenyl group, a 2-cyclooctanyloxyphenyl group, a 3-cyclopentyloxyphenyl group, a 3-cyclohexyloxyphenyl group, a 3-cycloheptenyloxyphenyl group, a 3-cyclooctanyloxyphenyl group, a 4-n-pentylphenyl group, a 4-n-hexylphenyl group, a 4-n-heptenylphenyl group, a 4-n-octanylphenyl group, a 2-n-pentylphenyl group, a 2-n-hexylphenyl group, a 2-n-heptenylphenyl group, a 2-n-octanylphenyl group, a 3-n-pentylphenyl group, a 3-n-hexylphenyl group, a 3-n-heptenylphenyl group, a 3-n-octanylphenyl group, a 2,6-di-isopropylphenyl group, a 2,3-di-isopropylphenyl group, a 2,4-di-isopropylphenyl group, a 3,4-di-isopropylphenyl group, a 3,6-di-t-butylphenyl group, a 2,3-di-t-butylphenyl group, a 2,4-di-t-butylphenyl group, a 3,4-di-t-butylphenyl group, a 2,6-di-n-butylphenyl group, a 2,3-di-n-butylphenyl group, a 2,4-di-n-butylphenyl group, a 3,4-di-n-butylphenyl group, a 2,6-di-i-butylphenyl group, a 2,3-di-i-butylphenyl group, a 2,4-di-i-butylphenyl group, a 3,4-di-i-butylphenyl group, a 2,6-di-t-amylphenyl group, a 2,3-di-t-amylphenyl group, a 2,4-di-t-amylphenyl group, a 3,4-di-t-amylphenyl group, a 2,6-di-i-amylphenyl group, a 2,3-di-i-amylphenyl group, a 2,4-di-i-amylphenyl group, a 3,4-di-i-amylphenyl group, a 2,6-di-n-pentylphenyl group, a 2,3-di-n-pentylphenyl group, a 2,4-di-n-pentylphenyl group, a 3,4-di-n-pentylphenyl group, a 4-adamantylphenyl group, a 2-adamantylphenyl group, a 4-isoboronylphenyl group, a 3-isoboronylphenyl group, a 2-isoboronylphenyl group, a 4-n-pentyloxyphenyl group, a 4-n-hexyloxyphenyl group, a 4-n-heptenyloxyphenyl group, a 4-n-octanyloxyphenyl group, a 2-n-pentyloxyphenyl group, a 2-n-hexyloxyphenyl group, a 2-n-heptenyloxyphenyl group, a 2-n-octanyloxyphenyl group, a 3-n-pentyloxyphenyl group, a 3-n-hexyloxyphenyl group, a 3-n-heptenyloxyphenyl group, a 3-n-octanyloxyphenyl group, a 2,6-di-isopropyloxyphenyl group, a 2,3-di-isopropyloxyphenyl group, a 2,4-di-isopropyloxyphenyl group, a 3,4-di-isopropyloxyphenyl group, a 2,6-di-t-butyloxyphenyl group, a 2,3-di-t-butyloxyphenyl group, a 2,4-di-t-butyloxyphenyl group, a 3,4-di-t-butyloxyphenyl group, a 2,6-di-n-butyloxyphenyl group, a 2,3-di-n-butyloxyphenyl group, a 2,4-di-n-butyloxyphenyl group, a 3,4-di-n-butyloxyphenyl group, a 2,6-di-i-butyloxyphenyl group, a 2,3-di-i-butyloxyphenyl group, a 2,4-di-i-butyloxyphenyl group, a 3,4-di-i-butyloxyphenyl group, a 2,6-di-t-amyloxyphenyl group, a 2,3-di-t-amyloxyphenyl group, a 2,4-di-t-amyloxyphenyl group, a 3,4-di-t -amyloxyphenyl group, a 2,6-di-i-amyloxyphenyl group, a 2,3-di-i-amyloxyphenyl group, a 2,4-di-i-amyloxyphenyl group, a 3,4-di-i-amyloxyphenyl group, a 2,6-di-n-pentyloxyphenyl group, a 2,3-di-n-pentyloxyphenyl group, a 2,4-di-n-pentyloxyphenyl group, a 3,4-di-n-pentyloxyphenyl group, a 4-adamantyloxyphenyl group, a 3-adamantyloxyphenyl group, a 2-adamantyloxyphenyl group, a 4-isoboronyloxyphenyl group, a 3-isoboronyloxyphenyl group and a 2-isoboronyloxyphenyl group. These groups each may be further substituted within the above-described range and the substituent is not limited to those described above.

The aralkyl group represented by R5 preferably has from 7 to 30 carbon atoms, more preferably from 7 to 20 carbon atoms, and examples thereof include a phenylethyl group, a 4-methylphenylethyl group, a 3-methylphenylethyl group, a 2-methylphenylethyl group, a 4-ethylphenylethyl group, a 3-ethylphenylethyl group, a 2-ethylphenylethyl group, a 4-n-propylphenylethyl group, a 3-n-propylphenylethyl group, a 2-n-propylphenylethyl group, a 4-i-propylphenylethyl group, a 3-i-propylphenylethyl group, a 2-i-propylphenylethyl group, a 4-cyclopropylphenylethyl group, a 3-cyclopropylphenylethyl group, a 2-cyclopropylphenylethyl group, a 4-n-butylphenylethyl group, a 3-n-butylphenylethyl group, a 2-n-butylphenylethyl group, a 4-i-butylphenylethyl group, a 3-butylphenylethyl group, a 2-i-butylphenylethyl group, a 4-t-butylphenylethyl group, a 3-t-butylphenylethyl group, a 2-t-butylphenylethyl group, a 4-cyclobutylphenylethyl group, a 3-cyclobutylphenylethyl group, a 2-cyclobutylphenylethyl group, a 4-cyclopentylphenylethyl group, a 4-cyclohexylphenylethyl group, a 4-cycloheptenylphenylethyl group, a 4-cyclooctanylphenylethyl group, a 2-cyclopentylphenylethyl group, a 2-cyclohexylphenylethyl group, a 2-cycloheptenylphenylethyl group, a 2-cyclooctanylphenylethyl group, a 3-cyclopentylphenylethyl group, a 3-cyclohexylphenylethyl group, a 3-cycloheptenylphenylethyl group, a 3-cyclooctanylphenylethyl group, a 4-cyclopentyloxyphenylethyl group, a 4-cyclohexyloxyphenylethyl group, a 4-cycloheptenyloxyphenylethyl group, a 4-cyclooctanyloxyphenylethyl group, a 2-cyclopentyloxypenylethyl group, a 2-cyclohexyloxyphenylethyl group, a 2-cycloheptenyloxyphenylethyl group, a 2-cyclooctanyloxyphenylethyl group, a 3-cyclopentyloxyphenylethyl group, a 3-cyclohexyloxyphenylethyl group, a 3-cycloheptenyloxyphenylethyl group, a 3-cyclooctanyloxyphenylethyl group, a 4-n-pentylphenylethyl group, a 4-n-hexylphenylethyl group, a 4-n-heptenylphenylethyl group, a 4-n-octanylphenylethyl group, a 2-n-pentylphenylethyl group, a 2-n-hexylphenylethyl group, a 2-n-heptenylphenylethyl group, a 2-n-octanylphenylethyl group, a 3-n-pentylphenylethyl group, a 3-n-hexylphenylethyl group, a 3-n-heptenylphenylethyl group, a 3-n-octanylphenylethyl group, a 2,6-di-isopropylphenylethyl group, a 2,3-di-isopropylphenylethyl group, a 2,4-di-isopropylphenylethyl group, a 3,4-di-isopropylphenylethyl group, a 2,6-di-t-butylphenylethyl group, a 2,3-di-t-butylphenylethyl group, a 2,4-di-t-butylphenylethyl group, a 3,4-di-t-butylphenylethyl group, a 2,6-di-n-butylphenylethyl group, a 2,3-di-n-butylphenylethyl group, a 2,4-di-n-butylphenylethyl group, a 3,4-di-n-butylphenylethyl group, a 2,6-di-i-butylphenylethyl group, a 2,3-di-i-butylphenylethyl group, a 2,4-di-i-butylphenylethyl group, a 3,4-di-i-butylphenylethyl group, a 2,6-di-t-amylphenylethyl group, a 2,3-di-t-amylphenylethyl group, a 2,4-di-t-amylphenylethyl group, a 3,4-di-t-amylphenylethyl group, a 2,6-di-i-amylphenylethyl group, a 2,3-di-i-amylphenylethyl group, a 2,4-di-i-amylphenylethyl group, a 3,4-di-i-amylphenylethyl group, a 2,6-di-n-pentylphenylethyl group, a 2,3-di-n-pentylphenylethyl group, a 2,4-di-n-pentylphenylethyl group, a 3,4-di-n-pentylphenylethyl group, a 4-adamantylphenylethyl group, a 3-adamantylphenylethyl group, a 2-adamantylphenylethyl group, a 4-isoboronylphenylethyl group, a 3-isoboronylphenylethyl group, a 2-isoboronylphenylethyl group, a 4-n-pentyloxyphenylethyl group, a 4-n-hexyloxyphenylethyl group, a 4-n-heptenyloxyphenylethyl group, a 4-n-octanyloxyphenylethyl group, a 2-n-pentyloxyphenylethyl group, a 2-n-hexyloxyphenylethyl group, a 2-n-heptenyloxyphenylethyl group, a 2-n-octanyloxyphenylethyl group, a 3-n-pentyloxyphenylethyl group, a 3-n-hexyloxyphenylethyl group, a 3-n-heptenyloxyphenylethyl group, a 3-n-octanyloxyphenylethyl group, a 2,6-di-isbpropyloxyphenylethyl group, a 2,3-di-isopropyloxyphenylethyl group, a 2,4-di-isopropyloxyphenylethyl group, a 3,4-di-isopropyloxyphenylethyl group, a 2,6-di-t-butyloxyphenylethyl group, a 2,3-di-t-butyloxyphenylethyl group, a 2,4-di-t-butyloxyphenylethyl group, a 3,4-di-t-butyloxyphenylethyl group, a 2,6-di-n-butyloxyphenylethyl group, a 2,3-di-n-butyloxyphenylethyl group, a 2,4-di-n-butyloxyphenylethyl group, a 3,4-di-n-butyloxyphenylethyl group, a 2,6-di-i-butyloxyphenylethyl group, a 2,3-di-i-butyloxyphenylethyl group, a 2,4-di-i-butyloxyphenylethyl group, a 3,4-di-i-butyloxyphenylethyl group, a 2,6-di-t-amyloxyphenylethyl group, a 2,3-di-t-amyloxyphenylethyl group, a 2,4-di-t-amyloxyphenylethyl group, a 3,4-di-t-amyloxyphenylethyl group, a 2,6-di-i-amyloxyphenylethyl group, a 2,3-di-i-amyloxyphenylethyl group, a 2,4-di-i-amyloxyphenylethyl group, a 3,4-di-i-amyloxyphenylethyl group, a 2,6-di-n-pentyloxyphenylethyl group, a 2,3-di-n-pentyloxyphenylethyl group, a 2,4-di-n-pentyloxyphenylethyl group, a 3,4-di-n-pentyloxyphenylethyl group, a 4-adamantyloxyphenylethyl group, a 3-adamantyloxyphenylethyl group, a 2-adamantyloxyphenylethyl group, a 4-isoboronyloxyphenylethyl group, a 3-isoboronyloxyphenylethyl group, a 2-isoboronyloxyphenylethyl group, and these groups where the alkyl group is replaced by a methyl group, a propyl group or a butyl group.

Other examples of the substituent for these groups include a hydroxyl group, a halogen atom (e.g., fluorine, chlorine, bromine, iodine), a nitro group, a cyano group, an alkyl group described above, an alkoxy group such as methoxy group, ethoxy group, hydroxyethoxy group, propoxy group, hydroxypropoxy group, n-butoxy group, isobutoxy group, sec-butoxy group and t-butoxy group, an alkoxycarbonyl group such as methoxycarbonyl group and ethoxycarbonyl group, an aralkyl group such as benzyl group, phenethyl group and cumyl group, an acyl group such as aralkyloxy group, formyl group, acetyl group, butyryl group, benzoyl group, cinnamyl group and valeryl group, an acyloxy group such as butyryloxy group, an alkenyl group described above, an alkenyloxy group such as vinyloxy group, propenyloxy group, allyloxy group and butenyloxy group, an aryl group described above, an aryloxy group such as phenoxy group, and an aryloxycarbonyl group such as benzoyloxy group.

The substituent of R5 is preferably an alkyl group having from 1 to 20 carbon atoms, an aryl group having from 6 to 20 carbon atoms or an aralkyl group having from 7 to 20 carbon atoms. These substituents each may further have a substituent.

Specific examples of the group represented by formula (X) are set forth below, however, the present invention is by no means limited thereto.

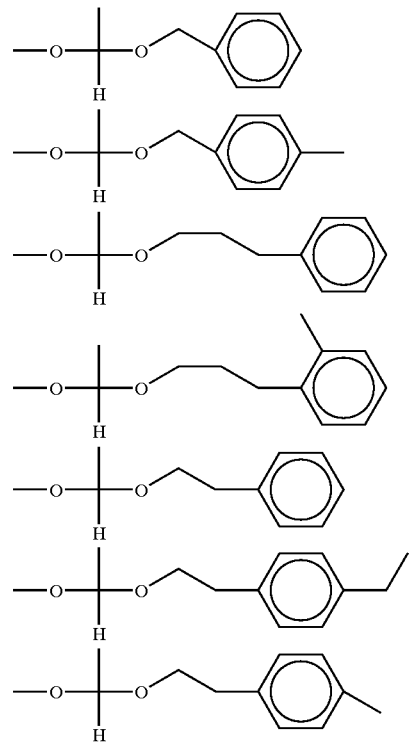

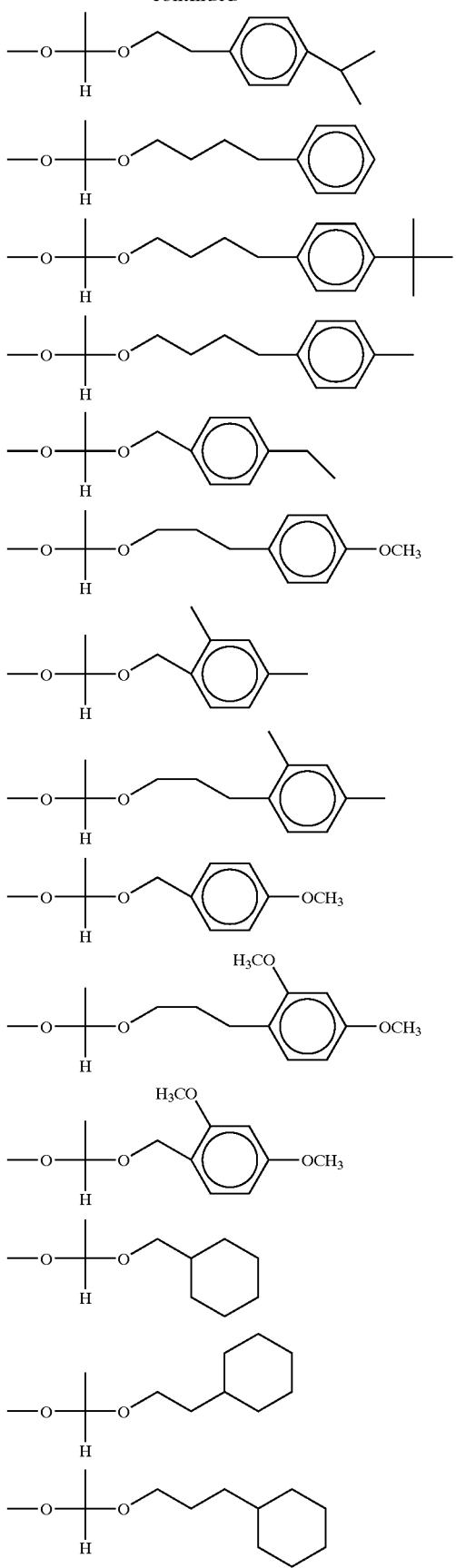
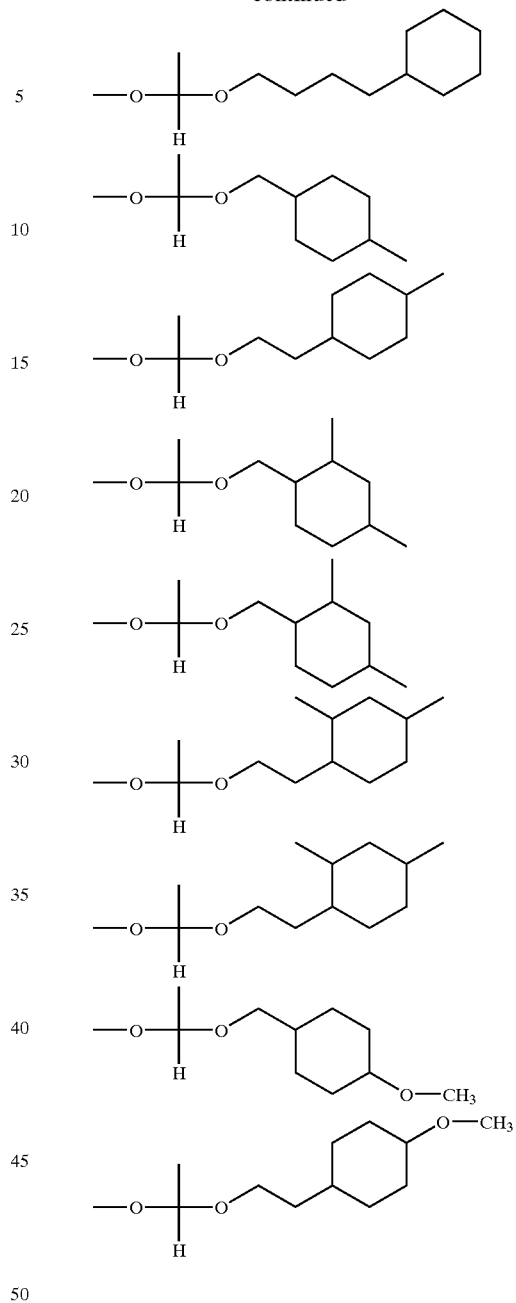

The resin which has a structural unit having a group represented by the following formula (X) and is capable of decomposing by the action of an acid to increase the solubility in an alkali developer (hereinafter sometimes referred to as "a resin having a group represented by formula (X)") is a compound which has a structure obtained by introducing an acid-decomposable group represented by formula (X) into a compound being obtained by the polymerization of a monomer and having a molecular weight distribution, and which becomes alkali-soluble by the action of an acid.

The resin having a group represented by formula (X) is a resin having a group represented by formula (X) on either one or both of the main chain and the side chain. A resin having the group represented by formula (X) on the side chain is more preferred.

In the case where the group represented by formula (X) is bonded as a side chain, the matrix resin is an alkali-soluble resin having —OH or —COOH, preferably —R⁰—COOH or —Ar—OH, on the side chain. For example, an alkali-soluble resin not containing an acid-decomposable group which is described later, can be used. In the resin, —R⁰— represents a divalent or greater aliphatic or aromatic hydrocarbon and —Ar— represents a divalent or greater aromatic group being monocyclic or polycyclic, which may have a substituent.

In the present invention, the matrix resin is preferably an alkali-soluble resin having a phenolic hydroxyl group.

The alkali-soluble resin having a phenolic hydroxyl group for use in the present invention is preferably a homopolymer or copolymer containing at least 30 mol %, preferably 50 mol % or more of a repeating unit corresponding to o-, m- or p-hydroxystyrene (these are collectively called "hydroxystyrene") or o-, m- or p-hydroxy-α-methylstyrene (these are collectively called "hydroxy-α-methylstyrene), or a resin where the benzene nucleus of the above-described unit is partially hydrogenated, more preferably a p-hydroxystyrene homopolymer.

The monomer other than the hydroxystyrene or hydroxy-α-methylstyrene for preparing the above-described copolymer by the copolymerization is preferably an acrylic acid ester, a methacrylic acid ester, an acrylamide, a methacrylamide, acrylonitrile, methacrylonitrile, maleic acid anhydride, styrene, α-methylstyrene, acetoxystyrene or an alkoxystyrene, more preferably styrene, acetoxystyrene or t-butoxystyrene.

The content of the repeating unit (structural unit) having a group represented by formula (X) is preferably from 5 to 50 mol %, more preferably from 5 to 30 mol % based on the sum of all the repeating units.

In the present invention, the resin having a group represented by formula (X) may contain an acid-decomposable group other than the group represented by formula (X).

The resin having a group represented by formula (X) may be obtained by synthesizing a corresponding vinyl ether and reacting it with a phenolic hydroxyl group-containing alkali-soluble resin dissolved in an appropriate solvent such as tetrahydrofuran by a known method. The reaction is performed generally in the presence of an acidic catalyst, preferably an acidic ion exchange resin, hydrochloric acid, p-toluenesulfonic acid or a salt such as pyridinium tosylate. The corresponding vinyl ether may be synthesized from an active starting-material such as chloroethyl vinyl ether by a nucleophilic substitution reaction or the like, or may be synthesized using a mercury or palladium catalyst.

Also, the corresponding vinyl ether may be synthesized using a corresponding alcohol and vinyl ether by a method of exchanging acetal. In this case, the alcohol have a substituent intended to introduce, the vinyl ether is allowed to have a relative unstable ether be mixed therein, and the reaction therebetween, is performed in the presence of an acid such as p-toluenesulfonic acid or pyridinium tosylate.

The resin having a group represented by formula (X) preferably has a weight average molecular weight of from 3,000 to 80,000, more preferably from 5,000 to 50,000. The molecular weight distribution (Mw/Mn) is generally from 1.01 to 4.0, preferably from 1.05 to 3.00. In order to obtain a polymer having such a molecular weight distribution, anion polymerization or radical polymerization is preferably used.

Specific structures of the resins having a group represented by formula (X) are shown below but the present invention is by no means limited thereto.

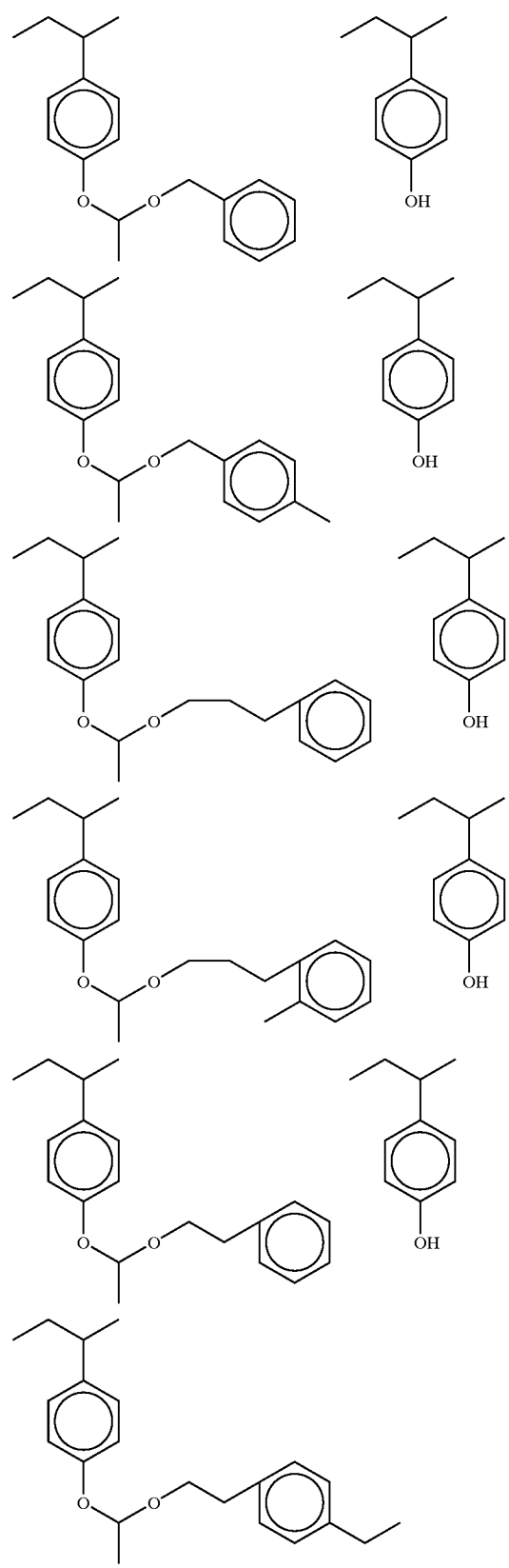

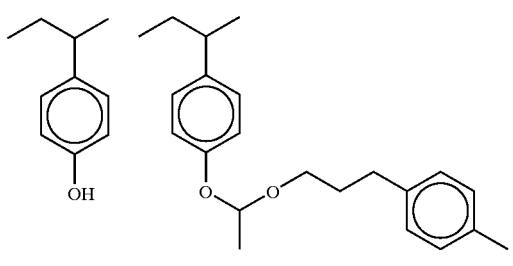
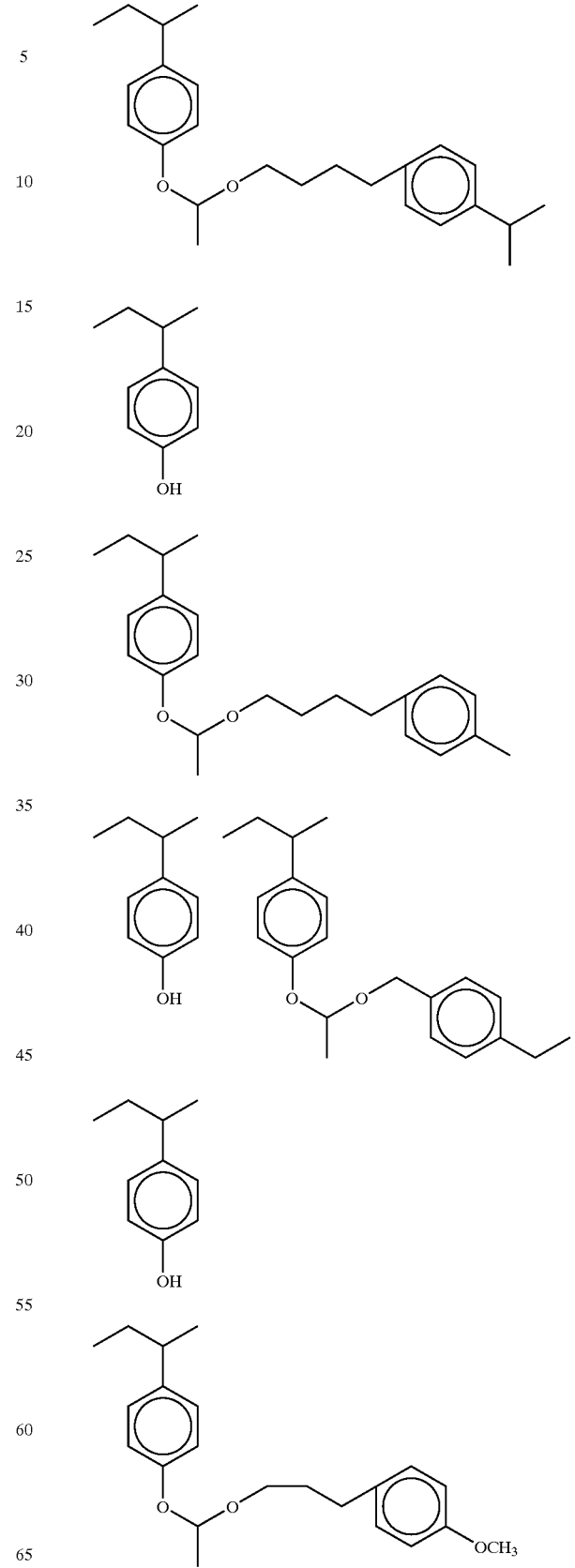

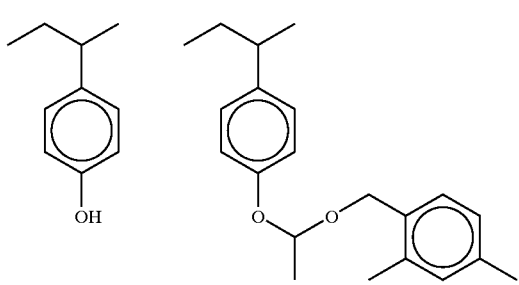
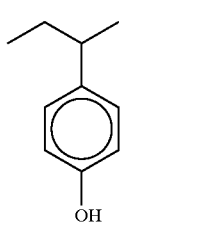
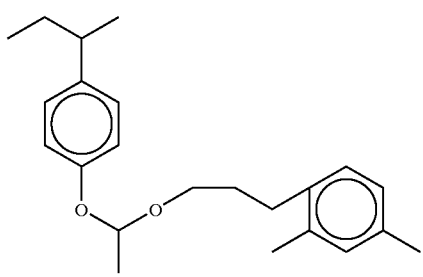
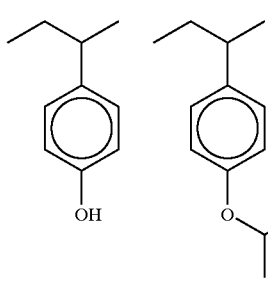
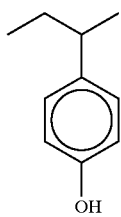
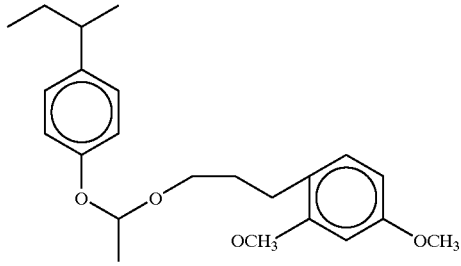
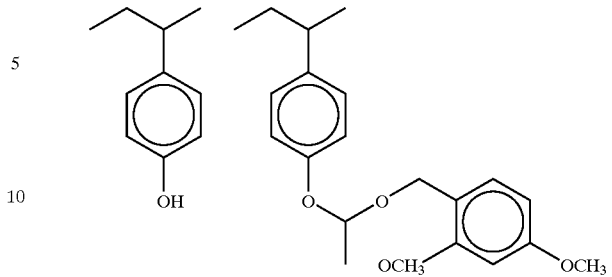
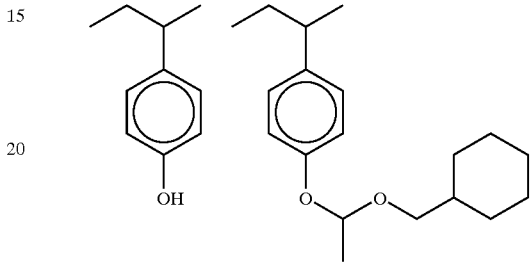
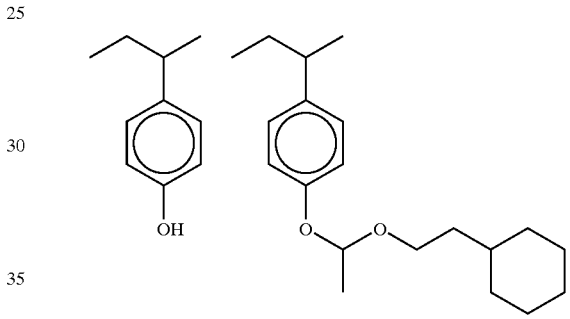
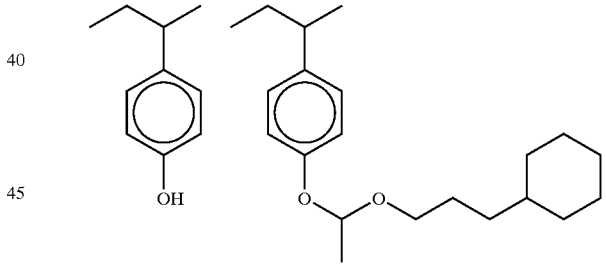
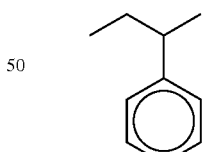
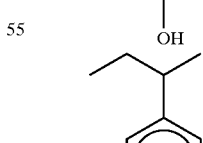
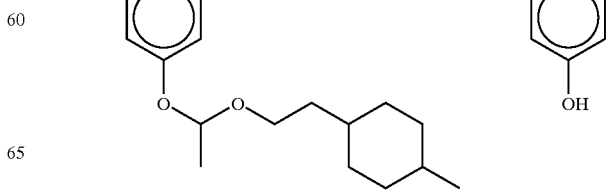

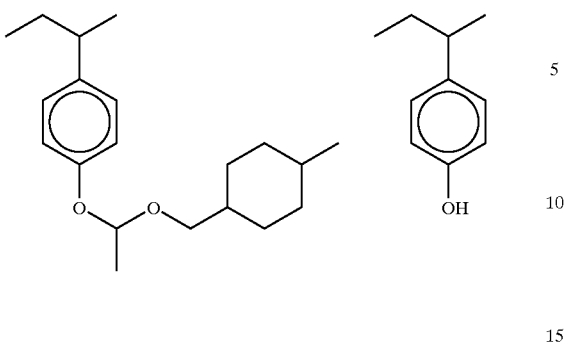

In the resins for use in the present invention, i.e., the resin having a group represented by formula (X) and the resin having structural units represented by formulae (I), (II) and (III), a cross-linked part connecting the polymer main chains with a polyfunctional acetal group may be introduced by adding a polyhydroxy compound at the stage of synthesis so as to control the rate of dissolution in alkali or improve heat resistance.

The amount of polyhydroxy compound added is from 0.01 to 10 mol %, preferably from 0.05 to 8 mol %, more preferably from 0.1 to 5 mol %, based on the number of hydroxyl groups in the resin.

The polyhydroxy compound has from 2 to 6 phenolic hydroxyl groups or alcoholic hydroxyl groups, preferably from 2 to 4 hydroxyl groups, more preferably 2 or 3 hydroxyl groups. Specific examples thereof are set forth below, however, the present invention is by no means limited thereto.

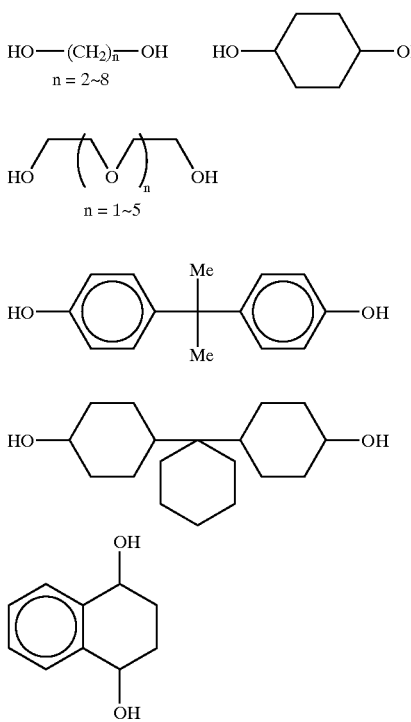

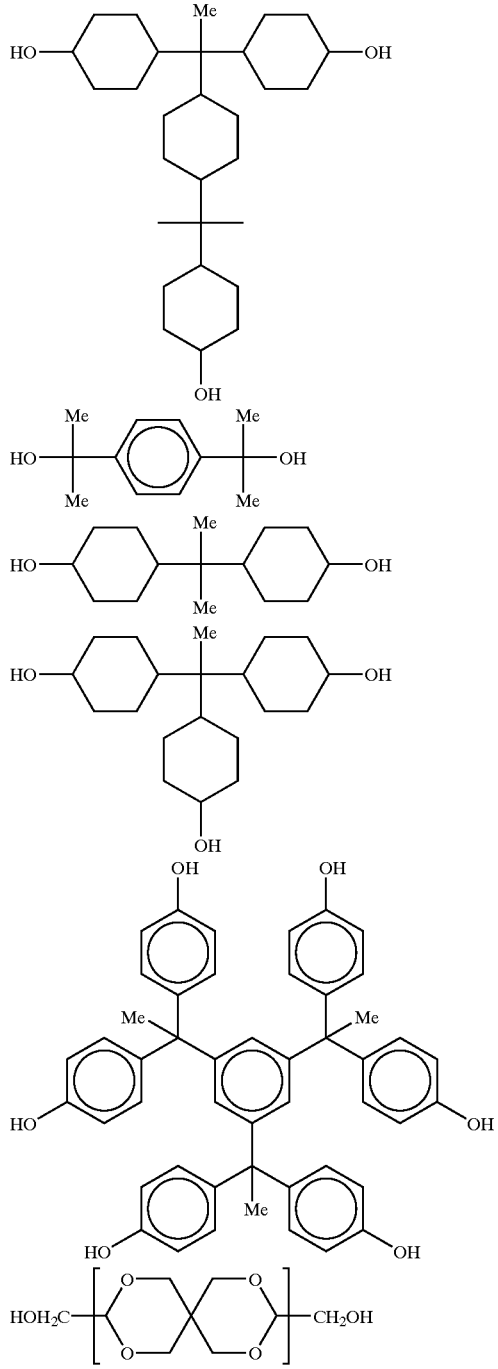

(a)-2: A Resin Having Structural Units Represented by the Following Formulae (I), (II) and (III), Capable of Decomposing by the Action of an Acid to Increase the Solubility in an Alkali Developer R21 represents a hydrogen atom or a methyl group.

Examples of the group incapable of decomposing by the action of an acid (referred to also as an "acid stable group") represented by R22 include a hydrogen atom, a halogen atom, an alkyl group, a cycloalkyl group, an alkenyl group, an aryl group, an alkyloxy group (exclusive of —O-tertiary alkyl), an acyl group, a cycloalkyloxy group, an alkenyloxy group, an aryloxy group, an alkylcarbonyloxy group, an alkylamidemethyloxy group, an alkylamide group, an arylamidemethyl group and an arylamide group. The acid stable group is preferably an acyl group, an alkylcarbonyloxy group, an alkyloxy group, a cycloalkyloxy group, an aryloxy group, an alkylamideoxy group or an alkylamide group, more preferably an acyl group, an alkylcarbonyloxy group, an alkyloxy group, a cycloalkyloxy group or an aryloxy group.

In the acid stable group represented by R22, the alkyl group is preferably an alkyl group having from 1 to 4 carbon atoms such as methyl group, ethyl group, propyl group, n-butyl group, sec-butyl group and t-butyl group; the cycloalkyl group is preferably a cycloalkyl group having from 3 to 10 carbon atoms, such as cyclopropyl group, cyclobutyl group, cyclohexyl group and adamantyl group; the alkenyl group is preferably an alkenyl group having from 2 to 4 carbon atoms, such as vinyl group, propenyl group, allyl group and butenyl group; the aryl group is preferably an aryl group having from 6 to 14 carbon atoms, such as phenyl group, xylyl group, toluyl group, cumenyl group, naphthyl group and anthracenyl group; and the alkoxy group is preferably an alkoxy group having from 1 to 4 carbon atoms, such as methoxy group, ethoxy group, hydroxyethoxy group, propoxy group, hydroxypropoxy group, n-butoxy group, isobutoxy group and sec-butoxy group.

The halogen atom represented by R23 is preferably fluorine, chlorine, bromine or iodine; the alkyl group is preferably an alkyl group having from 1 to 8 carbon atoms, such as methyl, ethyl, propyl, n-butyl, sec-butyl, t-butyl, hexyl and octyl; the aryl group is preferably an aryl group having from 6 to 14 carbon atoms, such as phenyl, xylyl, toluyl, cumenyl, naphthyl and anthracenyl; the alkoxy group is preferably an alkoxy group having from 1 to 4 carbon atoms, such as methoxy, ethoxy, hydroxyethoxy, propoxy, hydroxypropoxy, n-butoxy, isobutoxy, sec-butoxy and t-butoxy; the acyl group is preferably an acyl group having from 1 to 7 carbon atoms, such as formyl, acetyl, propanoyl, butanoyl and benzoyl; and the acyloxy group is preferably an acyloxy group having from 2 to 7 carbon atoms, such as acetoxy, propanoyloxy, butanoyloxy and benzoyloxy.

The substituent W in formula (I) is the same as defined in formula (X) described above.

Examples of the structural unit represented by formula (I) are exemplified below.

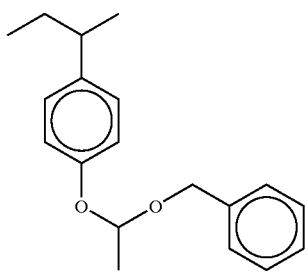

-continued

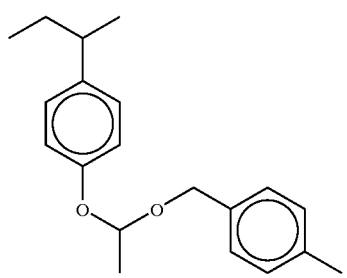

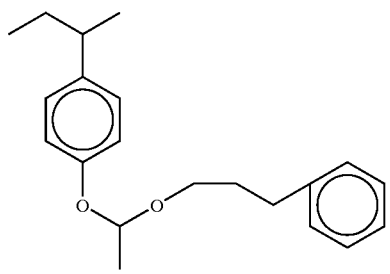

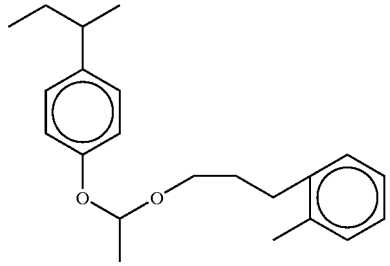

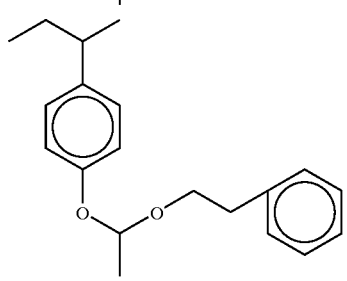

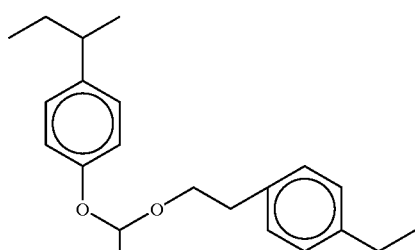

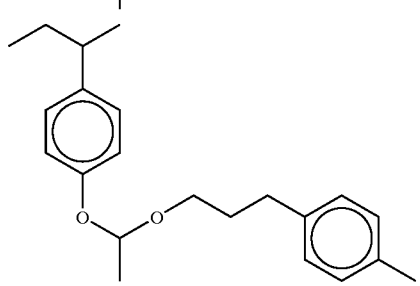

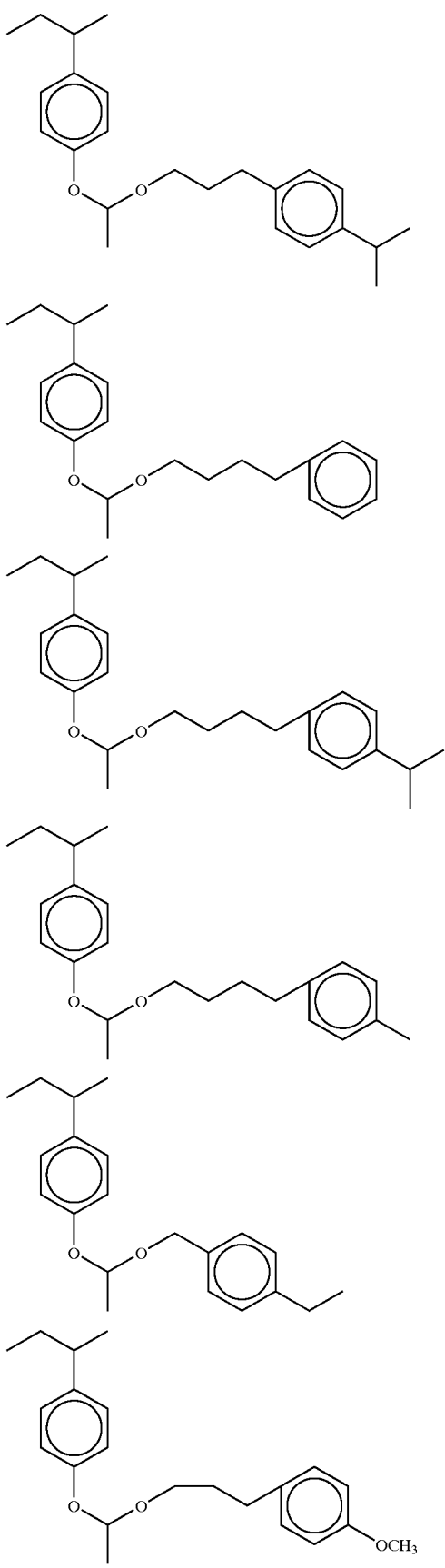
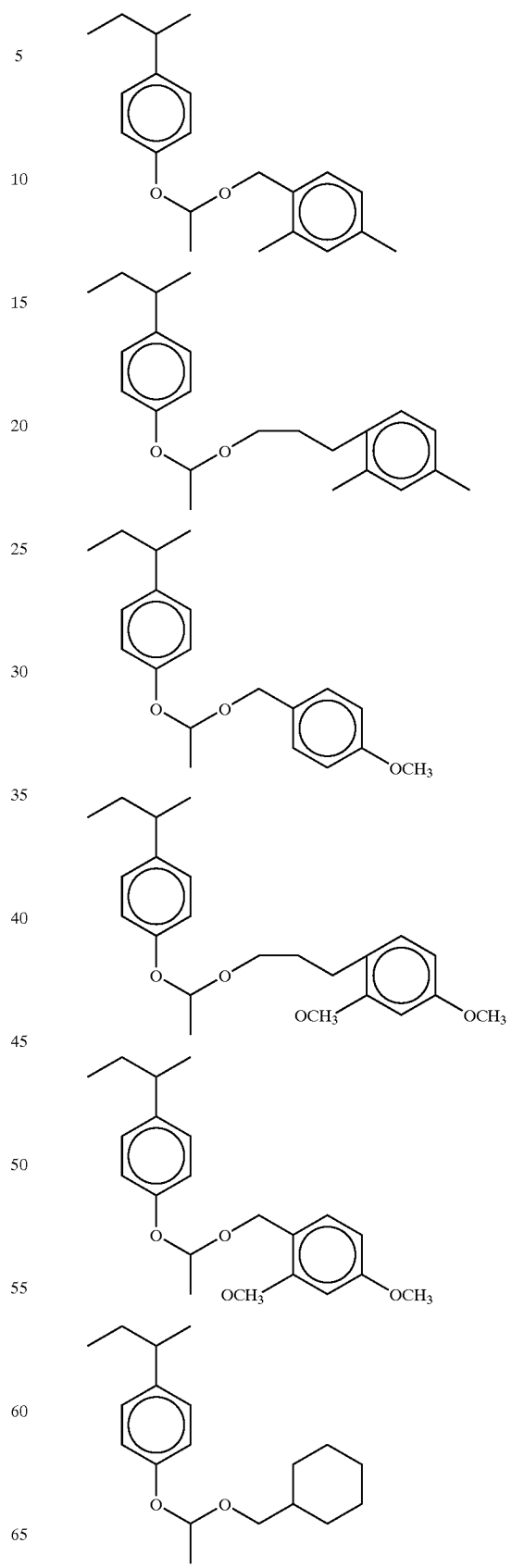

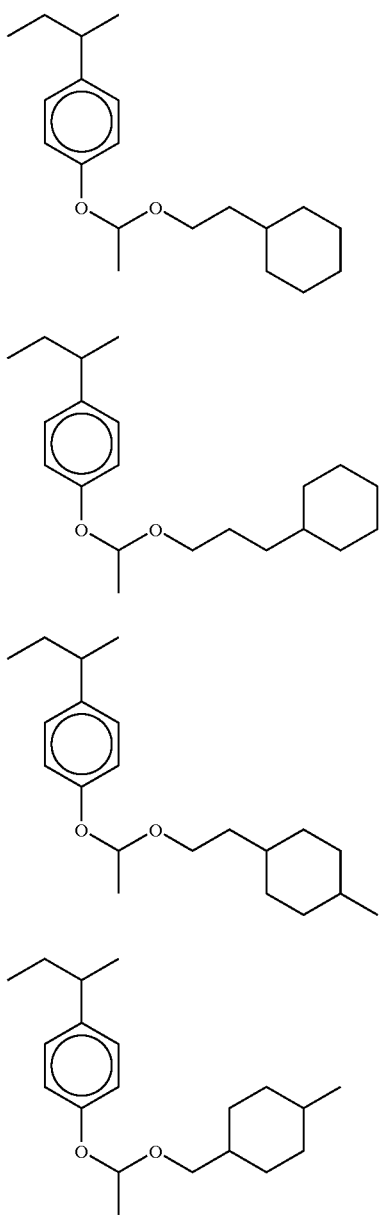

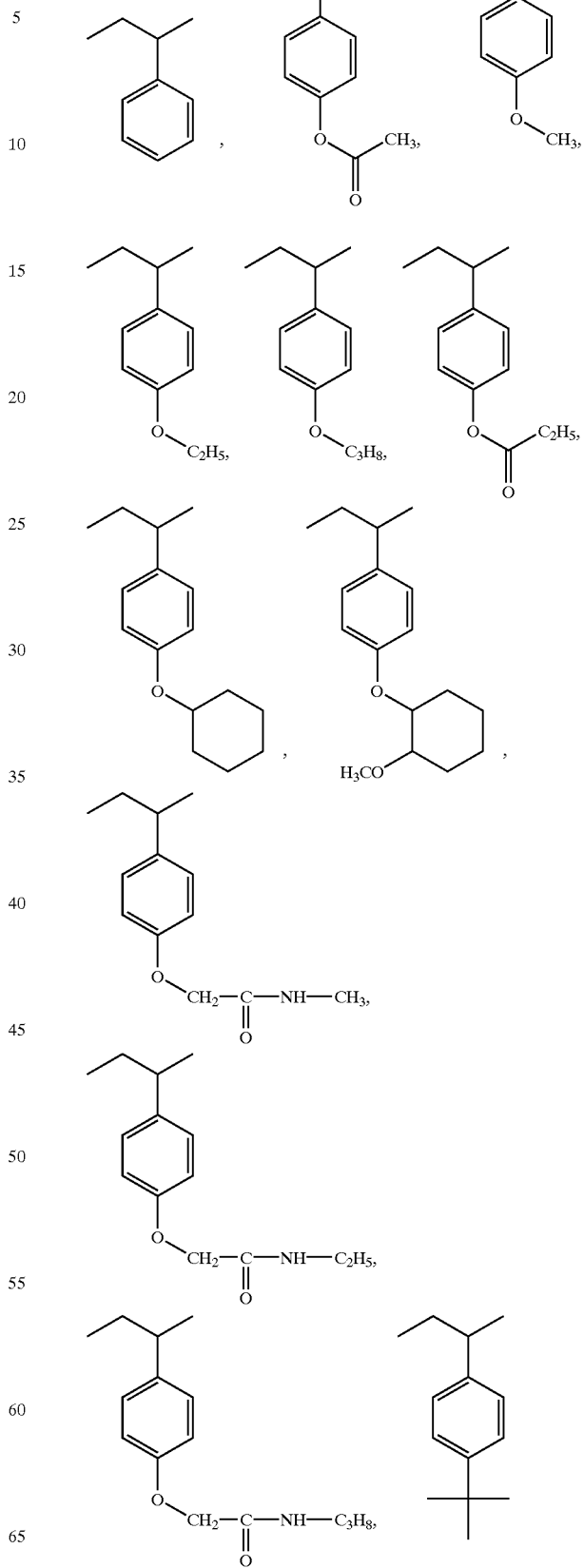

Since the resin contains a structural unit represented by formula (II), the resin can be decomposed by the action of an acid and thereby the solubility in an alkali developer can be controlled. Furthermore, by introducing this structural unit, a profile having excellent rectangular property can be achieved. In addition, this structural unit is effective in controlling the amount of the structural unit represented by formula (I).

Specific examples of the polymerizable monomer having a structural unit represented by formula (II) are set forth below, however, the present invention should not be construed as being limited thereto.

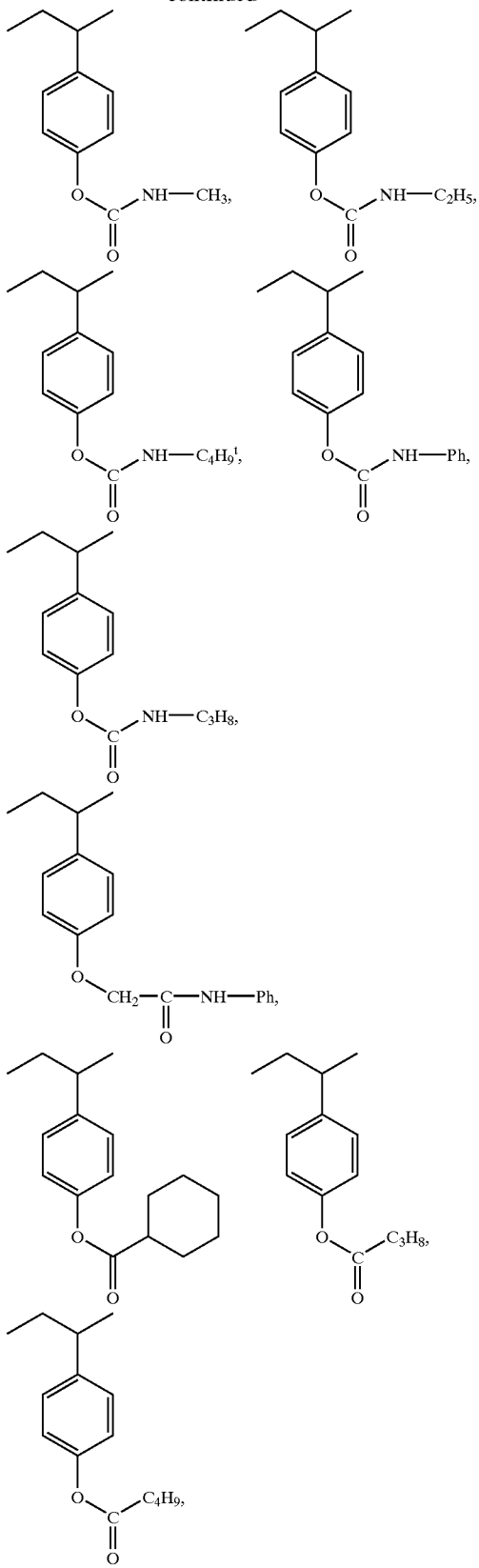

presence of a base, or with a corresponding halide in the presence of a base.

In the present invention, the resin capable of decomposing by the action of an acid to increase the solubility in an alkali developer may contain other monomer units as a copolymerization component in addition to the structural units represented by formulae (I), (II) and (III).

In the present invention, the ratio of structural units represented by formulae (I), (II) and (III) preferably satisfies the following conditions (i) to (iv):

$$0.10<(I)/[(I)+(II)+(III)]<0.25, \quad (i)$$

$$0.01<(II)/[(I)+(II)+(III)]<0.15, \quad (ii)$$

$$(I)>(II), \text{ and} \quad (iii)$$

$$0.5<(I)/[(I)+(II)]<0.85 \quad (iv)$$

(wherein (I), (II) and (III) each represents a molar fraction of a structural unit having a group represented by formula (I), (II) or (III), respectively).

When the resin of the present invention satisfies the above-described conditions, the profile is improved in the rectangular property and in particular, the development defect is more improved.

The repeating structural units represented by formulae (I), (II) and (III) and repeating structural units derived from other polymerizable monomers each may be present singly or in combination of two or more thereof.

In the resin contained in the positive photosensitive composition of the present invention, an appropriate other polymerizable monomer may be copolymerized so as to introduce an alkali-soluble group, for example, a phenolic hydroxyl group or a carboxyl group, and thereby maintain good developability with an alkali developer.

The resin having the repeating structural units represented by formulae (I), (II) and (III) synthesized by the above-described method has a molecular weight in terms of the weight average (Mw, polystyrene basis) of 2,000 or more, preferably from 3,000 to 200,000, more preferably from 5,000 to 70,000. The degree of dispersion (Mw/Mn) is preferably from 1.0 to 4.0, more preferably from 1.0 to 3.5, still more preferably from 1.0 to 3.0. The smaller the degree of dispersion, the better the heat resistance and the image forming property (e.g., pattern profile, defocus latitude).

The content of the resin having repeating structural units represented by formulae (I), (II) and (III) in the positive photosensitive composition (exclusive of the coating solvent) is preferably from 50 to 99 wt %, more preferably from 70 to 97 wt %.

Specific examples of the resin having repeating structural units represented by-formula (I), (II) and (III) are set forth below, however, the present invention is by no means limited thereto.

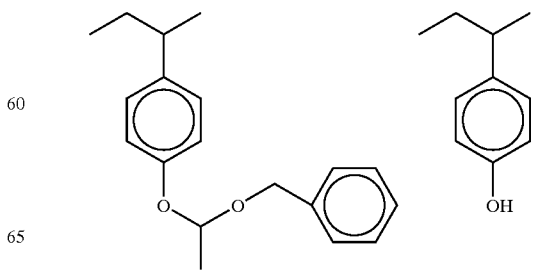

The resin containing the structural unit represented by formula (II) or (III) can be obtained by reacting a phenol resin or a monomer thereof with an acid anhydride in the

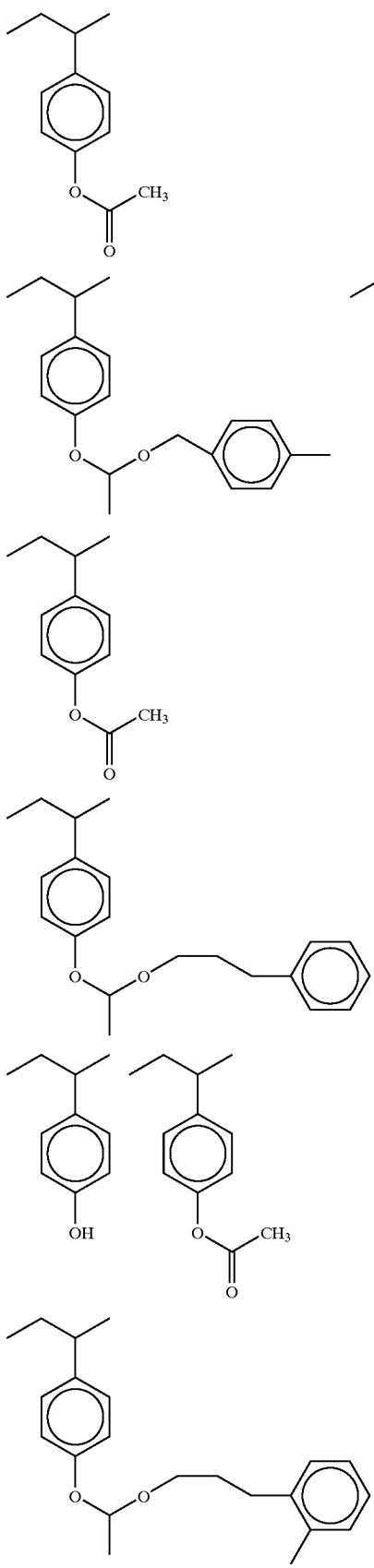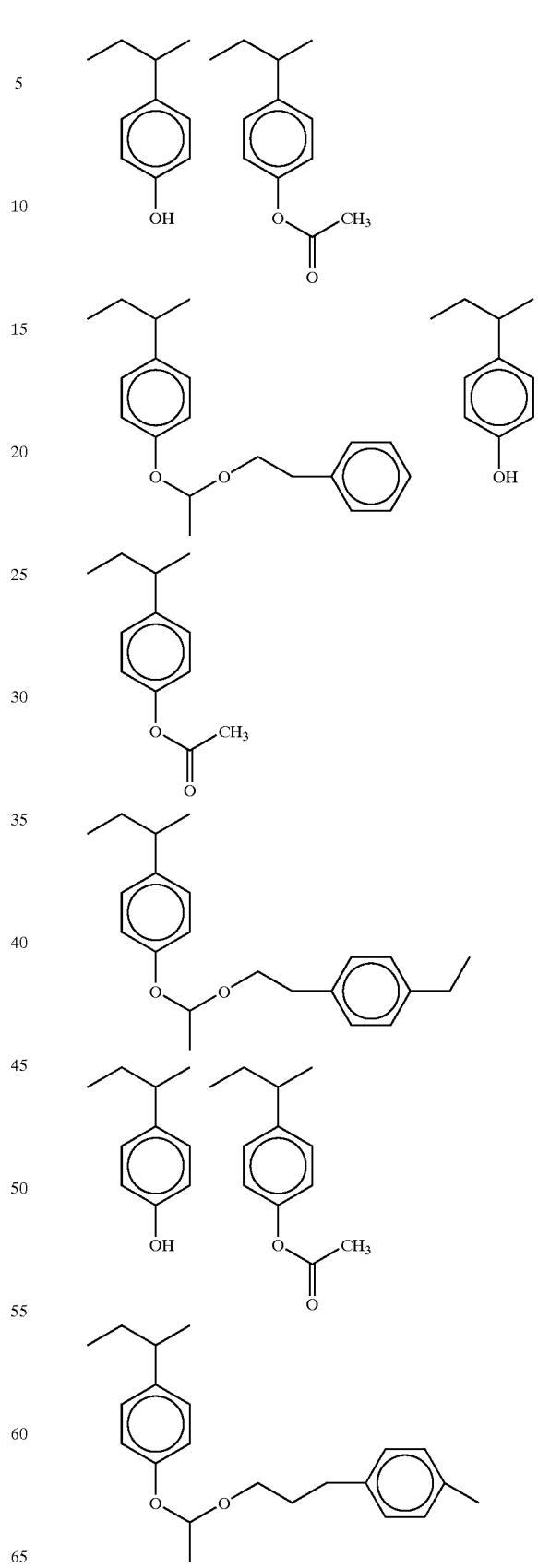

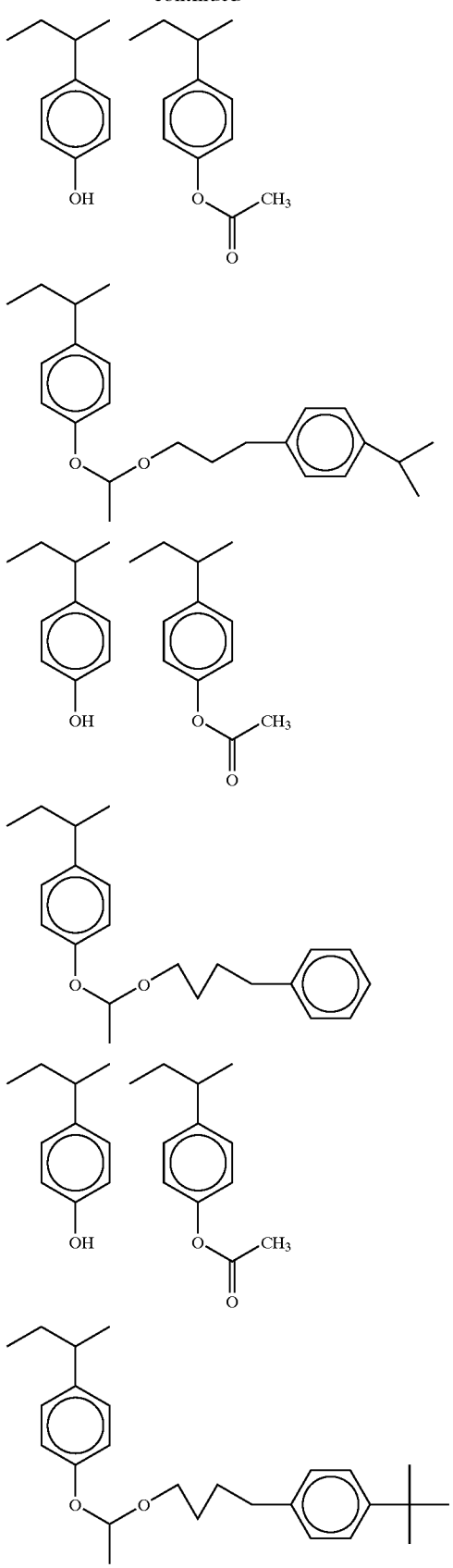
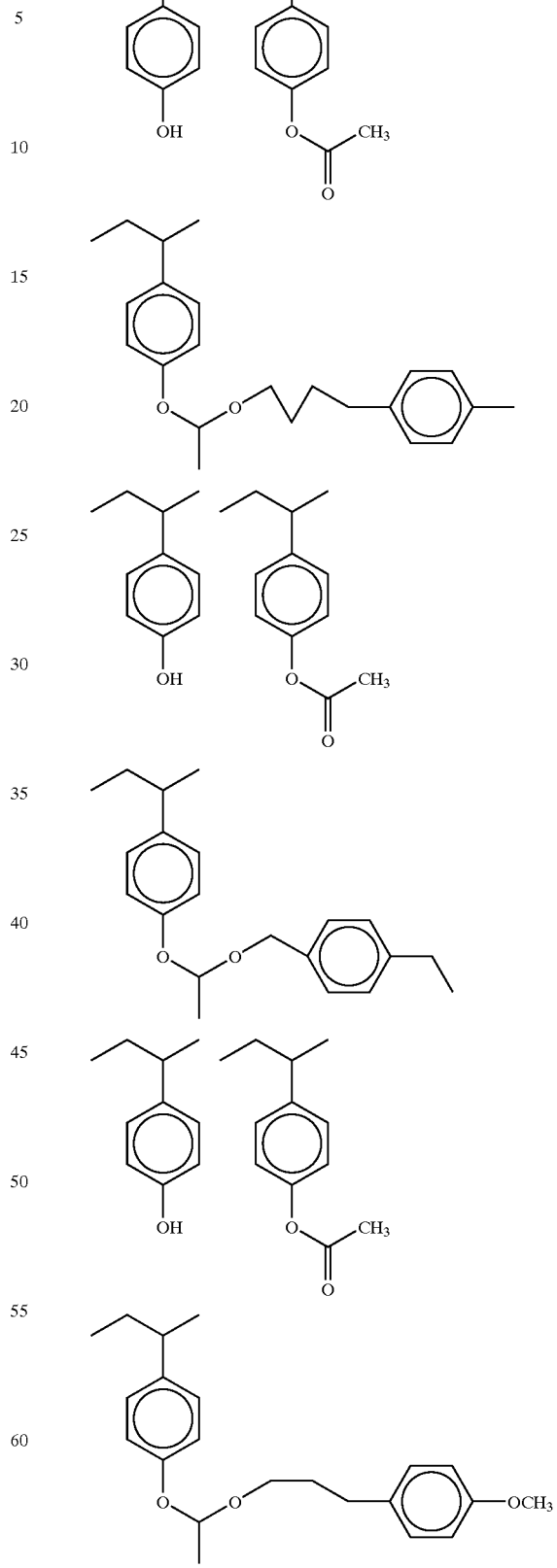

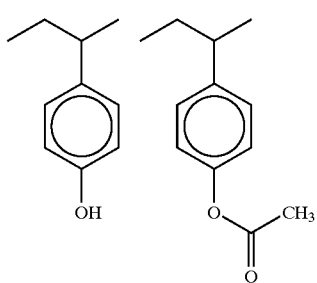
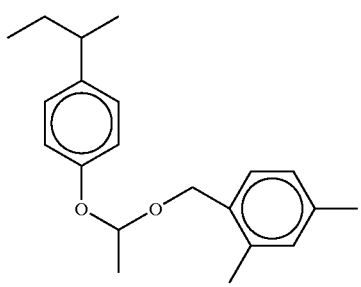
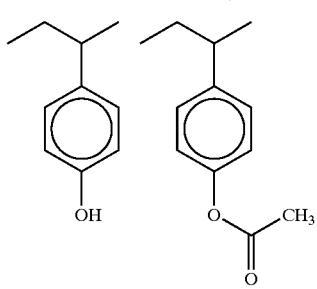
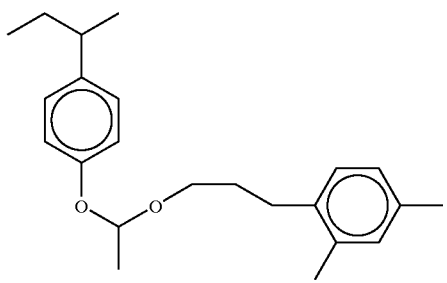
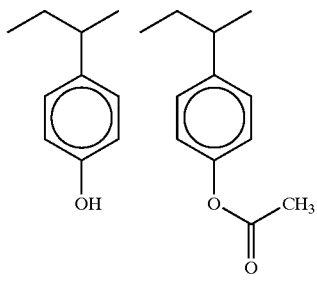
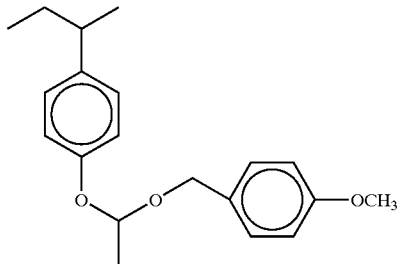
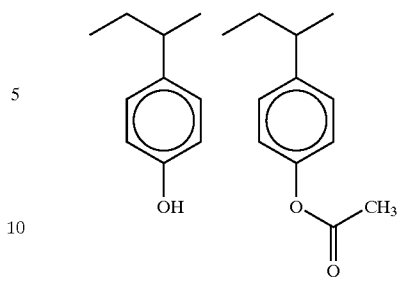
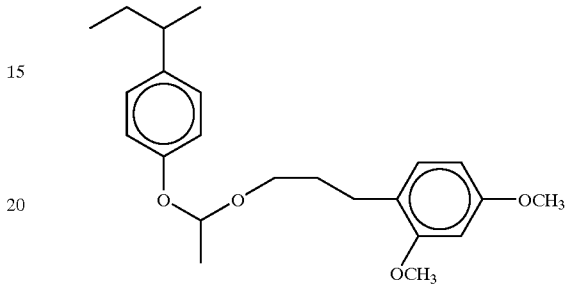
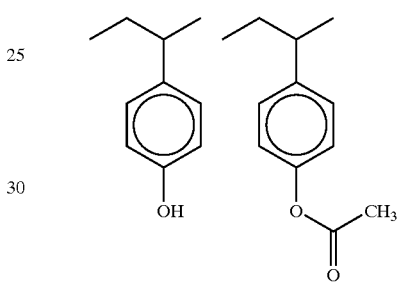
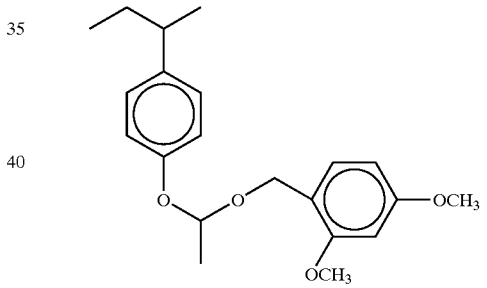
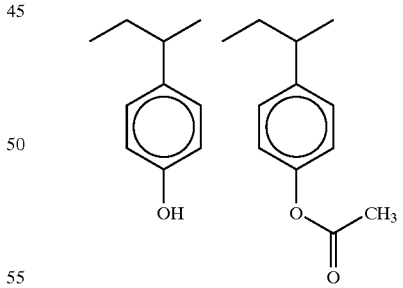
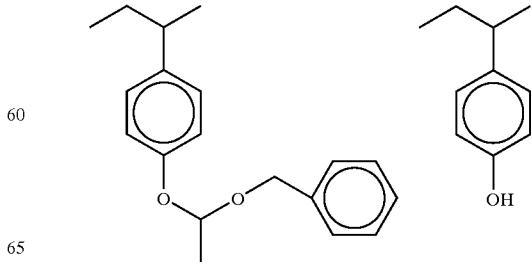

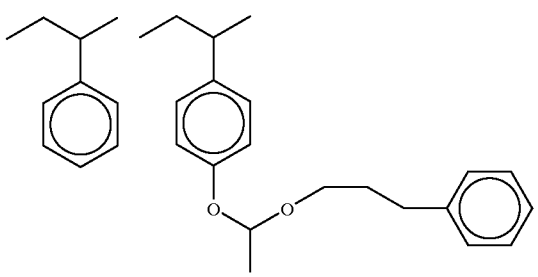
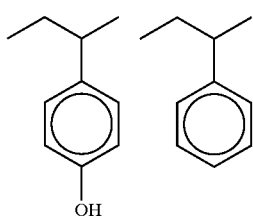
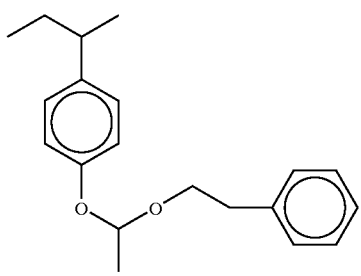
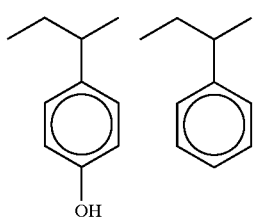
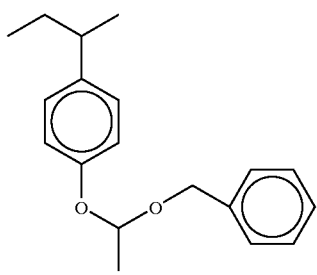
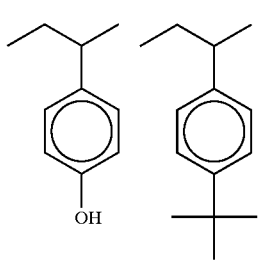
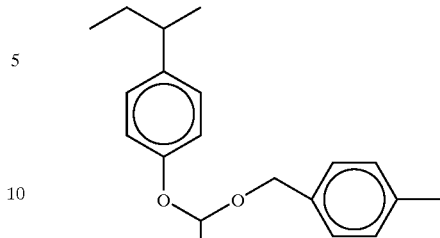
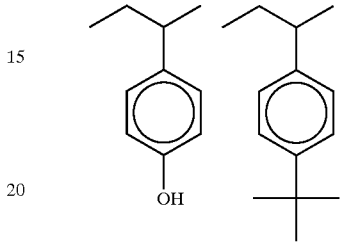
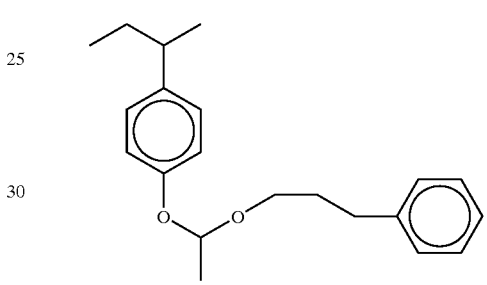
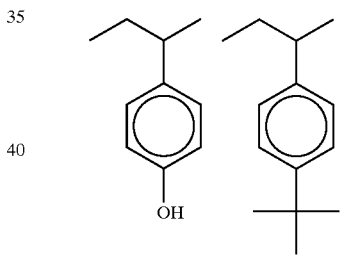
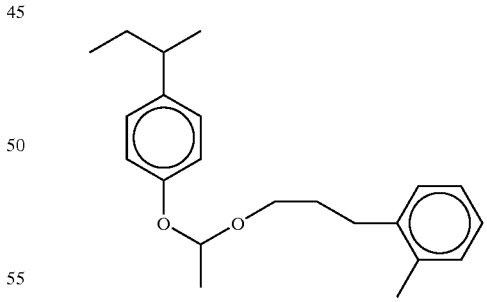
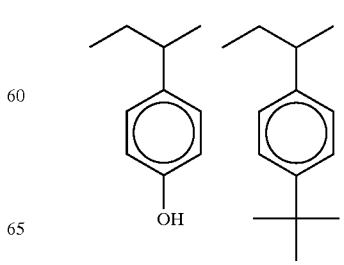

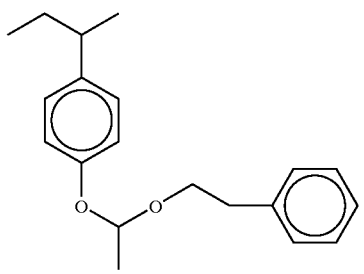
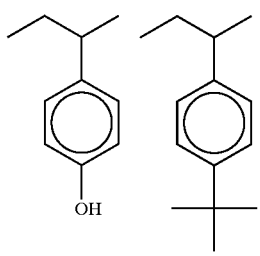
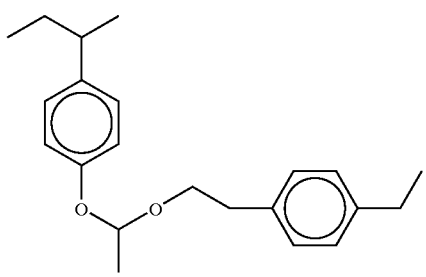
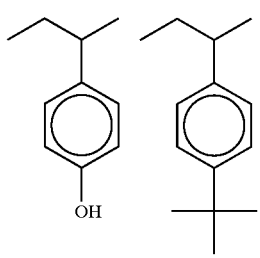
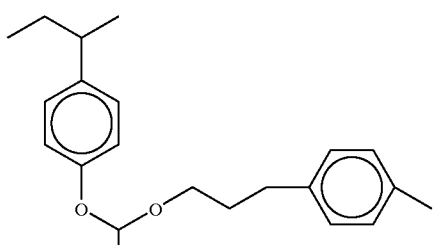
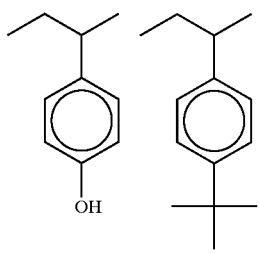
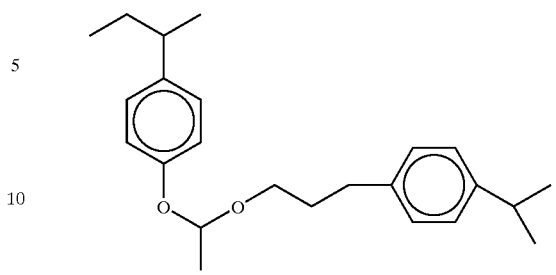
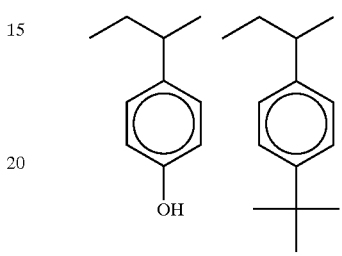
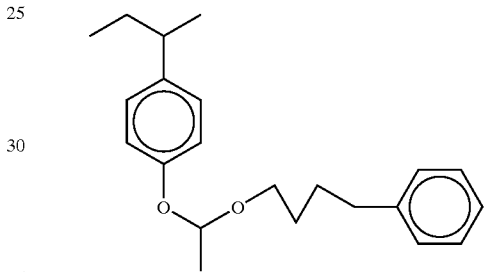
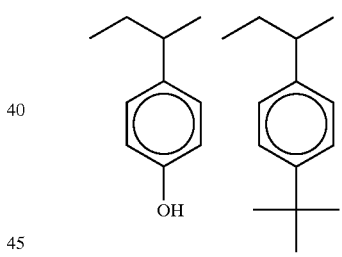
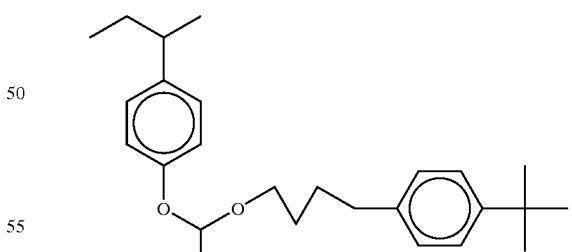
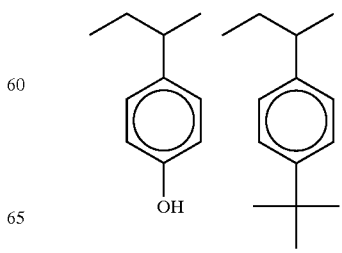

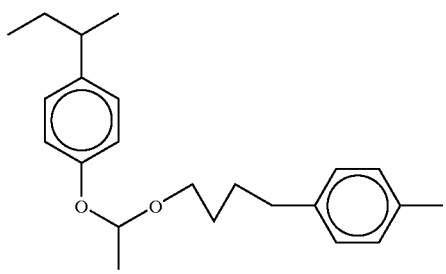
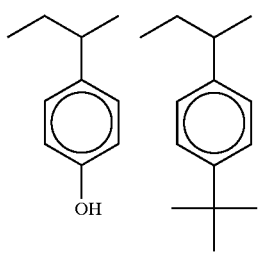
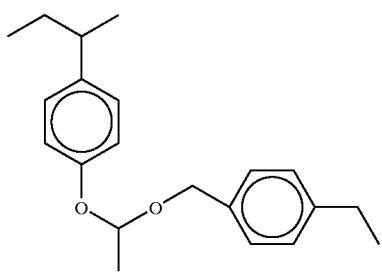
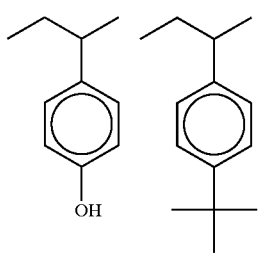
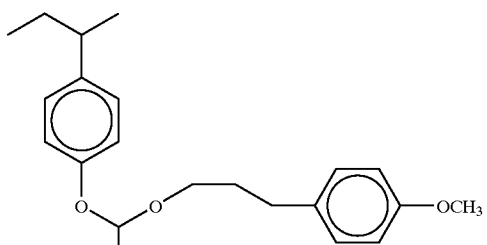
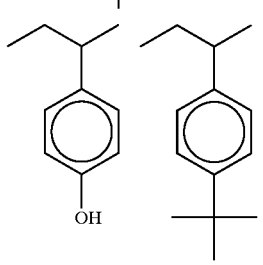
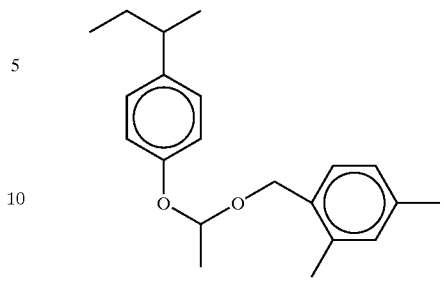
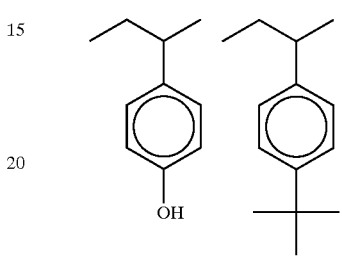
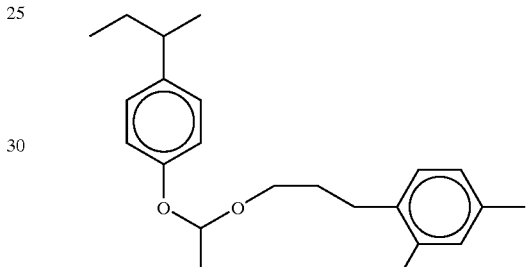
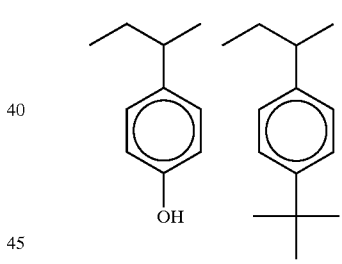
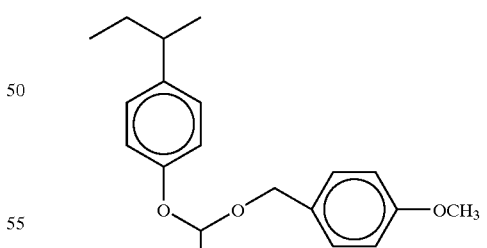
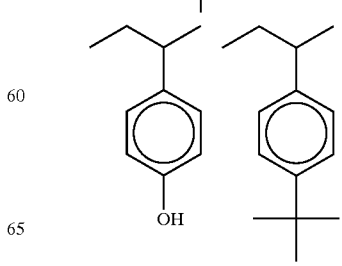

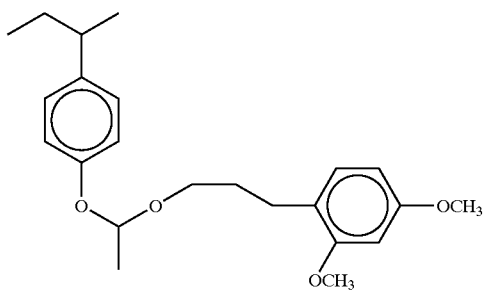
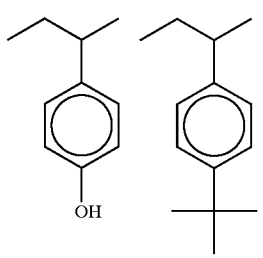
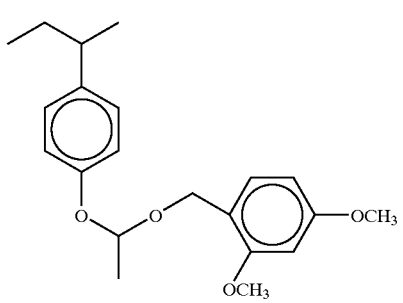
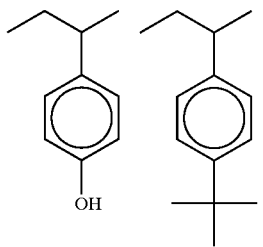
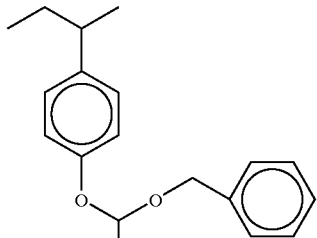
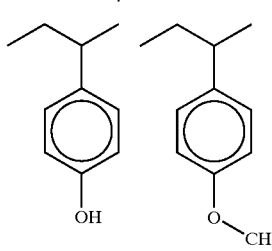
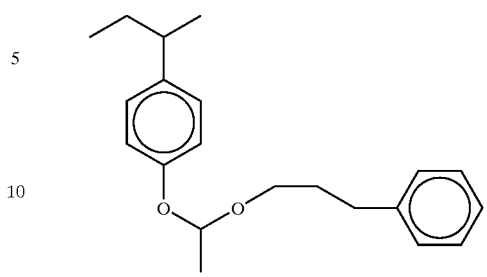
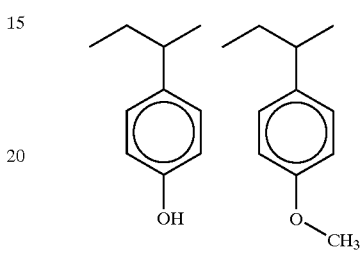
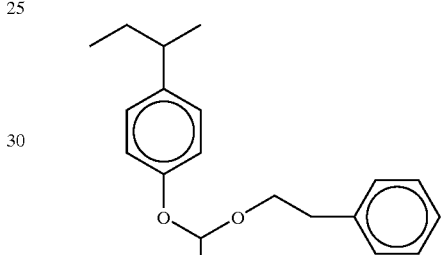
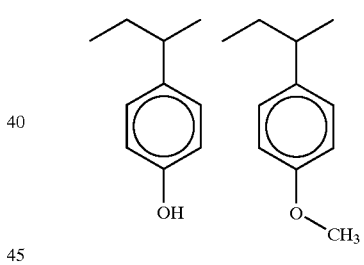
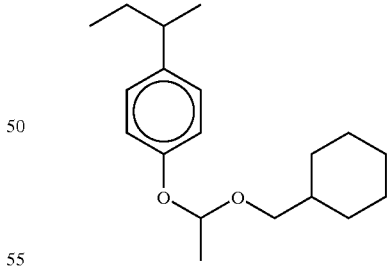
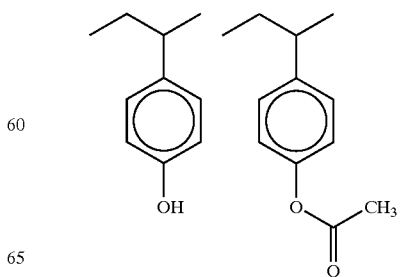

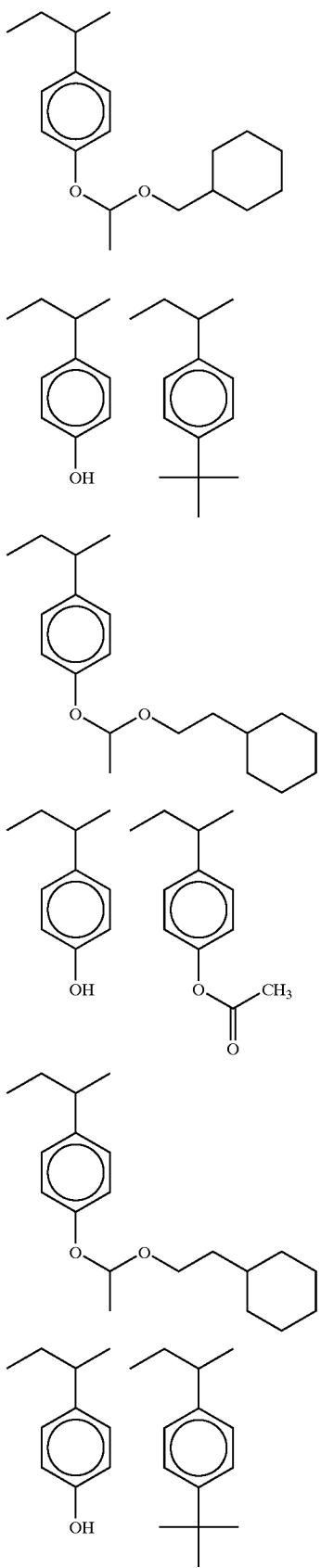

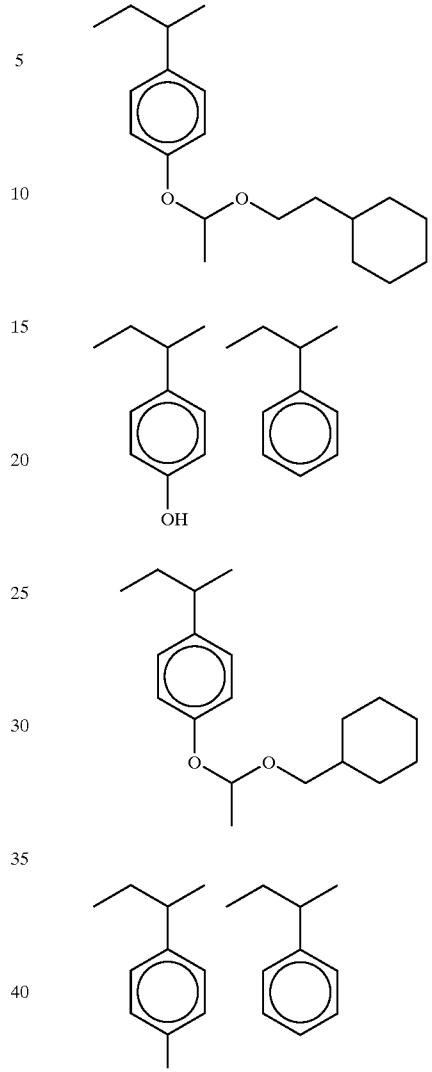

In the present invention, in addition to the resin having the repeating structural units represented by formulae (I), (II) and (III), a resin having other acid-decomposable group may be used in combination. The other resin capable of decomposing by an acid to increase the solubility in an alkali developer, which may be incorporated in the chemical amplification-type resist of the present invention, is a resin having a group capable of decomposing by an acid on the main chain or side chain of the resin or on both the main chain and the side chain. A resin having a group capable of decomposing by an acid on the side chain is preferred.

The group capable of decomposing by an acid is preferably —COOA$^0$ or —O—B$^0$. Examples of the group containing such a group include groups represented by —R$^0$—COOA$^0$ and —Ar—O—B$^0$.

A$^0$ represents —C(R$^{01}$)(R$^{02}$)(R$^{03}$) —Si(R$^{01}$)(R$^{02}$)(R$^{03}$) or —C(R$^{04}$)(R$^{05}$)—O—R$^{06}$, and B$^0$ represents —A$^0$ or —CO—O—A$^0$ (wherein R$^0$, R$^{01}$ to R$^{06}$ and Ar have the same meanings as those described later).

The acid-decomposable group is preferably a silyl ether group, a cumyl ester group, an acetal group, a tetrahydropyranyl ether group, a tetrahydropyranyl ester group, an enol ether group, an enol ester group, a tertiary alkyl ether group, a tertiary alkyl ester group or a tertiary alkyl carbonate group, more preferably a tertiary alkyl ester group, a tertiary alkyl carbonate group, a cumyl ester group, an acetal group or a tetrahydropyranyl ether group.

In the case where the above-described group capable of decomposing by an acid is bonded as a side chain, the matrix resin is an alkali-soluble resin having on the side chain thereof —OH or —COOH, preferably —R⁰—COOH or —Ar—OH. Examples thereof include alkali-soluble resins described later.

The alkali-soluble resin preferably has an alkali dissolution rate determined (23° C.) with 0.261 N tetramethylammonium hydroxide (TMAH) of 170 A/sec or more, more preferably 330 A/sec or more (A is angstrom).

Furthermore, in view of achieving a rectangular profile, the alkali-soluble resin preferably has high transmissivity to far ultraviolet ray or excimer laser ray. The transmissivity is preferably from 20 to 90% with a thickness of 1 μm and a ray having a wavelength of 248 nm.

From this standpoint, preferred examples of the alkali-soluble resin include o-, m- or p-poly(hydroxystyrene) and copolymers thereof, hydrogenated poly(hydroxystyrene), halogen- or alkali-substituted poly(hydroxystyrene, partially O-alkylated or O-acylated poly(hydroxystyrene), styrene-hydroxystyrene copolymers, α-methylstyrene-hydroxystyrene copolymers and hydrogenated novolak resin.

The resin having a group capable of decomposing by an acid, for use in the present invention can be obtained by reacting an alkali-soluble resin with a precursor of an acid-decomposable group or by copolymerizing an alkali-soluble resin monomer having bonded thereto an acid-decomposable group with a monomer of various types.

In combination with the resin having an acid-decomposable group and a photo-acid generator, an acid-decomposable low molecular dissolution-inhibiting compound described below may be mixed.

The acid-decomposable low molecular dissolution-inhibiting compound for use in the present invention is a compound having a structure such that at least 2 groups capable of decomposing by an acid are present and the distance between the acid-decomposable groups at remotest positions passes through at least 8 bonding atoms exclusive of the acid-decomposable group.

The acid-decomposable low molecular weight dissolution-inhibiting compound for use in the present invention may contain at least one acid-decomposable group represented by formula (X).

In the present invention, the acid-decomposable dissolution-inhibiting compound preferably has a structure such that at least 2 groups capable of decomposing by an acid are present and the distance between the acid-decomposable groups at remotest positions passes through at least 10, preferably 11, more preferably 12, bonding atoms exclusive of the acid-decomposable group, or such that at least 3 acid-decomposable groups are present and the distance between the acid-decomposable groups at remotest positions passes through at least 9, preferably 10, more preferably 11, bonding atoms exclusive of the acid-decomposable group. The upper limit of the number of bonding atoms is 50, preferably 30.

In the present invention, when the acid-decomposable dissolution-inhibiting compound contains 3 or more, preferably 4 or more acid-decomposable groups, or even when the compound contains 2 acid-decomposable groups, the alkali-soluble resin is remarkably increased in the dissolution inhibiting property as long as the acid-decomposable groups are apart from each other at a predetermined distance.

In the present invention, the distance between acid-decomposable groups are shown by the number of bonding atoms present therebetween exclusive of the acid-decomposable groups. For example, in each of the following compounds (1) and (2), the distance between acid-decomposable groups is 4 bonding atoms, and in the compound (3), it is 12 bonding atoms.

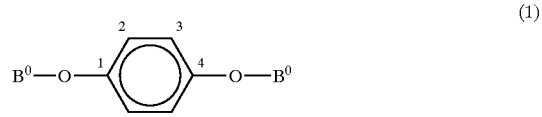

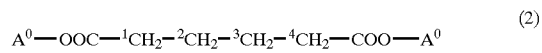

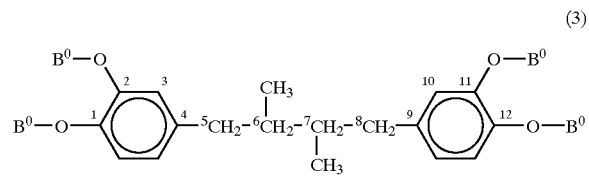

The acid-decomposable dissolution-inhibiting compound for use in the present invention may have a plurality of acid-decomposable groups on one benzene ring, but a compound constituted by a skeleton having one acid-decomposable group on one benzene ring is preferred. The acid-decomposable dissolution-inhibiting compound for use in the present invention has a molecular weight of 3,000 or less, preferably from 500 to 3,000, more preferably from 1,000 to 2,500.

In a preferred embodiment of the present invention, examples of the group capable of decomposing by an acid, namely, the group containing —COO—A⁰ or —O—B⁰ include the groups represented by —R⁰—COO—A⁰ or —Ar—O—B⁰.

A⁰ represents —C(R⁰¹)(R⁰²)(R⁰³) —Si(R⁰¹)(R⁰²)(R⁰³) or —C(R⁰⁴)(R⁰⁵)—O—R⁰⁶, and B⁰ represents —A⁰ or —CO—O—A⁰.

R⁰¹, R⁰², R⁰³, R⁰⁴ and R⁰⁵, which may be the same or different, each represents a hydrogen atom, an alkyl group, a cycloalkyl group, an alkenyl group or an aryl group, R⁰⁶ represents an alkyl group or an aryl group, provided that at least two of R⁰¹ to R⁰³ are a group except for a hydrogen atom, and at least two groups out of R⁰¹ and R⁰³ or R⁰⁴ to R⁰⁶ may combine to form a ring. R⁰ represents a divalent or greater aliphatic or aromatic hydrocarbon group which may have a substituent, and —Ar— represents a divalent or greater aromatic group being monocyclic or polycyclic, which may have a substituent.

The alkyl group is preferably an alkyl group having from 1 to 4 carbon atoms such as methyl group, ethyl group, propyl group, n-butyl group, sec-butyl group and t-butyl group; the cycloalkyl group is preferably a cycloalkyl group having from 3 to 10 carbon atoms, such as cyclopropyl group, cyclobutyl group, cyclohexyl group and adamantyl group; the alkenyl group is preferably an alkenyl group having from 2 to 4 carbon atoms, such as vinyl group, propenyl group, allyl group and butenyl group; and the aryl group is preferably an aryl group having from 6 to 14 carbon atoms, such as phenyl group, xylyl group, toluyl group, cumenyl group, naphthyl group and anthracenyl group.

Examples of the substituent include a hydroxyl group, a halogen atom (e.g., fluorine, chlorine, bromine, iodine), a nitro group, a cyano group, an alkyl group described above, an alkoxy group such as methoxy group, ethoxy group, hydroxyethoxy group, propoxy group, hydroxypropoxy group, n-butoxy group, isobutoxy group, sec-butoxy group and t-butoxy group, an alkoxycarbonyl group such as methoxycarbonyl group and ethoxycarbonyl group, an aralkyl group such as benzyl group, phenethyl group and cumyl group, an acyl group such as aralkyloxy group, formyl group, acetyl group, butyryl group, benzoyl group, cinnamyl group and valeryl group, an acyloxy group such as butyryloxy group, an alkenyl group described above, an alkenyloxy group such as vinyloxy group, propenyloxy group, allyloxy group and butenyloxy group, an aryl group described above, an aryloxy group such as phenoxy group, and an aryloxycarbonyl group such as benzoyloxy group.

The group capable of decomposing by an acid is preferably a silyl ether group, a cumyl ester group, an acetal group, a tetrahydropyranyl ether group, an enol ether group, an enol ester group, a tertiary alkyl ether group, a tertiary alkyl ester group or a tertiary alkyl carbonate group, more preferably a tertiary alkyl ester group, a tertiary alkyl carbonate group, a cumyl ester group or a tetrahydropyranyl ether group.

Preferred examples of the acid-decomposable dissolution-inhibiting compound include compounds protected by bonding the above-described group, namely, —R⁰—COO—A⁰ or B⁰, to a part or the whole of phenolic OH groups of a polyhydroxy compound described in JP-A-1-289946, JP-A-1-289947, JP-A-2-2560, JP-A-3-128959, JP-A-3-158855, JP-A-3-179353, JP-A-3-191351, JP-A-3-200251, JP-A-3-200252, JP-A-3-200253, JP-A-3-200254, JP-A-3-200255, JP-A-3-259149, JP-A-3-279958, JP-A-3-279959, JP-A-4-1650, JP-A-4-1651, JP-A-4-11260, JP-A-4-12356, JP-A-4-12357, and Japanese Patent Application Nos. 3-33229, 3-230790, 3-320438, 4-25157, 4-52732, 4-103215, 4-104542, 4-207885, 4-107889 and 4-152195.

More preferred examples thereof include those using a polyhydroxy compound described in JP-A-1-289946, JP-A-3-128959, JP-A-3-158855, JP-A-3-179353, JP-A-3-200251, P-A-3-200252, JP-A-3-200255, JP-A-3-259149, JP-A-3-279958, JP-A-4-1650, JP-A-4-11260, JP-A-4-12356, JP-A-4-12357, and Japanese Patent Application Nos. 4-25157, 4-103215, 4-104542, 4-107885, 4-107889 and 4-152195.

Specific examples thereof include the compounds represented by formula [I] to [XVI]:

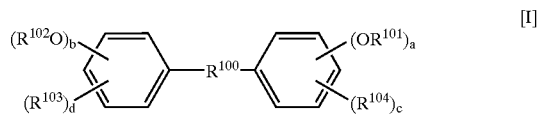

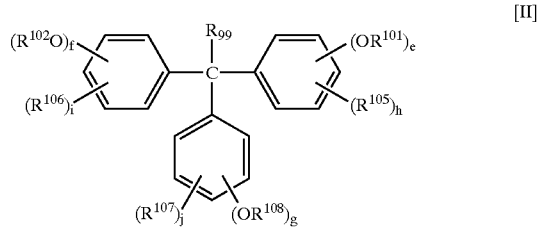

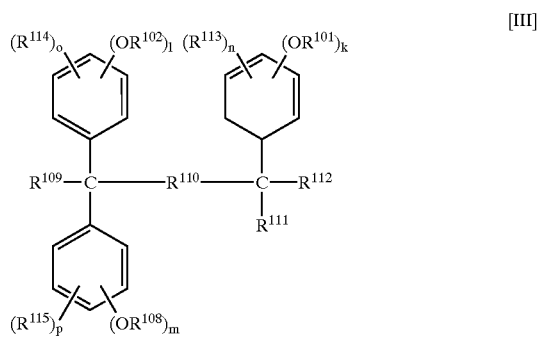

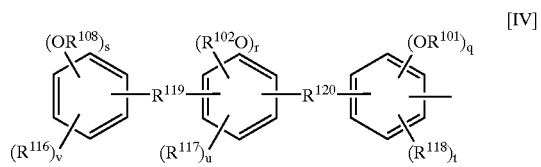

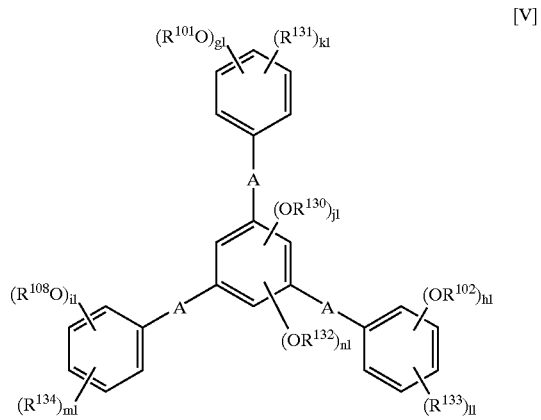

wherein $R^{101}$, $R^{102}$, $R^{108}$ and $R^{130}$, which may be the same or different, each represents a hydrogen atom, —R⁰—COO—C(R⁰¹)(R⁰²)(R⁰³) or —CO—O—C(R⁰¹)(R⁰²)(R⁰³) (wherein R⁰, R⁰¹, R⁰² and R⁰³ have the same meanings as defined above), $R^{100}$ represents —CO—, —COO—, —NHCONH—, —NHCOO—, —O—, —S—, —SO—, —SO₂—, —SO₃— or

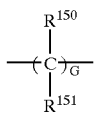

(wherein G is a number of from 2 to 6, provided that when G is 2, at least one of $R^{150}$ and $R^{151}$ is an alkyl group), $R^{150}$ and $R^{151}$, which may be the same or different, each represents a hydrogen atom, an alkyl group, an alkoxy group, —OH, —COOH, —CN, a halogen atom, —$R^{152}$—COOR$^{153}$ or —$R^{154}$—OH, $R^{152}$ and $R^{154}$ each represents an alkylene group, $R^{153}$ represents a hydrogen atom, an alkyl group, an aryl group or an aralkyl group, $R^{99}$, $R^{103}$ to $R^{107}$, $R^{109}$, $R^{111}$ to $R^{118}$ and $R^{131}$ to $R^{134}$, which may be the same or different, each represents a hydrogen atom, a hydroxyl group, an alkyl group, an alkoxy group, an acyl group, an acyloxy group, an aryl group, an aryloxy group, an aralkyl group, an aralkyloxy group, a halogen atom, a nitro group, a carboxyl group, a cyano group or —N($R^{155}$)($R^{156}$) (wherein $R^{155}$ and $R^{156}$ each represents H, an alkyl group or an aryl group), $R^{110}$ represents a single bond, an alkylene group or

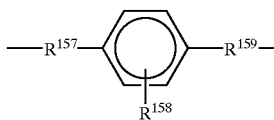

wherein $R^{157}$ and $R^{159}$, which may be the same or different, each represents a single bond, an alkylene group, —O—, —S—, —CO— or a carboxyl group, $R^{158}$ represents a hydrogen atom, an alkyl group, an alkoxy group, an acyl group, an acyloxy group, an aryl group, a nitro group, a hydroxyl group, a cyano group or a carboxyl group, provided that the hydroxyl group may be replaced by an acid-decomposable group (e.g., t-butoxycarbonylmethyl group, tetrahydropyranyl group, 1-ethoxy-1-ethyl group, 1-t-butoxy-1-ethyl group), $R^{119}$ and $R^{120}$, which may be the same or different, each represents a methylene group, a lower alkyl-substituted methylene group, a halomethylene group or a haloalkylene group, provided that the lower alkyl group as used in the present invention means an alkyl group having from 1 to 4 carbon atoms, A represents a methylene group, a lower alkyl-substituted methylene group, a halomethylene group or a haloalkylene group, when a to v and g1 to n1 each is plural, the plurality of groups in the parenthesis may be the same or different, a to q, s, t, v, g1 to i1 and k1 to m1 each represents 0 or an integer of from 1 to 5, r and u each represents 0 or an integer of from 1 to 4, j1 and n1 each represents 0 or an integer of from 1 to 3, (a+b), (d+f+g), (k+l+m), (q+r+s), (g1+h1+i1+j1)≧2, (j1+n1)≦3, (r+u)≦4, (a+c), (b+d), (e+h), (f+i), (g+j), (k+n), (l+o), (m+p), (q+t), (s+v), (g1+k1), (h1+l1) and (i1+m1)≦5;

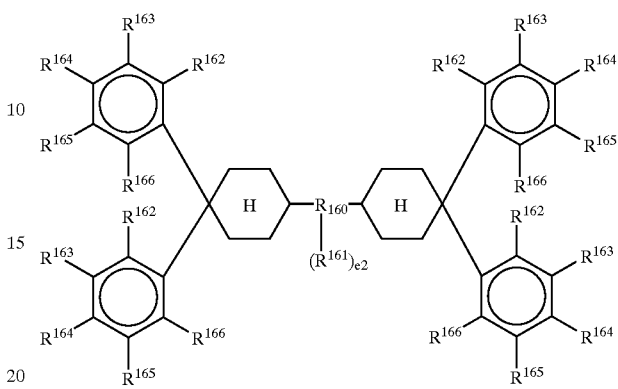

wherein $R^{160}$ represents an organic group, a single bond, —S—, —SO— or

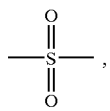

$R^{161}$ represents a hydrogen atom, a monovalent organic group or

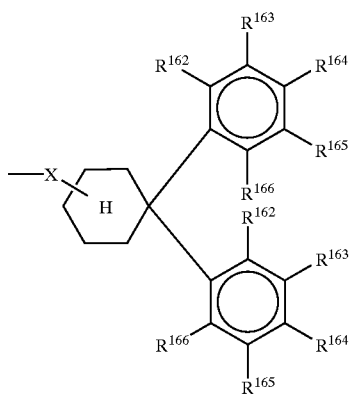

(wherein $R^{162}$ to $R^{166}$, which may be the same or different, each represents a hydrogen tom, a hydroxyl group, a halogen atom, an alkyl group, an alkoxy group, an alkenyl group, —O—R$^{0}$—COO—C(R$^{01}$)(R$^{02}$)(R$^{03}$) or —O—CO—O—C(R$^{01}$)(R$^{02}$)(R$^{03}$), provided that at least two are —O—R$^{0}$—COO—C(R$^{01}$)(R$^{02}$)(R$^{03}$) or —O—CO—O—C(R$^{01}$)(R$^{02}$)(R$^{03}$), and that 4 or 6 substituents having the same symbol may be the same or different, X represents a divalent organic group, and e2 represents 0 or 1;

g2 represents 0 or an integer of from 1 to 4; and

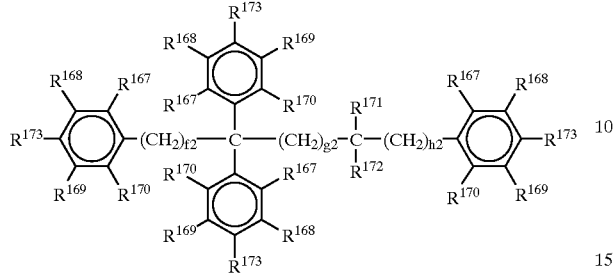
(VII)

wherein $R^{167}$ to $R^{170}$, which may be the same or different, each represents a hydrogen atom, a hydroxyl group, a halogen atom, an alkyl group, an alkoxy group or an alkenyl group, provided that 4 to 6 substituents having the same symbol may be the same or different, $R^{171}$ and $R^{172}$ each represents a hydrogen atom, an alkyl group or

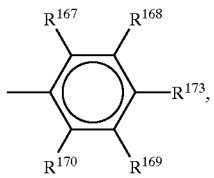

at least two of $R^{173}$ groups are —O—R⁰—COO—C($R^{01}$)($R^{02}$)($R^{03}$) or —O—CO—O—C($R^{01}$)($R^{02}$)($R^{03}$) and the remaining is a hydroxyl group, f2 and h2 each represents 0 or 1, and

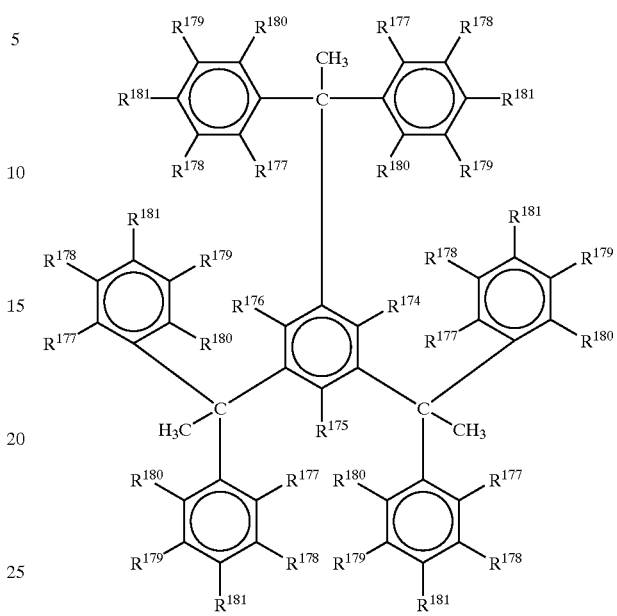
(VIII)

wherein $R^{174}$ to $R^{180}$, which may be the same or different, each represents a hydrogen atom, a hydroxyl group, a halogen atom, an alkyl group, an alkoxy group, a nitro group, an alkenyl group, an aryl group, an aralkyl group, an alkoxycarbonyl group, an arylcarbonyl group, an acyloxy group, an acyl group, an aralkyloxy group or an aryloxy group, provided that 6 substituents having the same symbol may be the same or different, at least two of $R^{181}$ groups are —O—R⁰—COO—C($R^{01}$)($R^{02}$)($R^{03}$) or —O—CO—O—C($R^{01}$)($R^{02}$)($R^{03}$) and the remaining is a hydroxyl group.

Specific examples of preferred compound skeletons are set forth below.

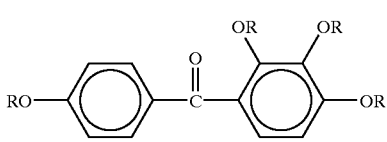
(1)

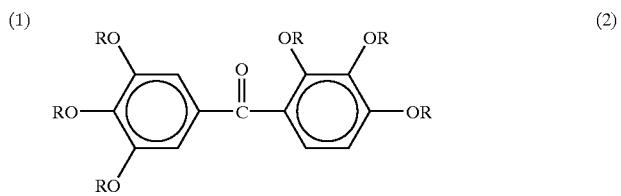
(2)

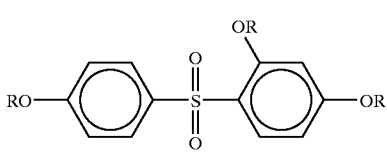
(3)

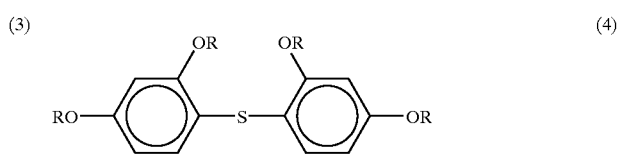
(4)

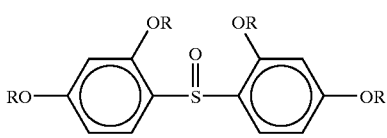
(5)

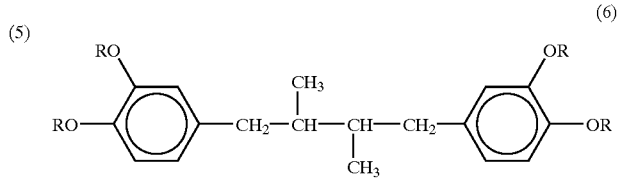
(6)

-continued
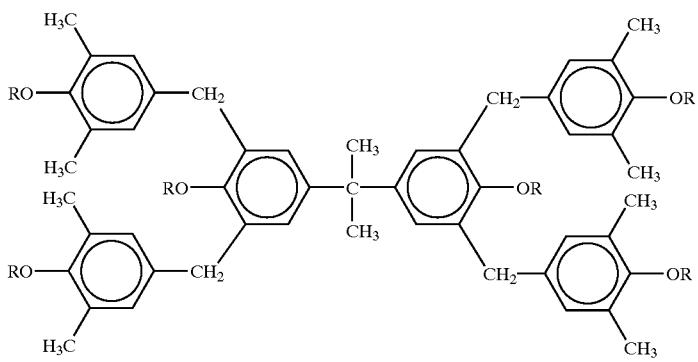
(7)
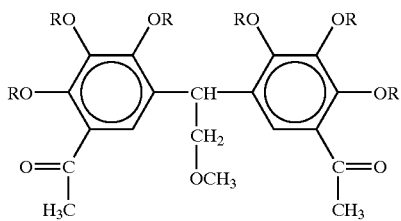
(8)
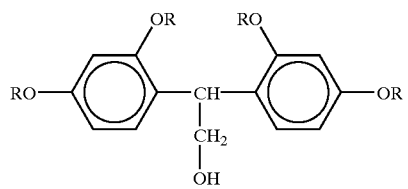
(9)
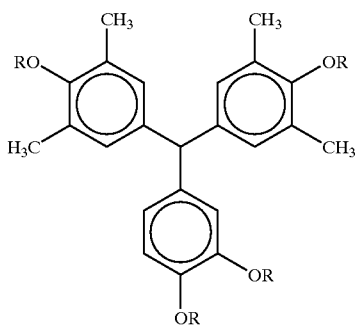
(10)
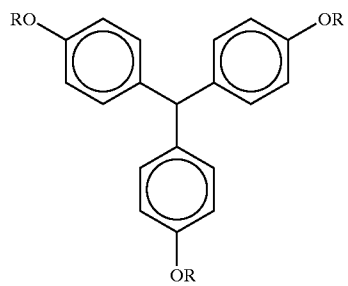
(11)
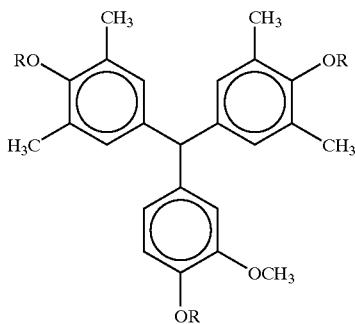
(12)
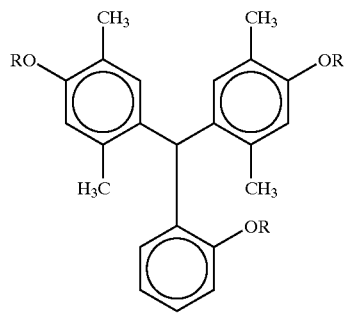
(13)
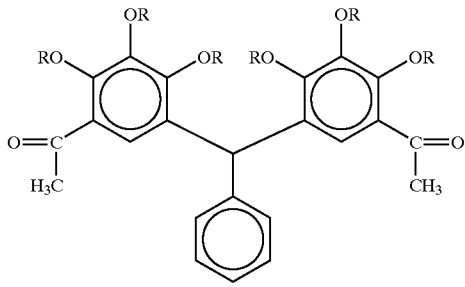
(14)
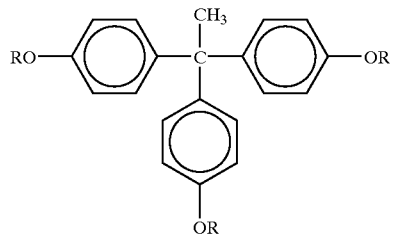
(15)

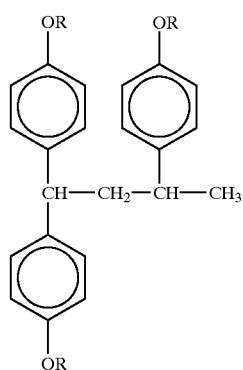
(16)
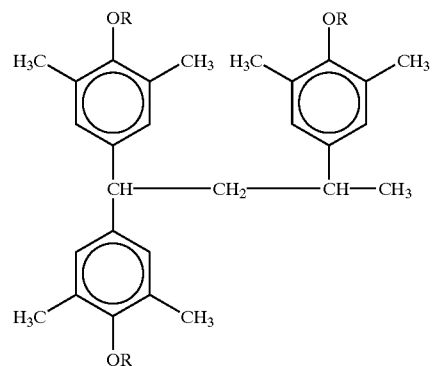
(17)
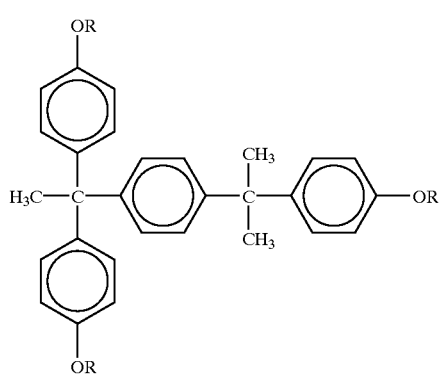
(18)
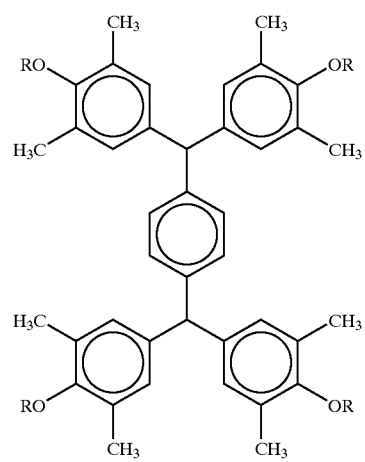
(19)
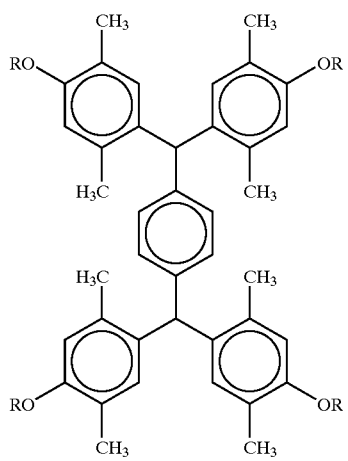
(20)
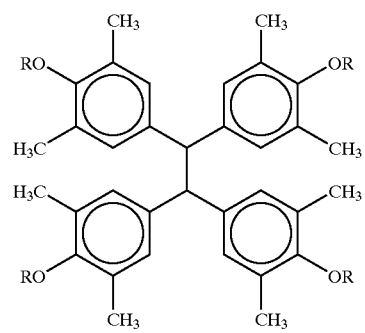
(21)
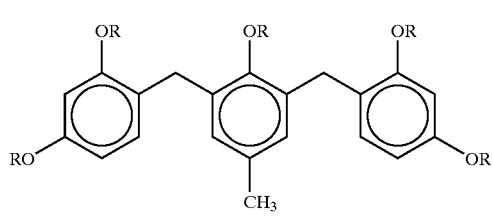
(22)
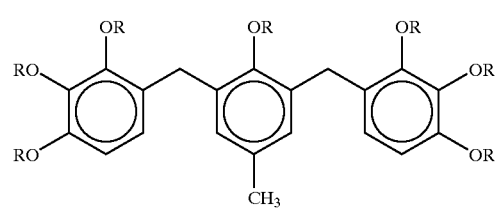
(23)

-continued
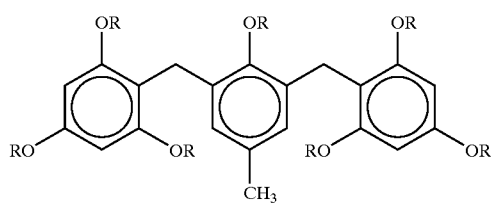 (24)
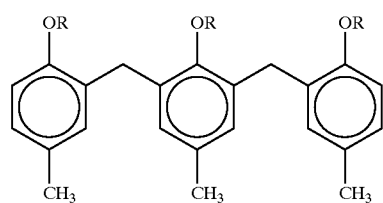 (25)
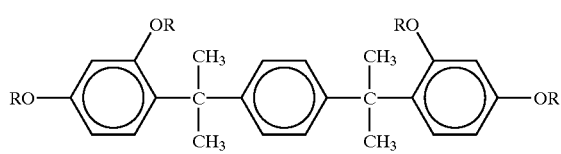 (26)
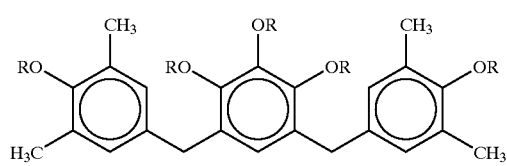 (27)
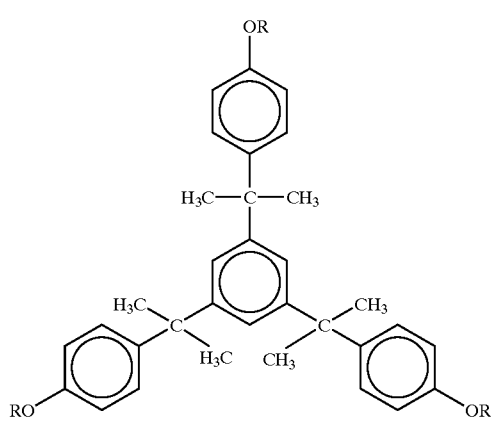 (28)
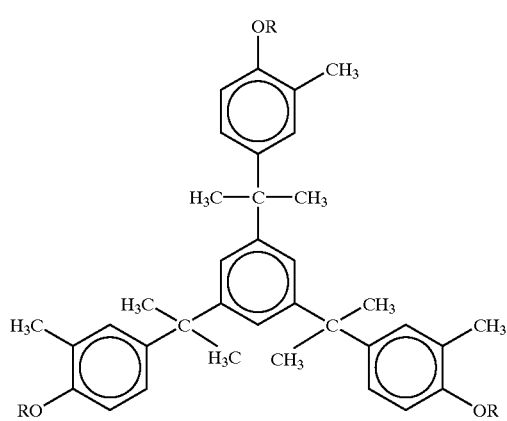 (29)
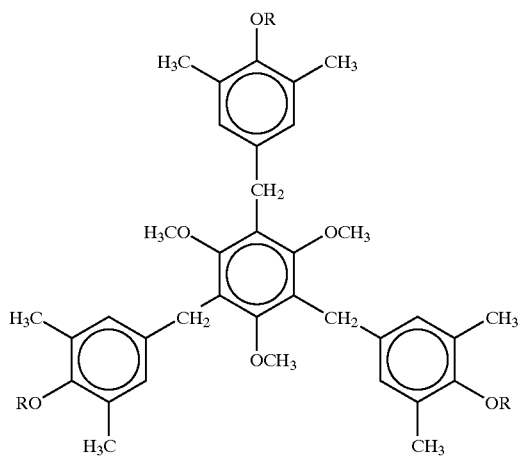 (30)
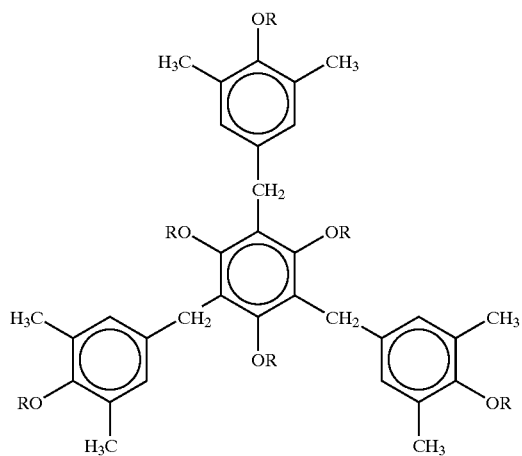 (31)
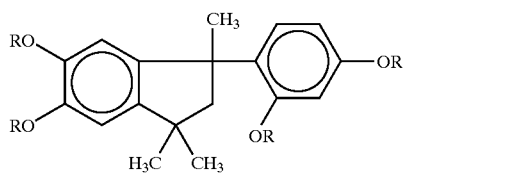 (32)
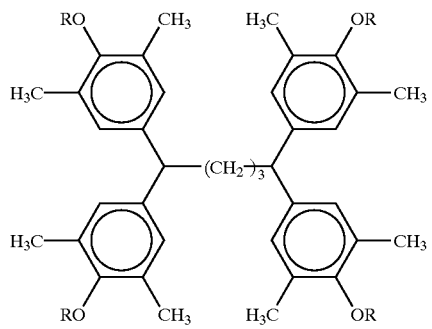 (33)

-continued
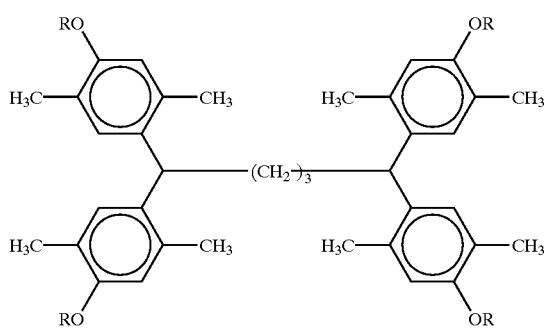
(34)
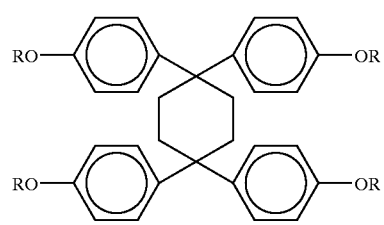
(35)
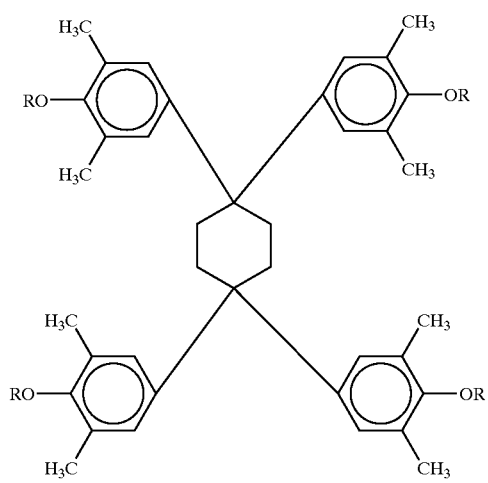
(36)
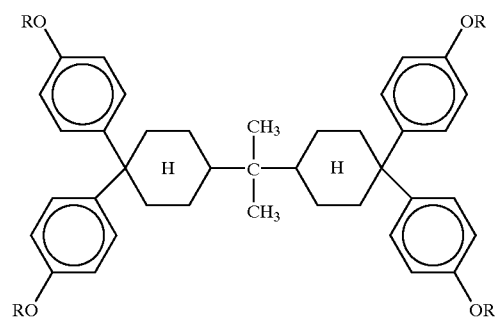
(37)
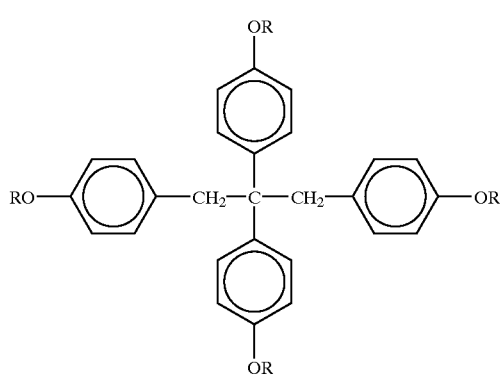
(38)
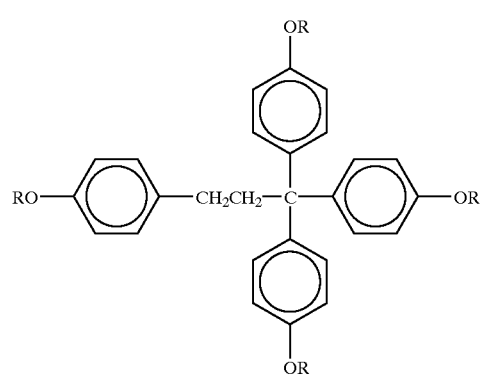
(39)
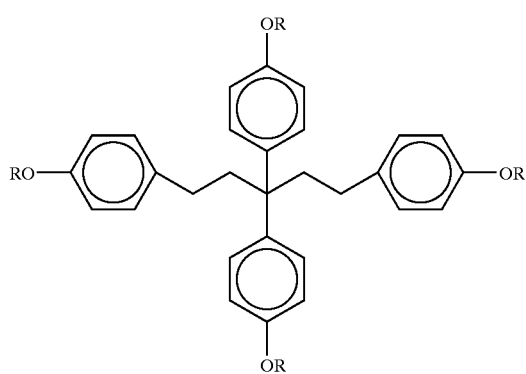
(40)
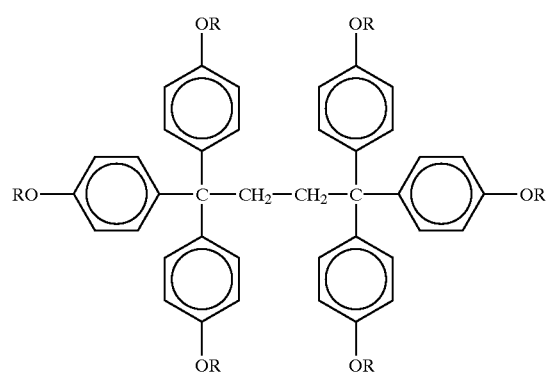
(41)

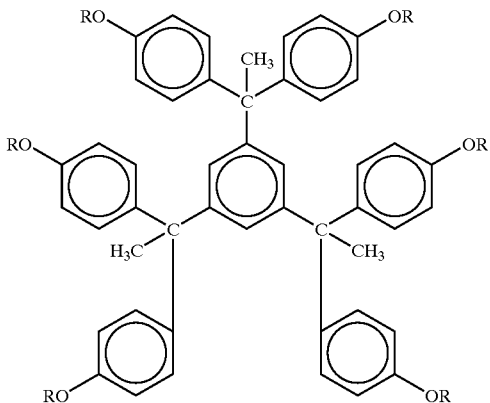 (42)

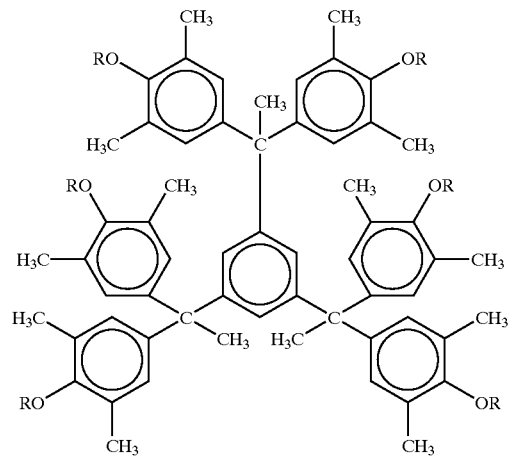 (43)

In Compounds (1) to (43), R represents a hydrogen atom, —CH$_2$—COO—C(CH$_3$)$_2$C$_6$H$_5$—, —CH$_2$—COO—C$_4$H$_9$(t), —COO—C$_4$H$_9$(t) or

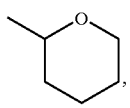, provided that at least 2, depending on the structure, at least 3 are a group other than a hydrogen atom and the substituents R in each compound may be the same or different.

In this case, the content of the dissolution-inhibiting compound is generally from 3 to 45 wt %, preferably from 5 to 30 wt %, more preferably from 10 to 20 wt %, based on the entire weight of the photosensitive composition (exclusive of solvent).

In order to control the alkali solubility, an alkali-soluble resin not having a group capable of decomposing by an acid may be mixed.

Examples of such an alkali-soluble resin include novolak resin, hydrogenated novolak resin, acetone-pyrogallol resin, o-polyhydroxystyrene, m-polyhydroxystyrene, p-polyhydroxystyrene, hydrogenated polyhydroxystyrene, halogen- or alkyl-substituted polyhydroxystyrene, hydroxystyrene-N-substituted maleimide copolymer, o/p- or m/p-hydroxystyrene copolymer, polyhydroxystyrene in which a part of hydroxyl groups is O-alkylated (for example, from 5 to 30 mol % O-methylation) or O-acylated (for example, from 5 to 30 mol % O-acetylation), styrene-maleic acid anhydride copolymer, styrene-hydroxystyrene copolymer, α-methylstyrene-hydroxystyrene copolymer, carboxyl group-containing methacryl-base resin and derivatives thereof, however, the present invention is by no means limited thereto.

Among these alkali-soluble resins, preferred are novolak resin; o-polyhyroxystyrene, m-polyhydroxystyrene, p-polyhydroxystyrene and copolymers thereof, alkyl-substituted polyhydroxystyrene, partially O-alkylated or O-acylated polyhydroxystyrene, styrene-hydroxystyrene copolymer and α-methylstyrene-hydroxystyrene copolymer. The novolak resin can be obtained by addition-condensing a predetermined main component monomer with an aldehyde in the presence of an acidic catalyst.

Examples of the predetermined monomer include phenol, cresols such as m-cresol, p-cresol and o-cresol, xylenols such as 2,5-xylenol, 3,5-xylenol, 3,4-xylenol and 2,3-xylenol, alkylphenols such as m-ethylphenol, p-ethylphenol, o-ethylphenol, p-t-butyl phenol, p-octylphenol and 2,3,5-trimethylphenol, alkoxyphenols such as p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol and p-butoxyphenol, bisalkylphenols such as 2-methyl-4-isopropylphenol, and hydroxy aromatic compounds such as m-chlorophenol, p-chlorophenol, o-chlorophenol, dihydroxybiphenyl, bisphenol A, phenylphenol, resorcinol and naphthol, and these monomers may be used either individually or in combination of two or more thereof. However, the present invention is by no means limited thereto.

Examples of the aldehydes which can be used include formaldehyde, p-formaldehyde, acetoaldehyde, propionaldehyde, benzaldehyde, phenylacetoaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, fufural, chloroacetaldeyde, and acetal forms thereof, such as chloroacetaldehyde diethyl acetal. among these, formaldehyde is preferred.

These formaldehydes may be used either individually or in combination of two or more thereof. Examples of the acidic catalyst which can be used include hydrochloric acid, sulfuric acid, formic acid, acetic acid and oxalic acid.

The novolak resin preferably has a weight average molecular weight of from 1,000 to 30,000. If the weight average molecular weight is less than 1,000, the layer loss of the unexposed area after the development is large, whereas if it exceeds 30,000, the development rate decreases. The weight average molecular weight is more preferably from 2,000 to 20,000.

The polyhydroxystyrene, and derivatives and copolymers thereof other than the novolak resin, each has a weight average molecular weight of 2,000 or more, preferably from 5,000 to 200,000, more preferably from 10,000 to 100,000.

In view of improving the heat resistance of the resist film, the weight average molecular weight is preferably 25,000 or more.

The weight average molecular weight as used herein is defined as a polystyrene-conversion value by gel permeation chromatography.

In the present invention, the above-described alkali-soluble resins may be used in combination of two or more thereof.

The amount of the alkali-soluble resin added in the composition is preferably from 5 to 30 wt %.

The photo-acid generator (b) for use in the present invention is a compound capable of generating an acid with irradiation of an actinic ray or radiation.

The compound capable of decomposing by the irradiation of actinic ray or radiation to generate an acid, for use in the present invention may be appropriately selected from a photoinitiator for photocationic polymerization, a photoinitiator for photoradical polymerization, a light decolorizing agent such as dyes, a light discoloring agent, a compound capable of generating an acid with irradiation of known light used for microresist and the like (e.g., ultraviolet ray or far ultraviolet ray at from 200 to 400 nm, particularly preferably g-line, h-line, i-line, KrF excimer laser ray), ArF excimer laser ray, electron beam, X ray, molecular beam or ion beam, and a mixture thereof.

Other examples of the compound capable of generating an acid with irradiation of actinic ray or radiation, for use in the present invention include onium salts such as diazonium salt, ammonium salt, phosphonium salt, iodonium salt, sulfonium salt, selenonium salt and arsonium salt, organic halogen compounds, organic metal/organic halogen compounds, photo-acid generators having an o-nitrobenzyl-type protective group, compounds capable of photolyzing to generate sulfonic acid, represented by iminosulfonate, and disulfone compounds.

Also, compounds in which a group or compound capable of generating an acid upon irradiation of the above-described light is introduced into the main chain or side chain of the polymer may be used.

Furthermore, the compounds capable of generating an acid with irradiation of light described in V. N. R. Pillai, *Synthesis*, (1), 1 (1980), A. Absd et al., *Tetrahedron Lett.*, (47), 4555 (1971, D. H. R. Barton et al., *J. Chem. Soc.*, (C), 329 (1970), U.S. Pat. No. 3,779,778 and European Patent 126,712 may be used.

Among these compounds capable of decomposing with irradiation of actinic ray or radiation to generate an acid, the compounds capable of generating sulfonic acid with irradiation of actinic ray or radiation represented by formula (A-1) to (A-7) are preferred.

The compounds represented by formula (A-1) to (A-7) are described in detail below.

Photo-acid Generators Represented by Formula (A-1) to (A-3)

Examples of the alkyl group represented by any one of $R_1$ to $R_6$ and $R_7$ to $R_{10}$ in formulae (A-1) to (A-3) include an alkyl group having from 1 to 4 carbon atoms, which may have a substituent, such as methyl group, ethyl group, propyl group, n-butyl group, sec-butyl group and t-butyl group. Examples of the cycloalkyl group include a cycloalkyl group having from 3 to 8 carbon atoms, which may have a substituent, such as cyclopropyl group, cyclopentyl group and cyclohexyl group. Examples of the alkoxy group include an alkoxy group having from 1 to 4 carbon atoms, such as methoxy group, ethoxy group, hydroxyethoxy group, propoxy group, n-butoxy group, isobutoxy group, sec-butoxy group and t-butoxy group. Examples of the halogen atom include fluorine atom, chlorine atom, bromine atom and iodine atom. Examples of the aryl group include an aryl group having from 6 to 14 carbon atoms, which may have a substituent, such as phenyl group, tolyl group, methoxyphenyl group and naphthyl group.

Preferred examples of the substituent include an alkoxy group having from 1 to 4 carbon atoms, a halogen atom (e.g., fluorine, chlorine, iodine), an aryl group having from 6 to 10 carbon atoms, an alkenyl group having from 2 to 6 carbon atoms, a cyano group, a hydroxy group, a carboxy group, an alkoxycarbonyl group and a nitro group.

The sulfonium or iodonium compound represented by formula (A-1), (A-2) or (A-3) for use in the present invention contains as a counter anion $X^-$ an anion of benzene sulfonic acid, naphthalenesulfonic acid or anthracene sulfonic acid containing at least one branched or cyclic alkyl or alkoxy group having 8 or more, preferably 10 or more, carbon atoms, containing at least two linear, branched or cyclic alkyl or alkoxy group having from 4 to 7 carbon atoms, containing at least three linear or branched alkyl or alkoxy group having from 1 to 3 carbon atoms, containing from 1 to 5 halogen atoms, or containing a linear, branched or cyclic ester group having from 1 to 10 carbon atoms. By virtue of this, the diffusibility of acid (benzenesulfonic acid, naphthalenesulfonic acid or anthracenesulfonic acid having the group described above) generated after the exposure is reduced and the solvent solubility of the sulfonium or iodonium compound increases. In particular, from the standpoint of reducing diffusibility, the group is preferably a branched or cyclic alkyl or alkoxy group rather than a linear alkyl or alkoxy group. When the number of the group is 1, the diffusibility more clearly differs between the linear or branched group and the cyclic group.

Examples of the alkyl group having 8 or more, preferably from 8 to 20 carbon atoms, include an octyl group, a nonyl group, a decyl group, a undecyl group, a dodecyl group, a tridecyl group, a tetradecyl group and an octadecyl group, which may be branched or cyclic.

Examples of the alkoxy group having 8 or more, preferably from 8 to 20 carbon atoms, include an octyloxy group, a nonyloxy group, a decyloxy group, a undecyloxy group, a dodecyloxy group, a tridecyloxy group, a tetradecyloxy group and an octadecyloxy group, which may be branched or cyclic.

Examples of the alkyl group having from 4 to 7 carbon atoms include a butyl group, a pentyl group, a hexyl group and a heptyl group, which may be linear, branched or cyclic.

Examples of the alkoxy group having from 4 to 7 carbon atoms include a butoxy group, a pentyloxy group, a hexyloxy group and a heptyloxy group, which may be linear, branched or cyclic.

Examples of the alkyl group having from 1 to 3 carbon atoms include a methyl group, an ethyl group, a n-propyl group and an isopropyl group.

Examples of the alkoxy group having from 1 to 3 carbon atoms include a methoxy group, an ethoxy group, a n-propoxy group and an isopropoxy group.

Examples of the halogen atom include fluorine atom, chlorine atom, bromine atom and iodine atom, with fluorine atom being preferred.

Examples of the linear, branched or cyclic ester having from 1 to 10 carbon atoms include a methyl ester group, an ethyl ester group, a n-propyl ester group, an i-propyl ester group, a n-butyl ester group, an i-butyl ester group, a t-butyl ester group, a n-hexyl ester group, an i-hexyl ester group, a t-hexyl ester group, a n-heptyl ester group, an i-heptyl ester group, a t-heptyl ester group, a n-octyl ester group, an i-octyl ester group, a t-octyl ester group, a n-nonyl ester group, a i-nonyl ester group, a t-nonyl ester group, a n-decanyl ester group, i-decanyl ester group, t-decanyl ester group, a cyclopropyl ester group, a cyclobutyl ester group, a cyclopentyl ester group, a cyclohexyl ester group, a cycloheptyl ester group, a cyclooctyl ester group, a cyclononyl ester group and a cyclodecanyl ester group.

The aromatic sulfonic acid represented by X⁻ may contain, in addition to the above-described specific substituents, a halogen atom (e.g., fluorine, chlorine, bromine, iodine), an aryl group having from 6 to 10 carbon atoms, a cyano group, a sulfide group, a hydroxy group, a carboxy group or a nitro group as a substituent.

Specific examples (A-1-1) to (A-1-66), (A-2-1) to (A-2-59) and (A-3-1) to (A-3-35) of these compounds are set forth below, however, the present invention is by no means limited thereto.

(A-1-1)
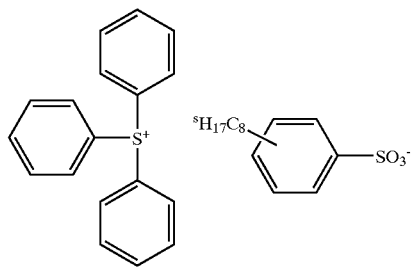

(A-1-2)
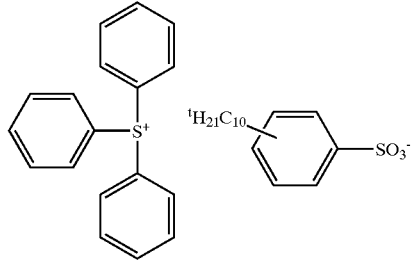

(A-1-3)
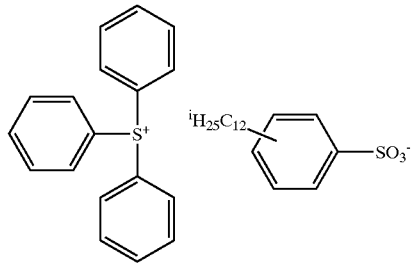

(A-1-4)
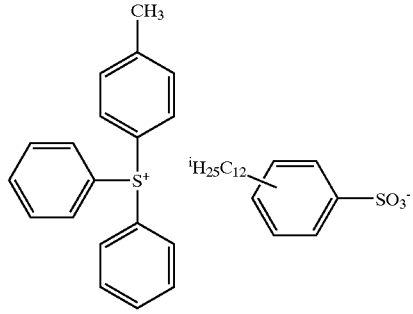

(A-1-5)
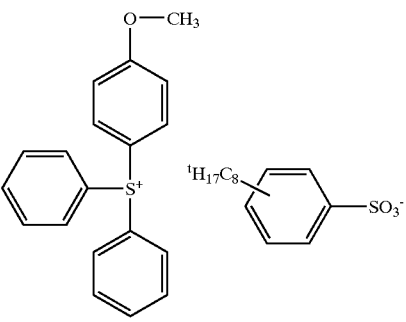

(A-1-6)
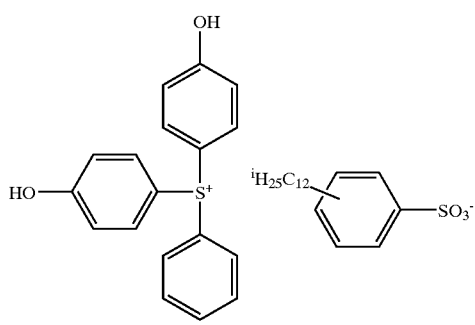

(A-1-7)
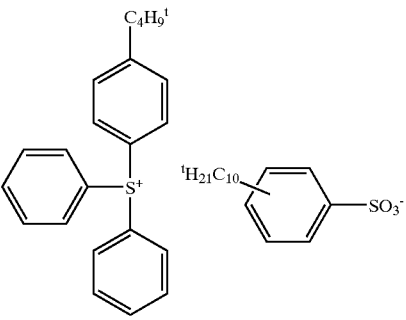

(A-1-8)
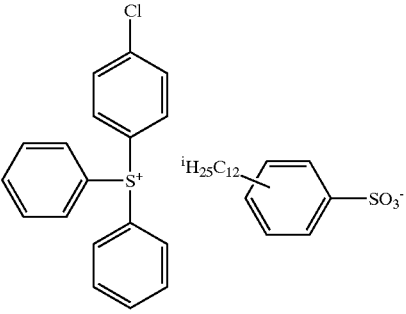

(A-1-9)
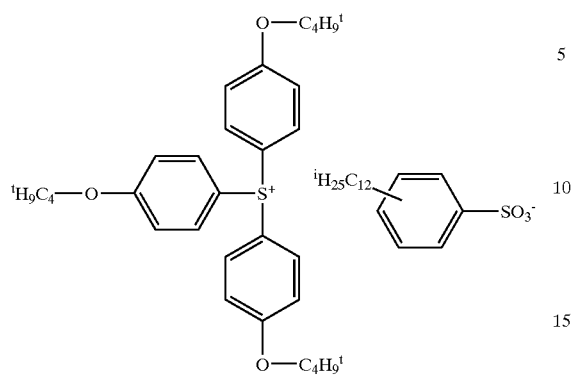
(A-1-14)
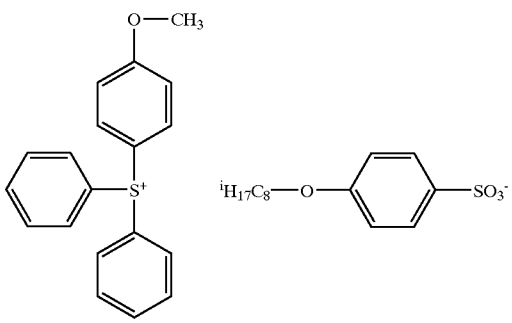
(A-1-10) (A-1-11) (A-1-15)
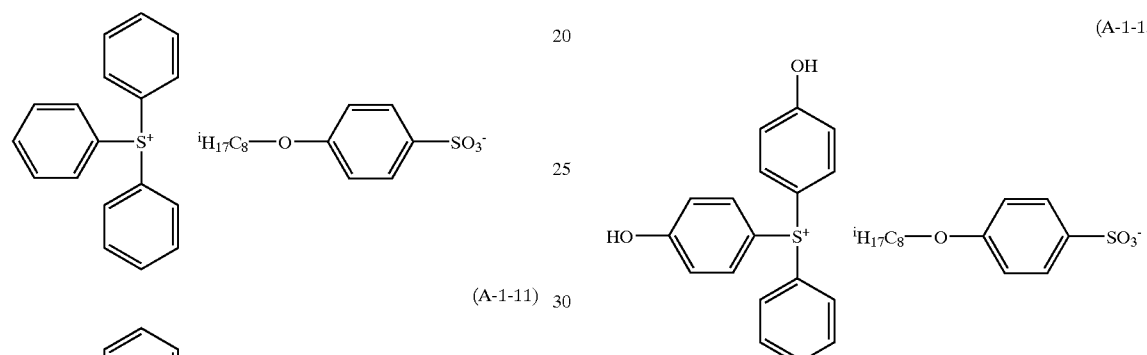
(A-1-12) (A-1-16)
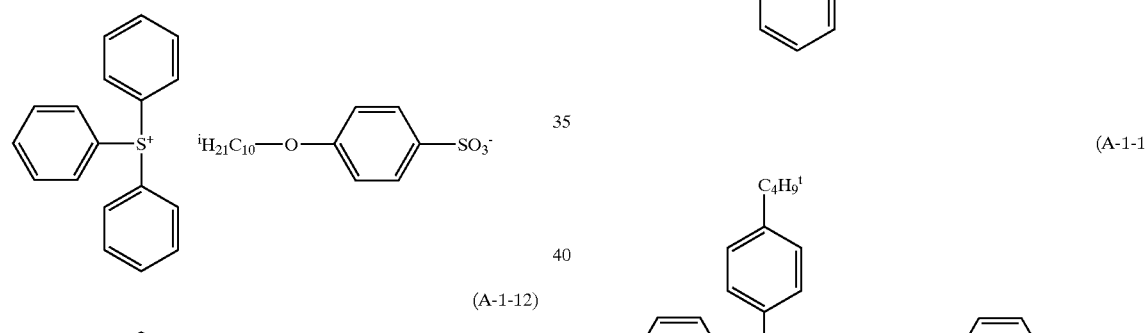
(A-1-13)
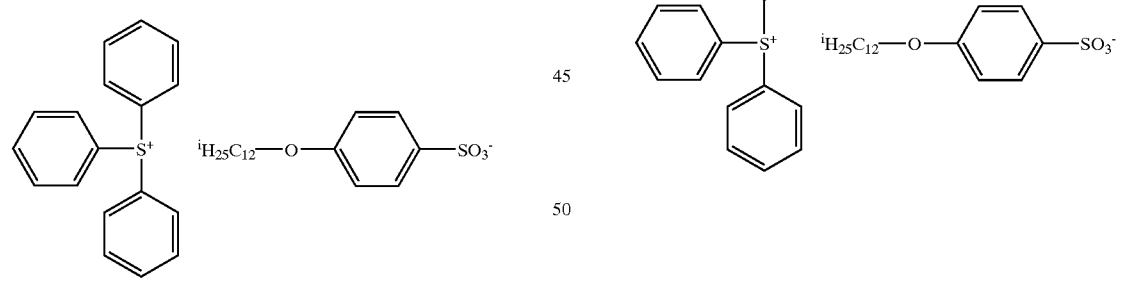
(A-1-17)
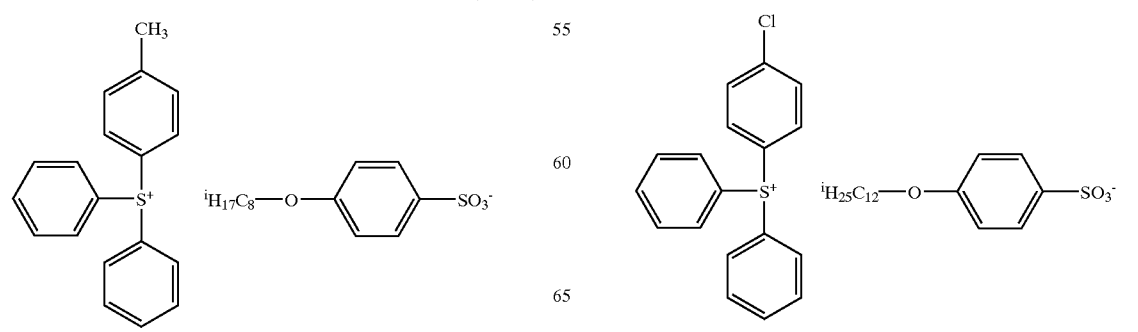

(A-1-18)
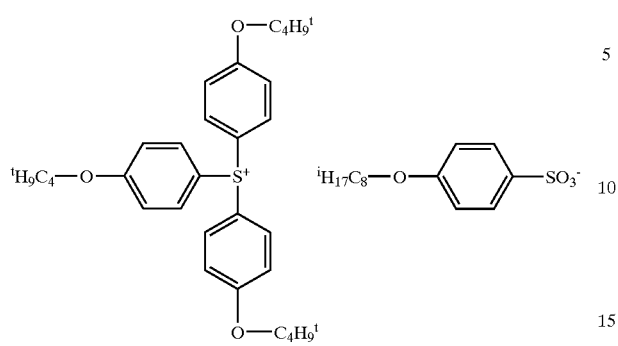
(A-1-23)
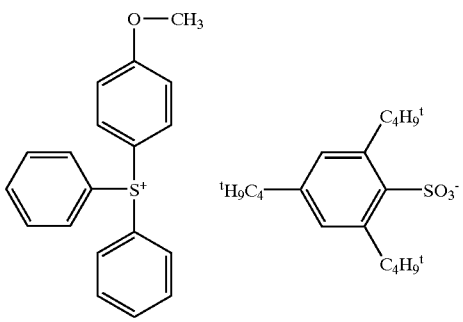
(A-1-19)
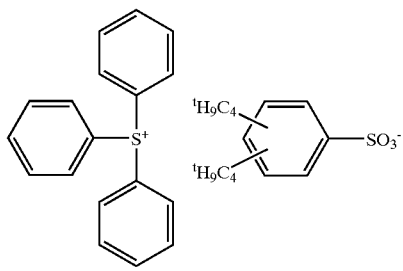
(A-1-24)
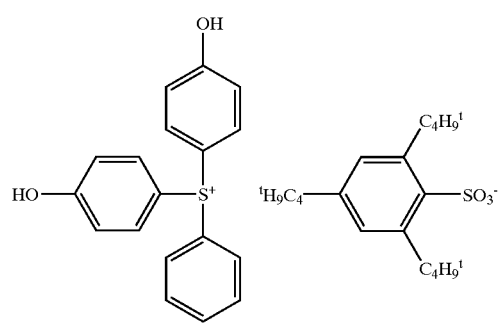
(A-1-20)
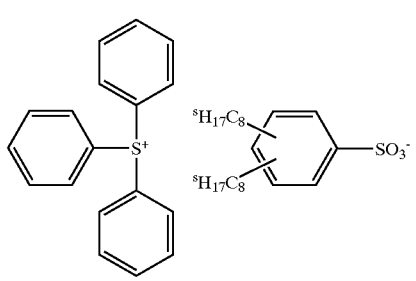
(A-1-25)
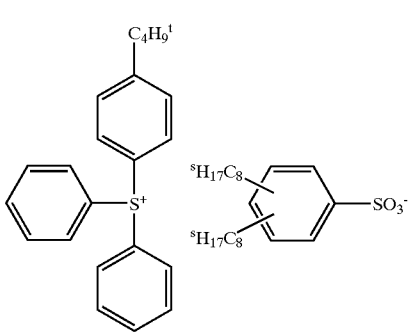
(A-1-21)
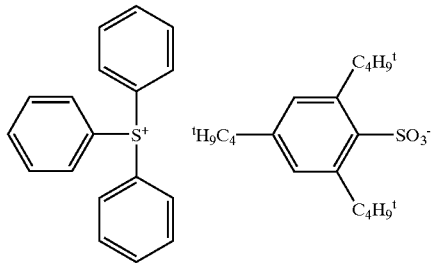
(A-1-22)
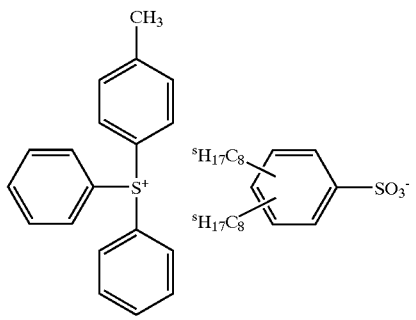
(A-1-26)
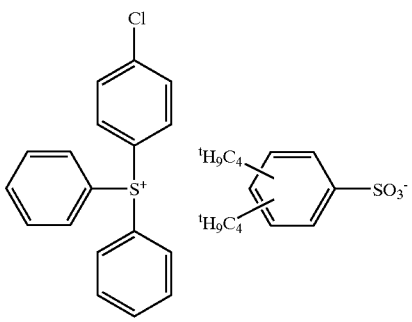

(A-1-27)
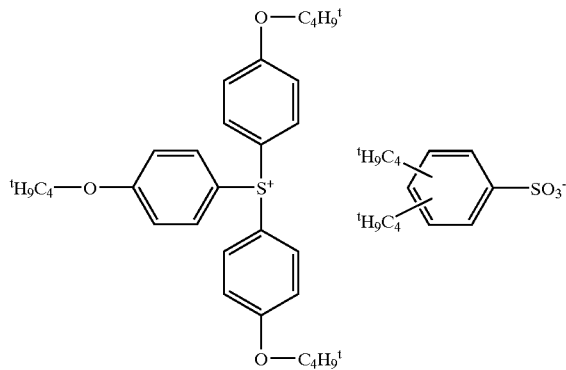
(A-1-28)
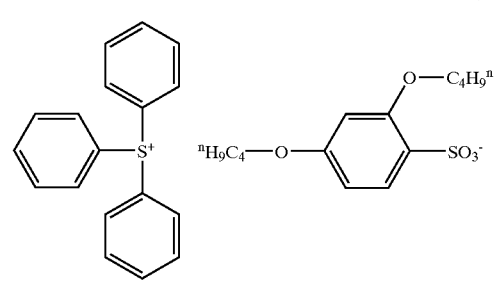
(A-1-29)
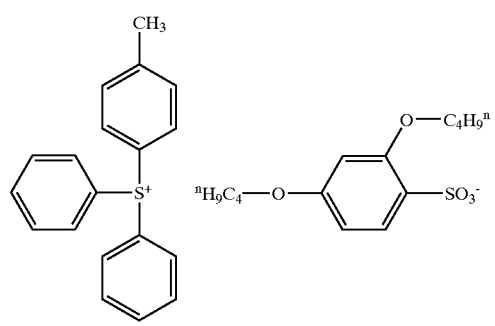
(A-1-30)
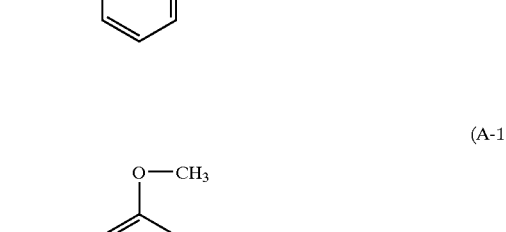
(A-1-31)
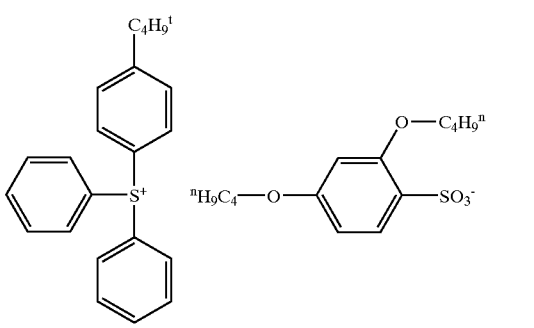
(A-1-32)
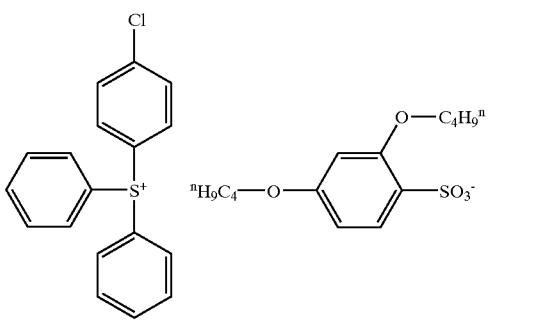
(A-1-33)
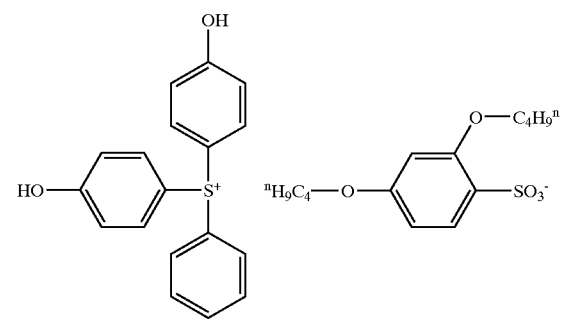
(A-1-34)
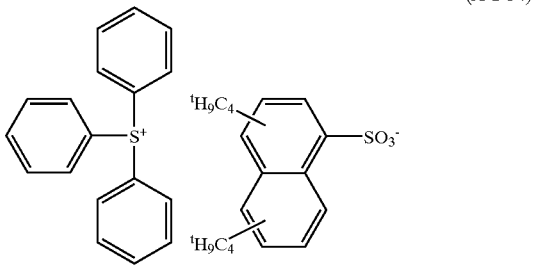
(A-1-35)
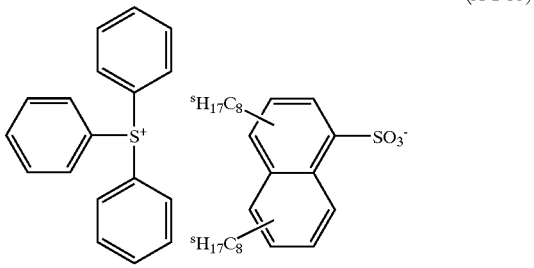

(A-1-36)
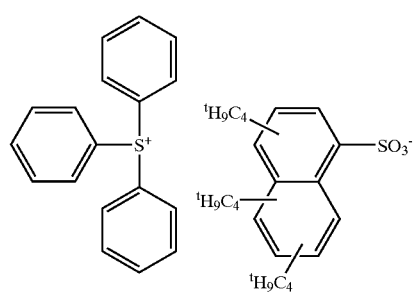
(A-1-37)
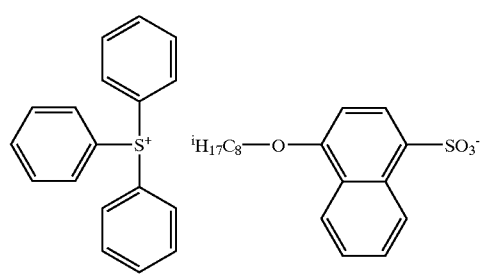
(A-1-38)
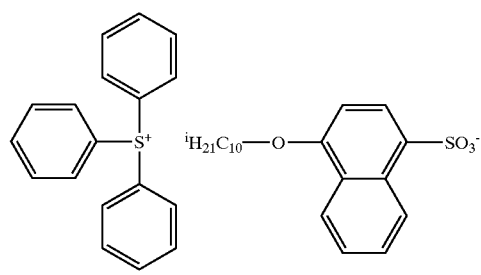
(A-1-39)
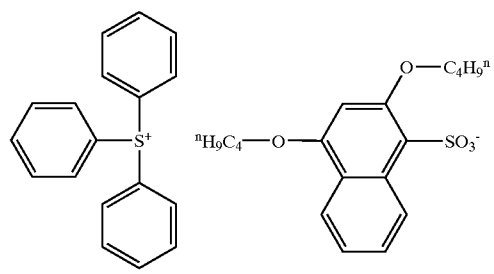
(A-1-40)
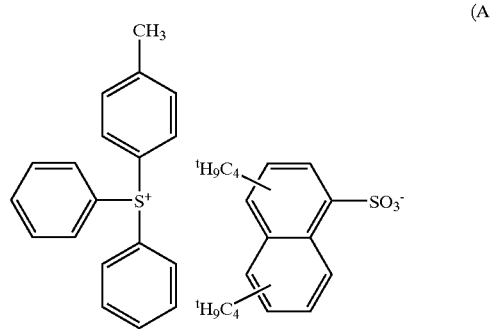
(A-1-41)
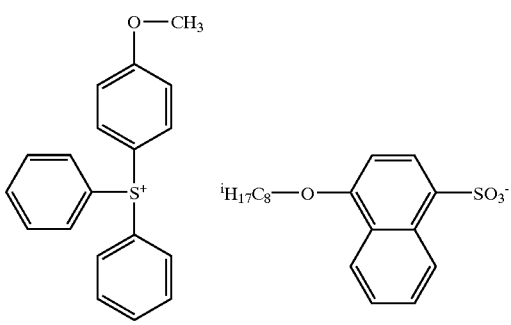
(A-1-42)
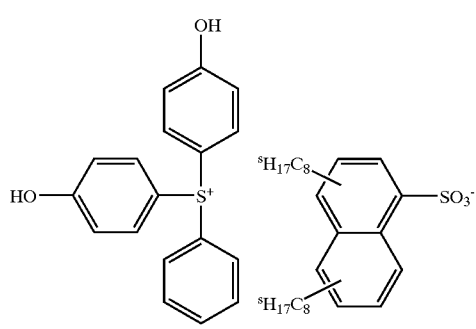
(A-1-43)
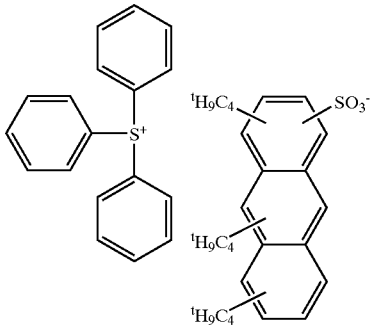
(A-1-44)
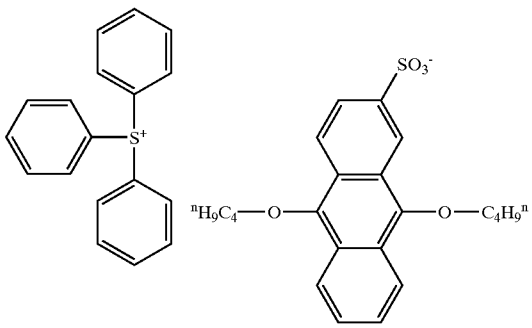

-continued
(A-1-45)
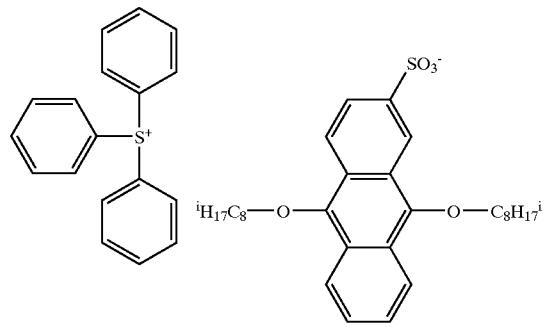
(A-1-46)
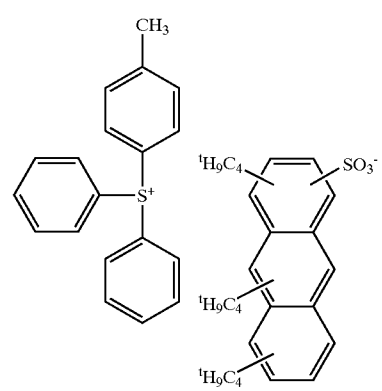
(A-1-47)
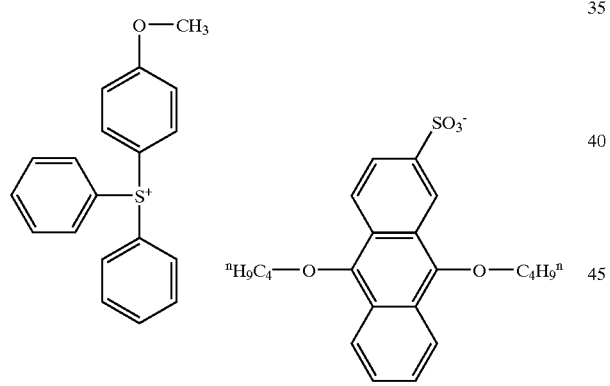
(A-1-48)
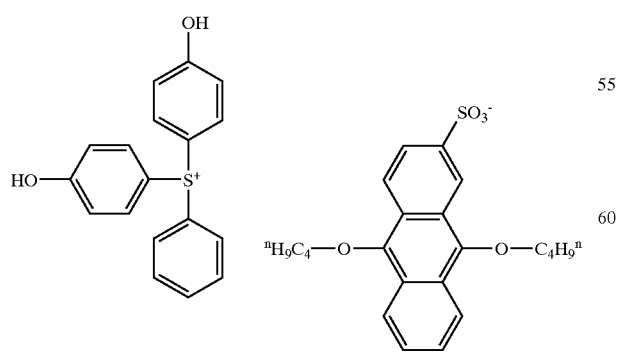
-continued
(A-1-49)
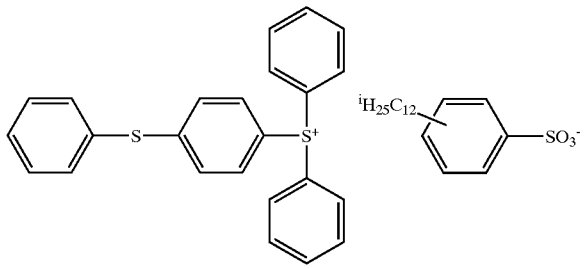
(A-1-50)
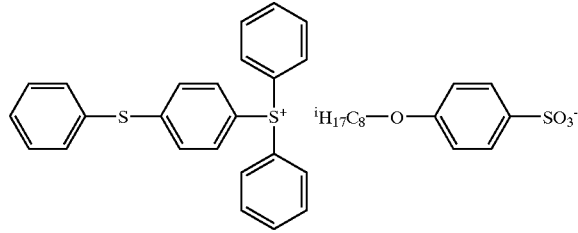
(A-1-51)
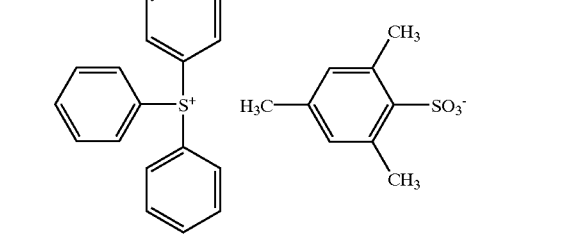
(A-1-52)
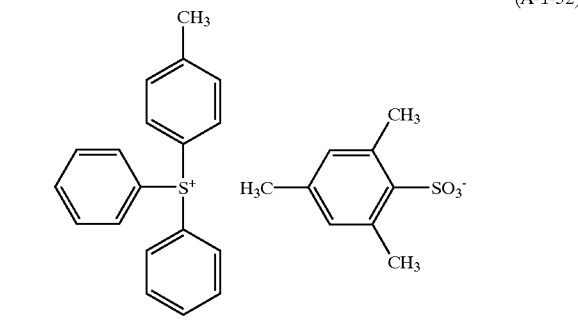
(A-1-53)
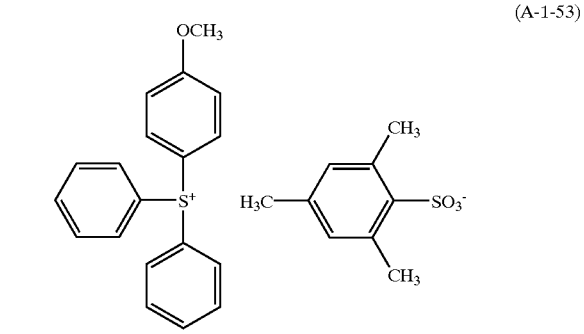

(A-1-54)
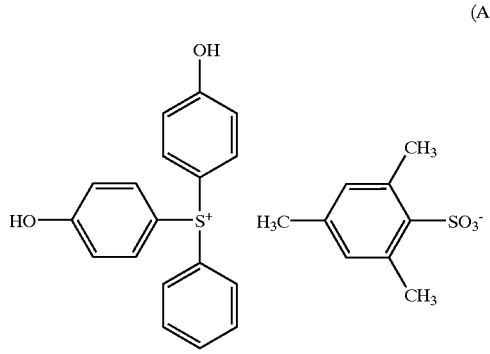
(A-1-55)
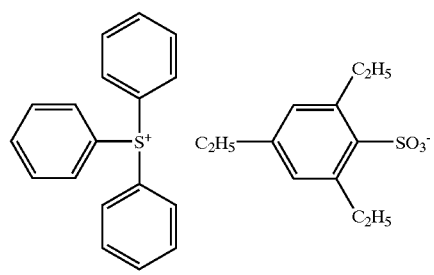
(A-1-56)
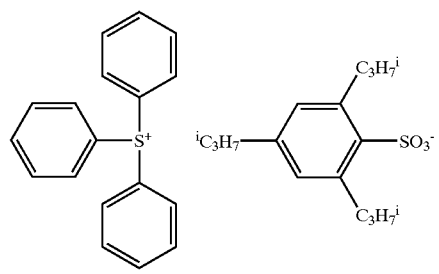
(A-1-57)
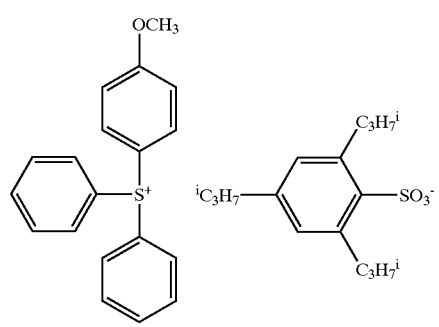
(A-1-58)
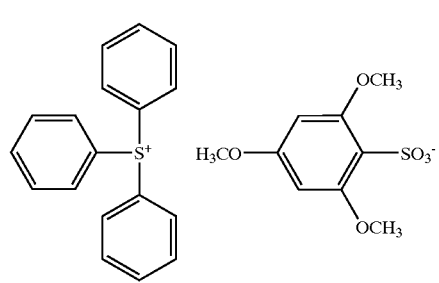
(A-1-59)
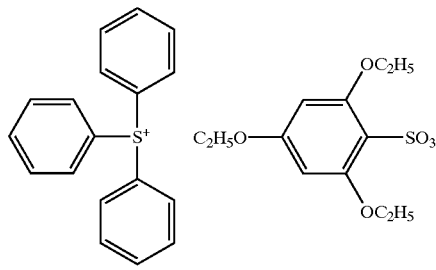
(A-1-60)
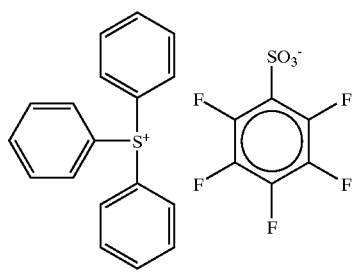
(A-1-61)
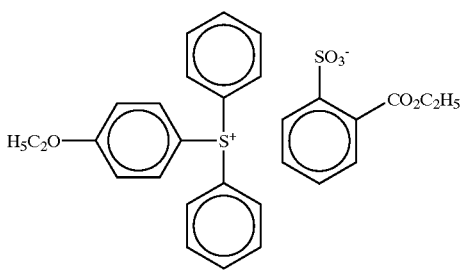
(A-1-62)
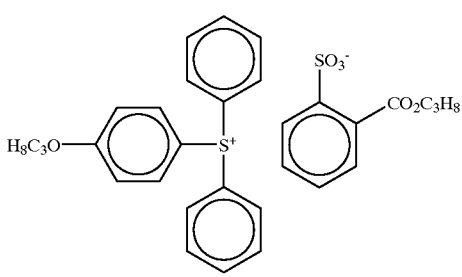
(A-1-63)
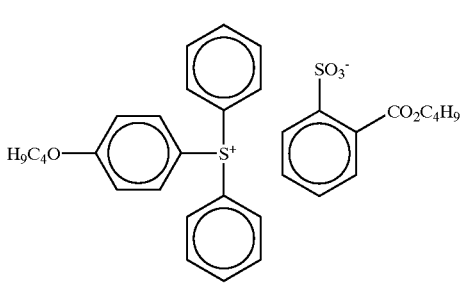

-continued
(A-1-64)
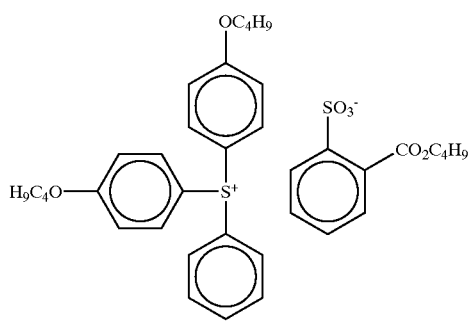
(A-1-65)
(A-1-66)
(A-2-1)
(A-2-2)
(A-2-3)
-continued
(A-2-4)
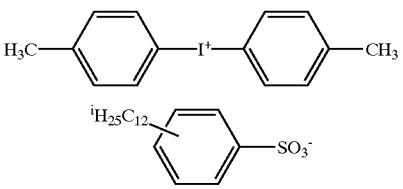
(A-2-5)
(A-2-6)
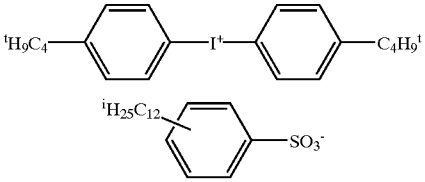
(A-2-7)
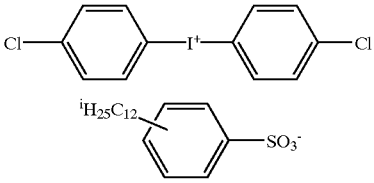
(A-2-8)
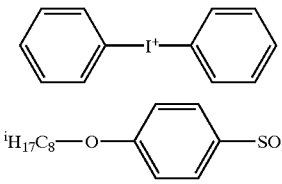
(A-2-9)
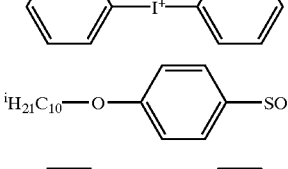
(A-2-10)
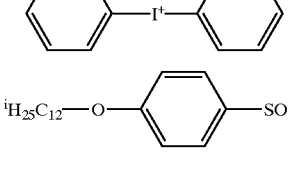
(A-2-11)
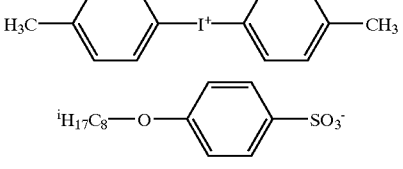
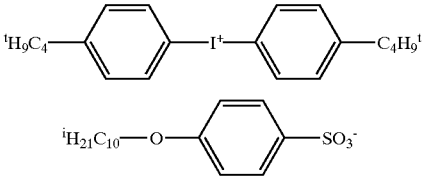

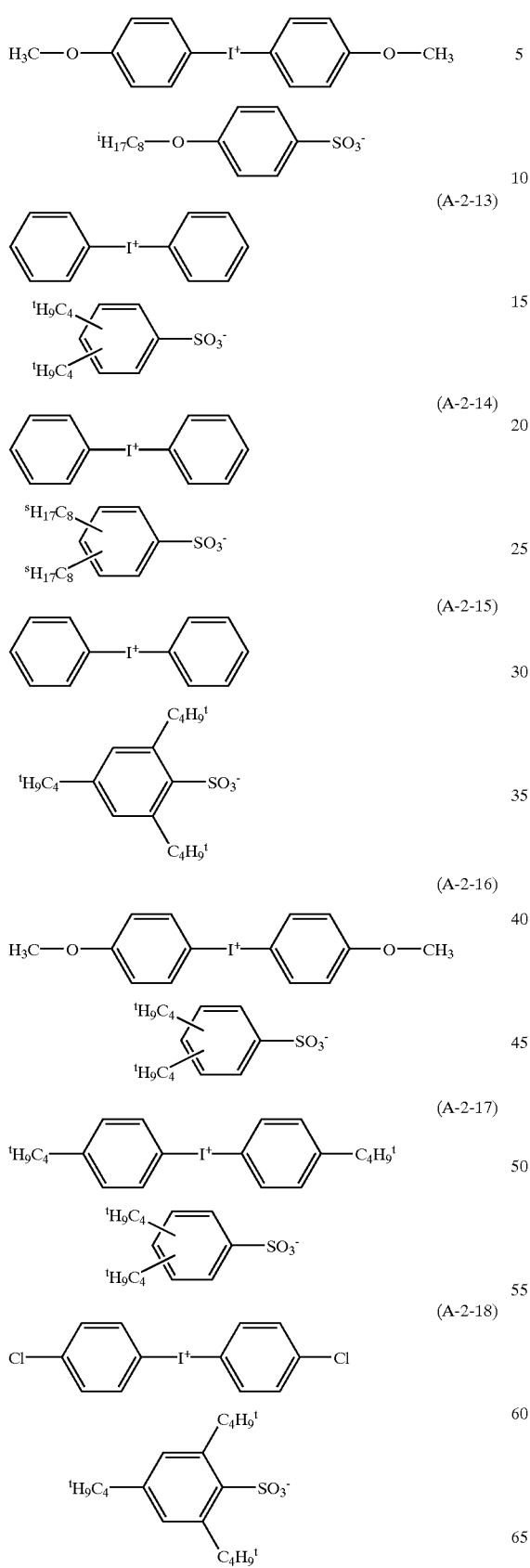
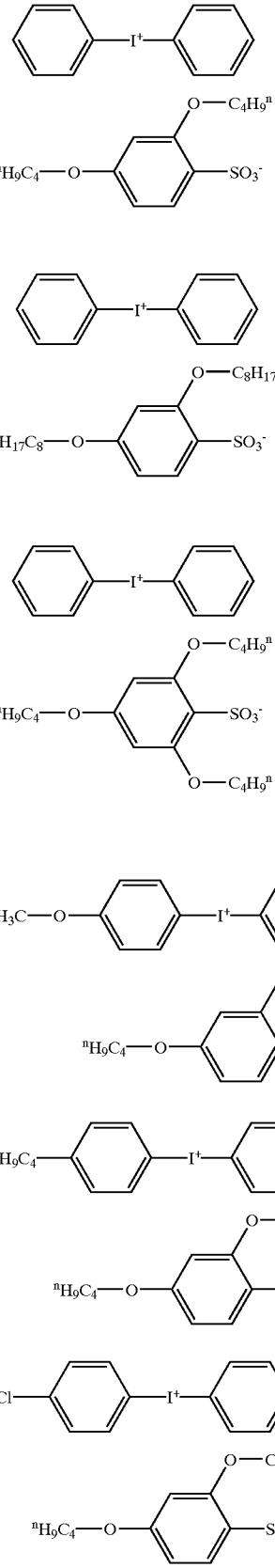

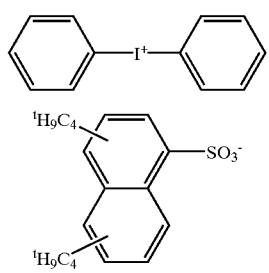
(A-2-25)
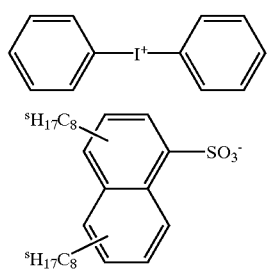
(A-2-26)
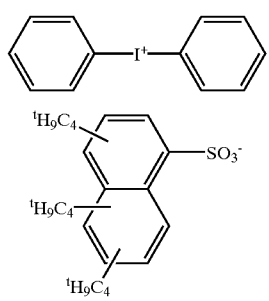
(A-2-27)
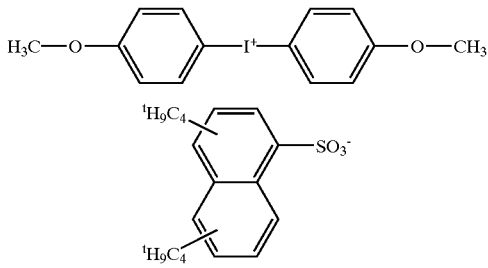
(A-2-28)
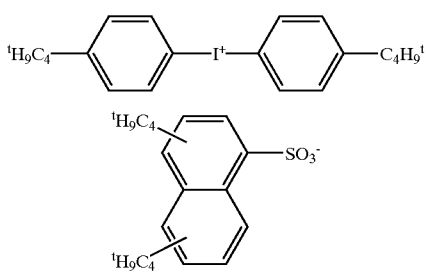
(A-2-29)
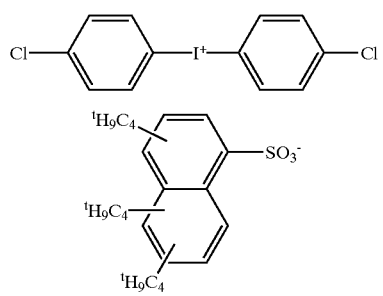
(A-2-30)
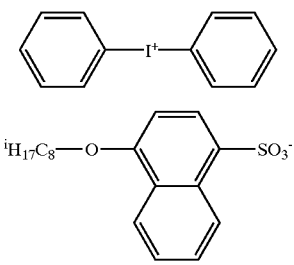
(A-2-31)
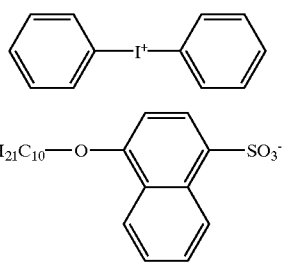
(A-2-32)
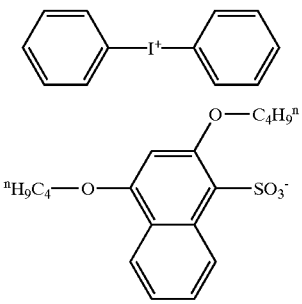
(A-2-33)
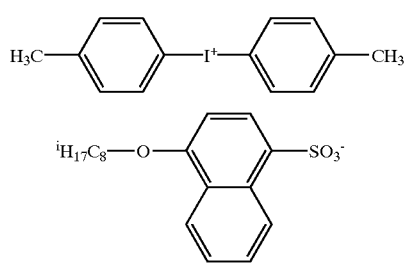
(A-2-34)

-continued
(A-2-35)
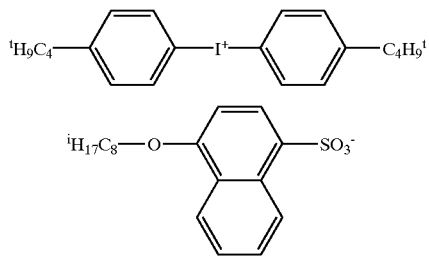
(A-2-36)
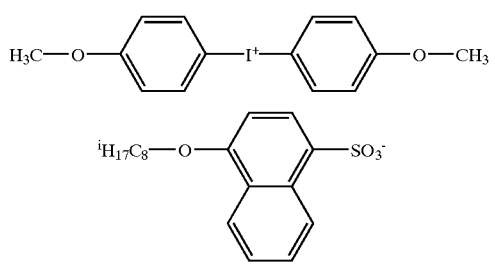
(A-2-37)
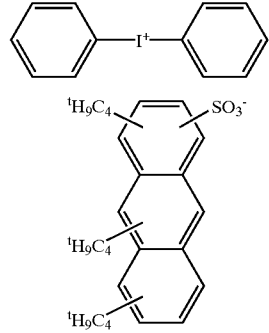
(A-2-38)
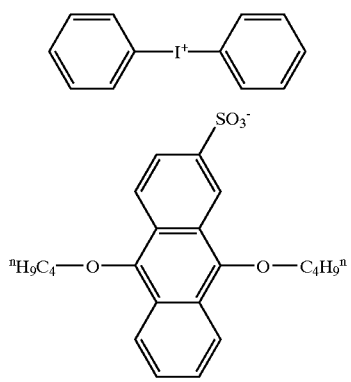
(A-2-39)
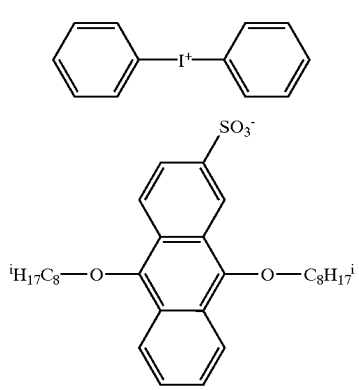
-continued
(A-2-40)
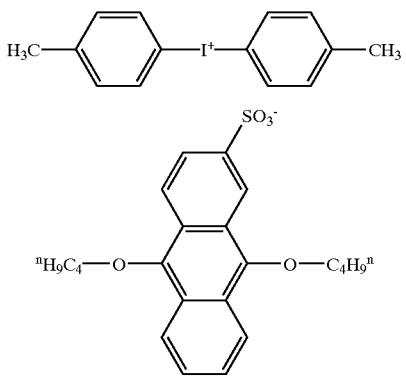
(A-2-41)
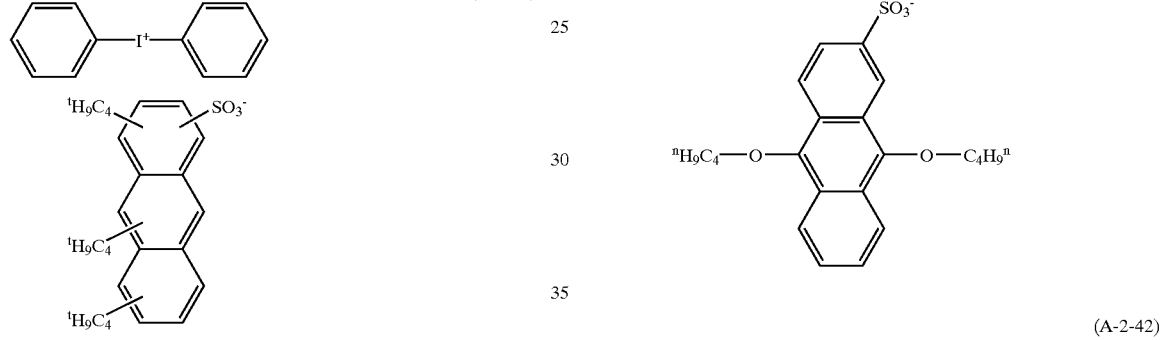
(A-2-42)
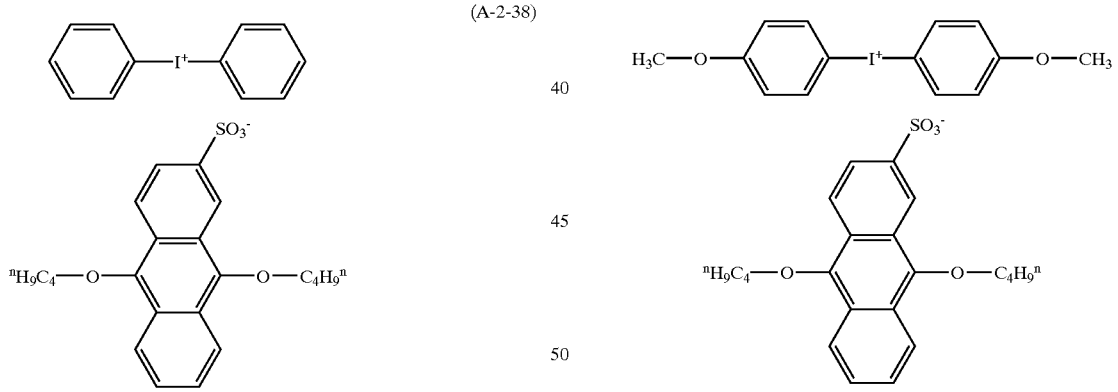
(A-2-43)
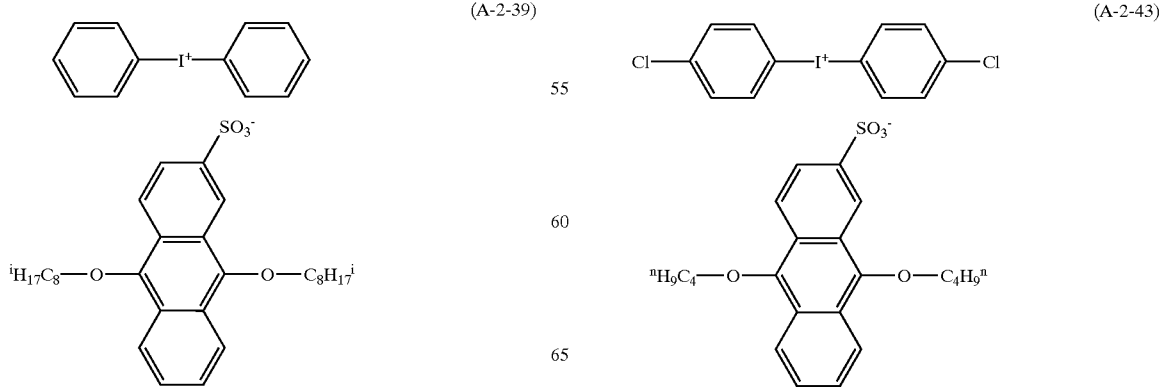

(A-2-44)
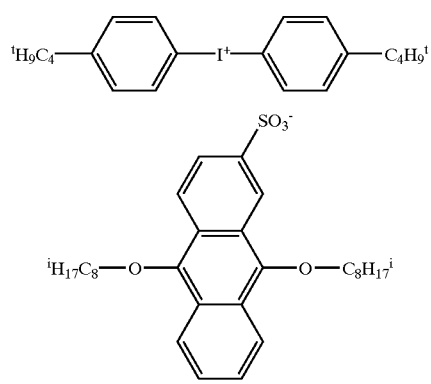
(A-2-45)
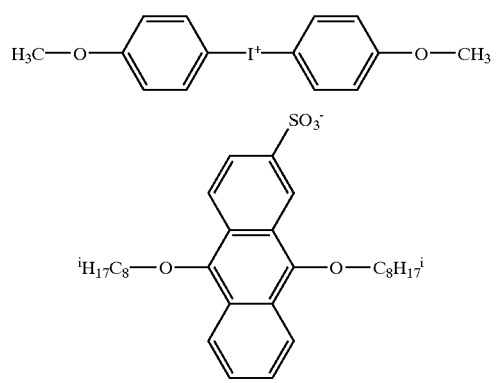
(A-2-46)
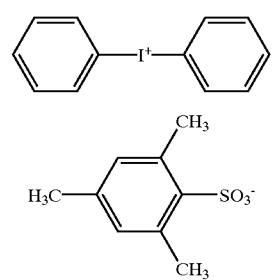
(A-2-47)
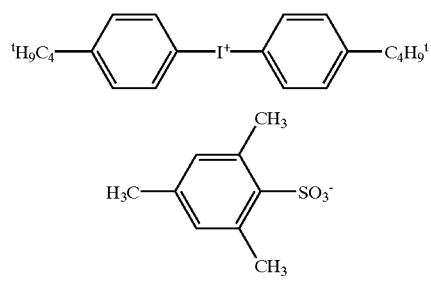
(A-2-48)
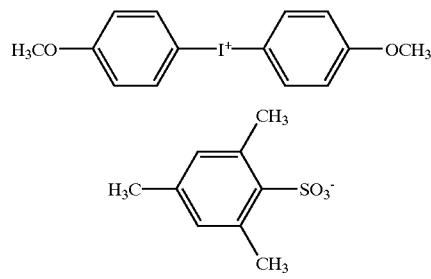
(A-2-49)
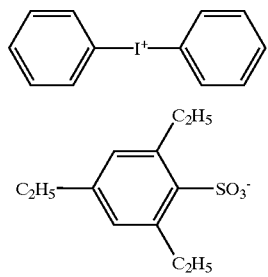
(A-2-50)
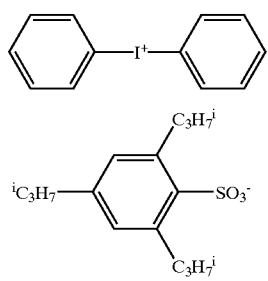
(A-2-51)
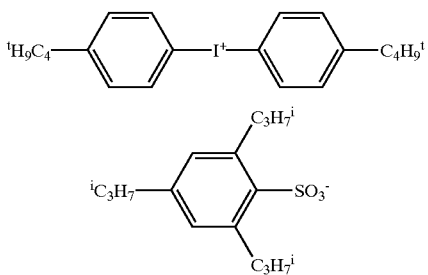
(A-2-52)
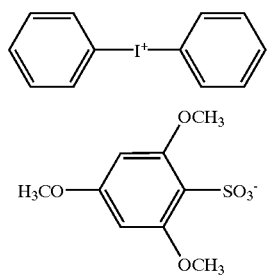
(A-2-53)
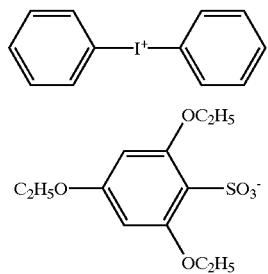

-continued
(A-2-54)
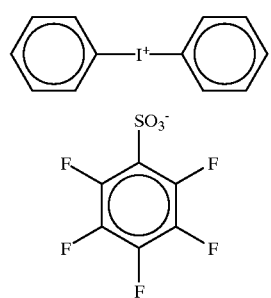
(A-2-55)
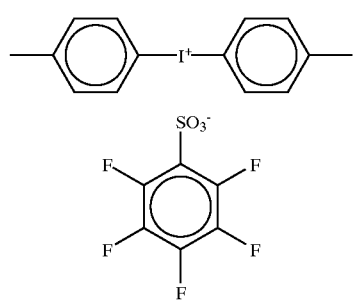
(A-2-56)
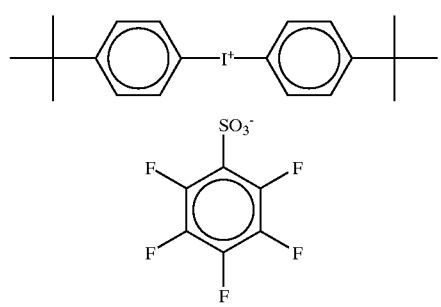
(A-2-57)
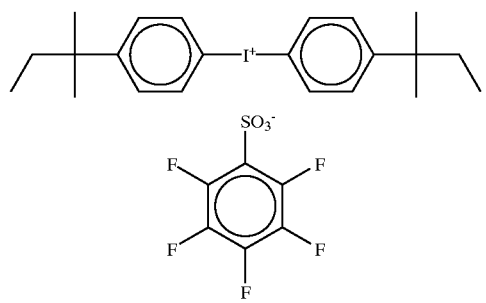
(A-2-58)
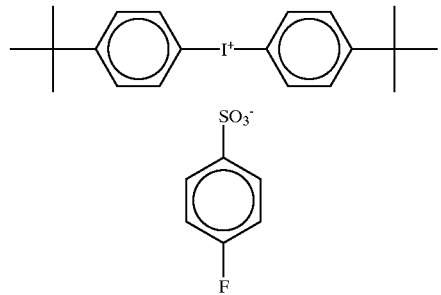
-continued
(A-2-59)
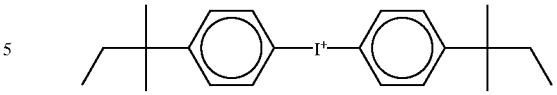
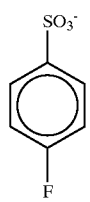
(A-3-1)
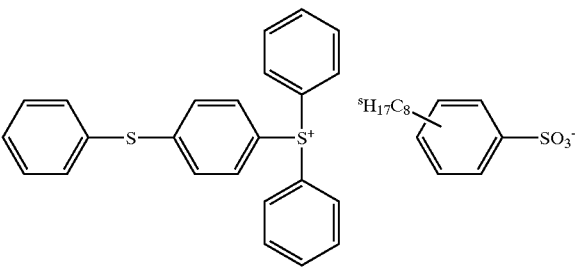
(A-3-2)
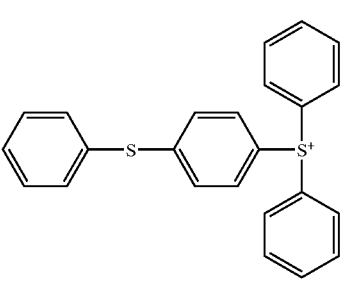
(A-3-3)
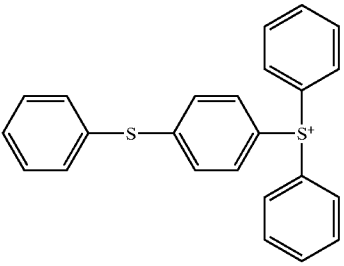
(A-3-4)
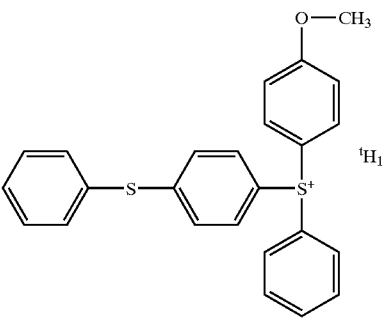

(A-3-5)
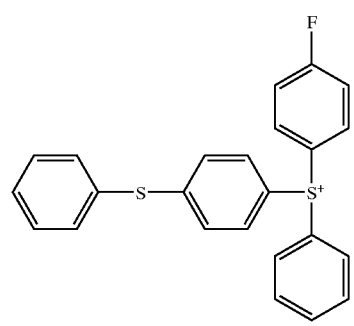 
(A-3-10)
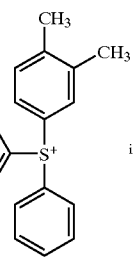 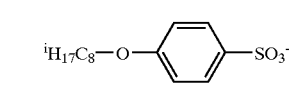
(A-3-6)
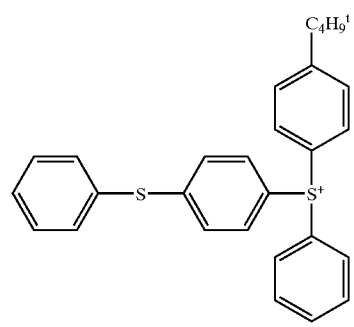 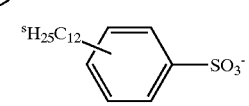
(A-3-11)
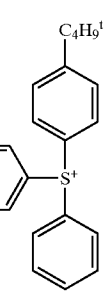 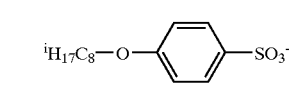
(A-3-7)
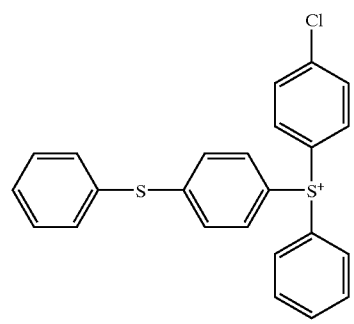 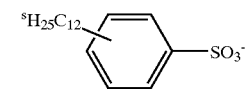
(A-3-12)
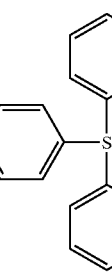 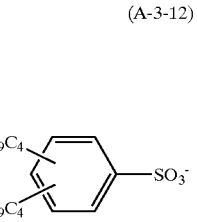
(A-3-8)
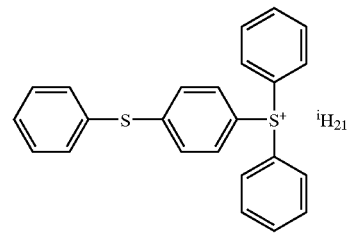 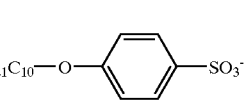
(A-3-13)
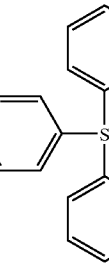 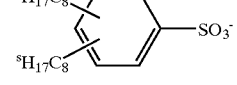
(A-3-9)
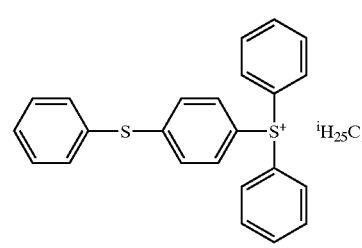 
(A-3-14)
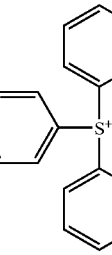 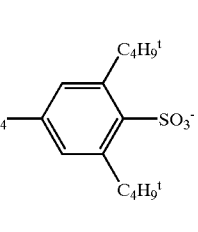

(A-3-15)
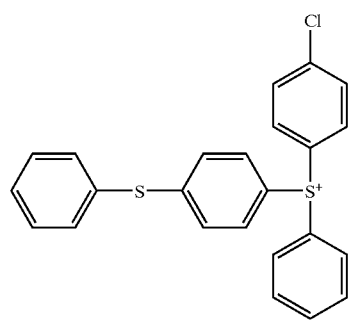
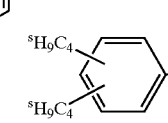
(A-3-20)
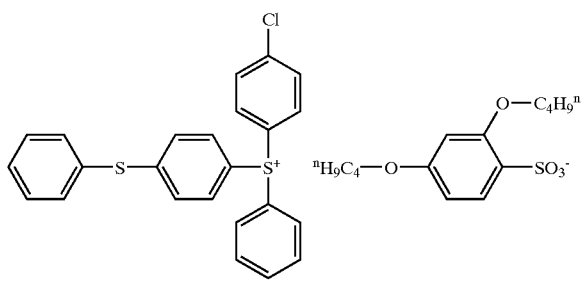
(A-3-16)
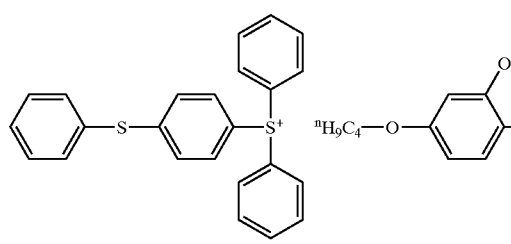
(A-3-21)
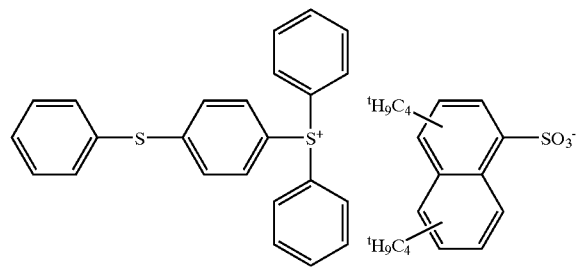
(A-3-17)
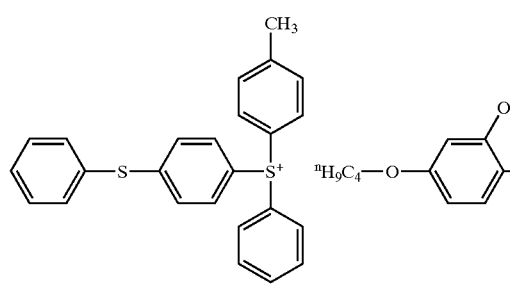
(A-3-22)
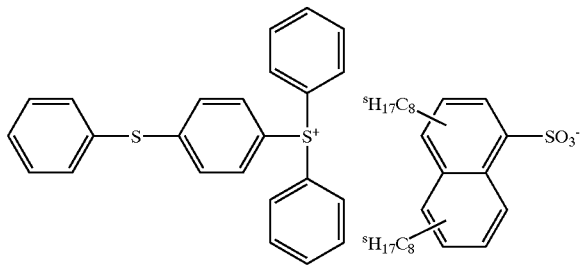
(A-3-18)
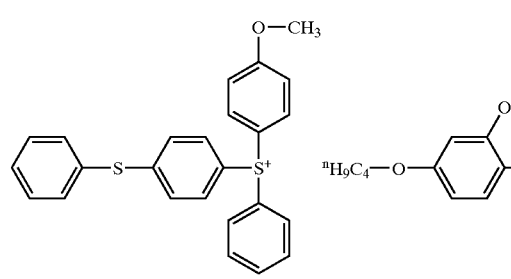
(A-3-23)
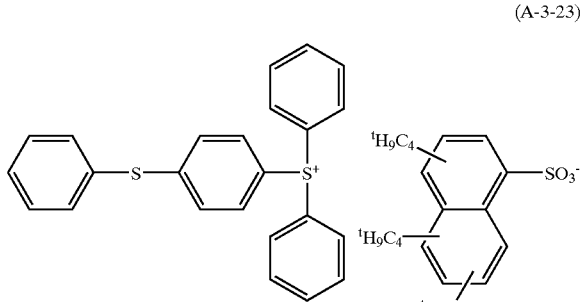
(A-3-19)
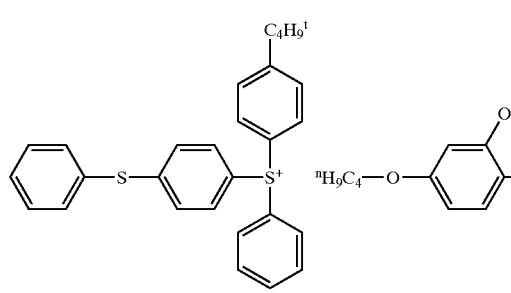
(A-3-24)
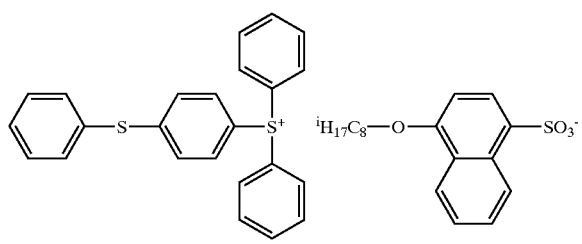

(A-3-25)
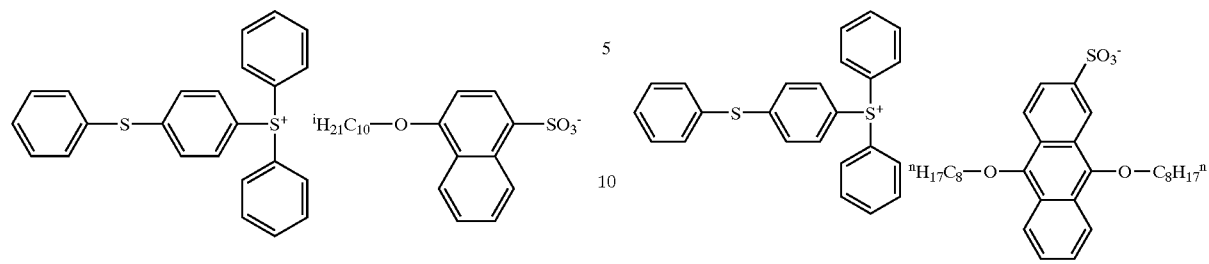
(A-3-30)
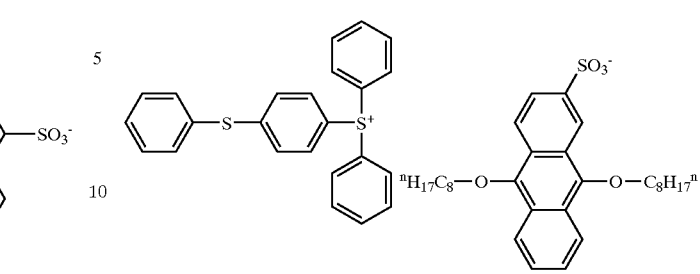
(A-3-26)
(A-3-31)
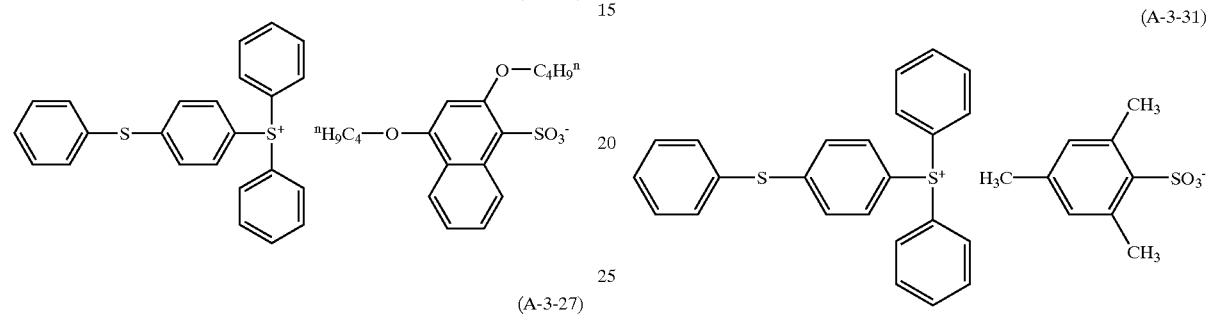
(A-3-27)
(A-3-32)
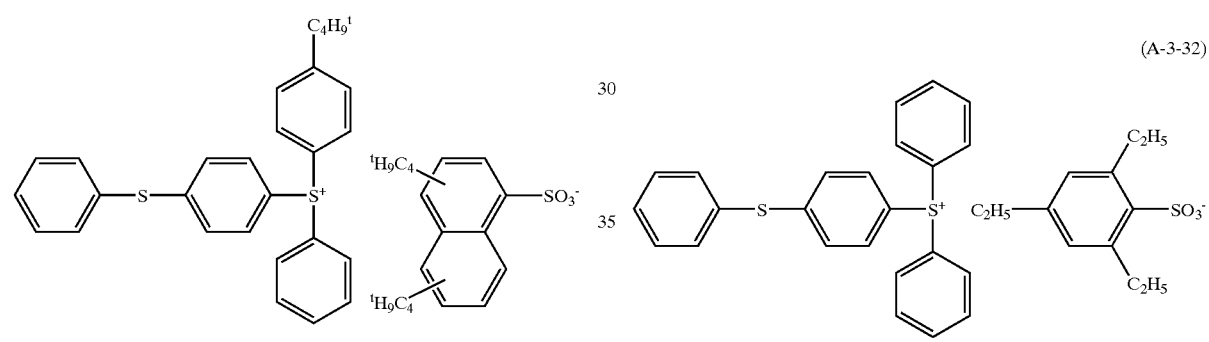
(A-3-28)
(A-3-33)
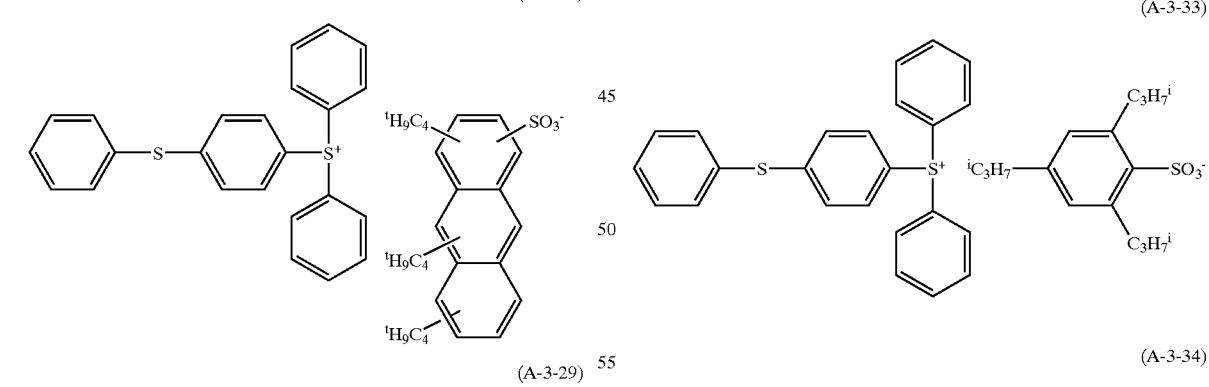
(A-3-29)
(A-3-34)
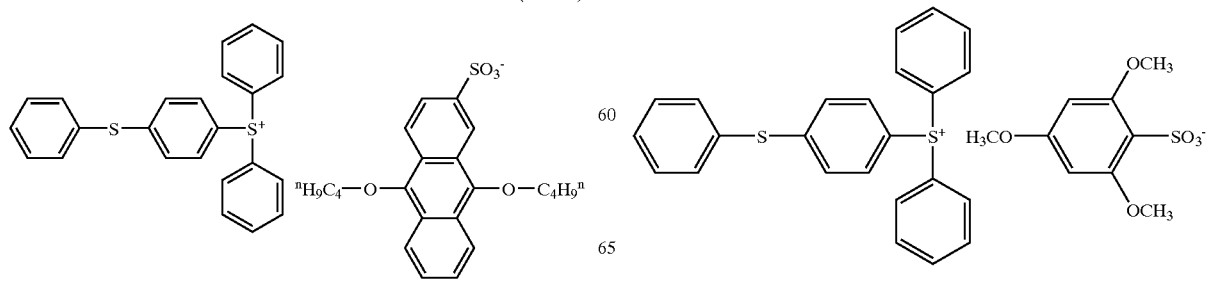

-continued (A-3-35)

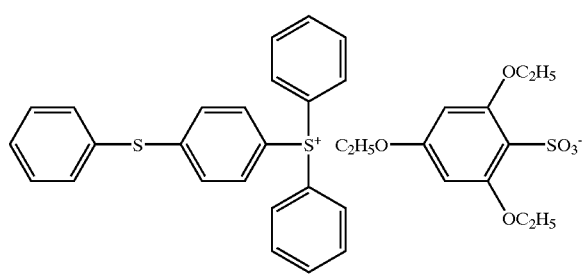

In these specific examples, "n", "s", "t" and "i" indicate "linear", "secondary", "tertiary" and "branched", respectively.

The compounds represented by formula (A-1) to (A-3) may be synthesized, for example, by salt-exchanging a corresponding Cl⁻ salt (a compound resulting from replacing $X^-$ by $Cl^-$ in formulae (A-1) to (A-3)) and a compound represented by $X^-Y^+$ (wherein $X^-$ has the same meaning as in formulae (A-1) to (A-3), and $Y^+$ represents a cation such as $H^+$, $Na^+$, $K^+$, $NH_4^+$ and $N(CH_3)_4^+$) in an aqueous solution.

Photo-acid Generators Represented by Formulae (A-4) and (A-5)

Specific examples of the alkyl group, the cycloalkyl group, the alkoxy group and the halogen atom represented by any one of $R_{11}$ to $R_{13}$ and $R_{14}$ to $R_{16}$ in formulae (A-4) and (A-5) are the same as those described above for $R_1$ to $R_5$. $R_6$ and $X^-$ have the same meanings as defined above.

When l, m and n each is 2 or 3, two out of the two or three $R_{11}$, $R_{12}$, $R_{13}$, $R_{14}$, $R_{15}$ or $R_{16}$ groups may be combined with each other to form a ring consisting of from 5 to 8 elements, including a carbocyclic, heterocyclic or aromatic ring.

Specific examples (A-4-1) to (A-4-28) of the compound represented by formula (A-4) and specific examples (A-5-1) to (A-5-30) of the compound represented by formula (A-5) are set forth below, however, the present invention is by no means limited thereto.

(A-4-1)

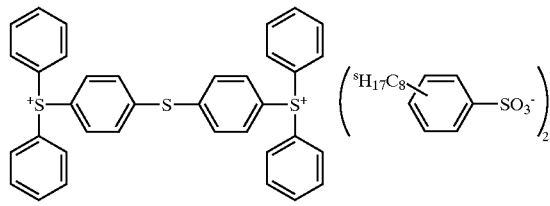

(A-4-2)

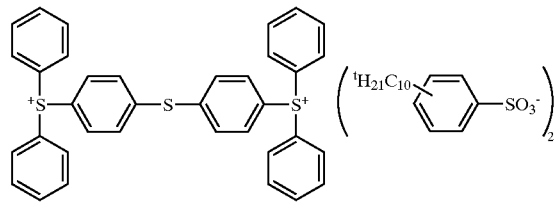

(A-4-3)

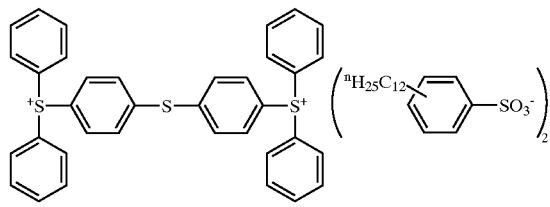

(A-4-4)

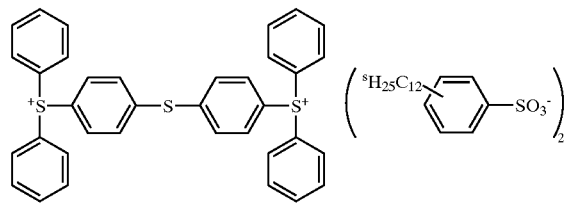

(A-4-5)

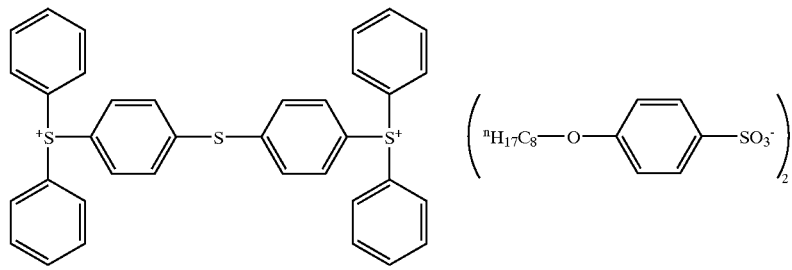

(A-4-6)

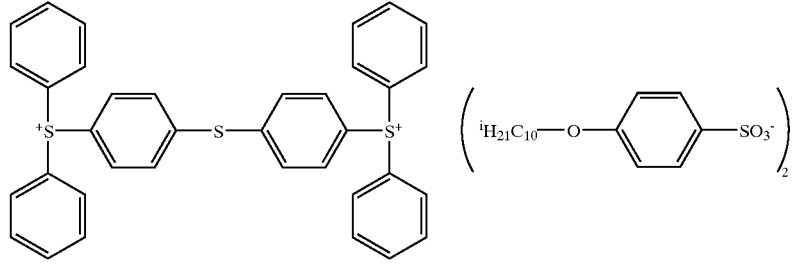

(A-4-7)
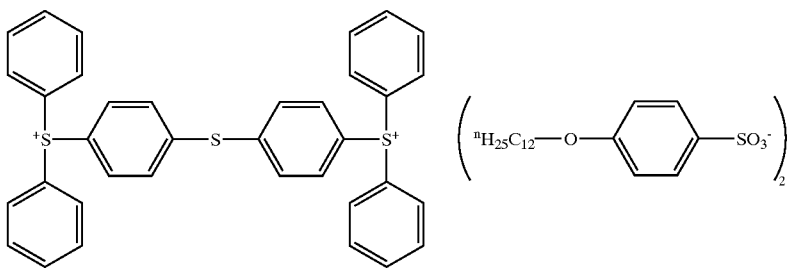
(A-4-8)
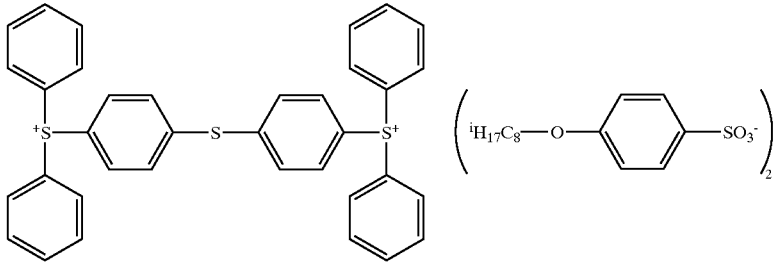
(A-4-9)
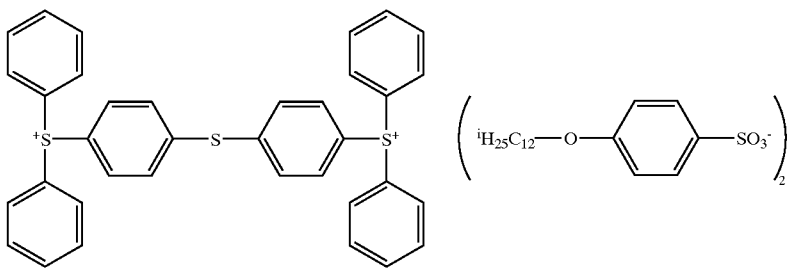
(A-4-10) (A-4-11)
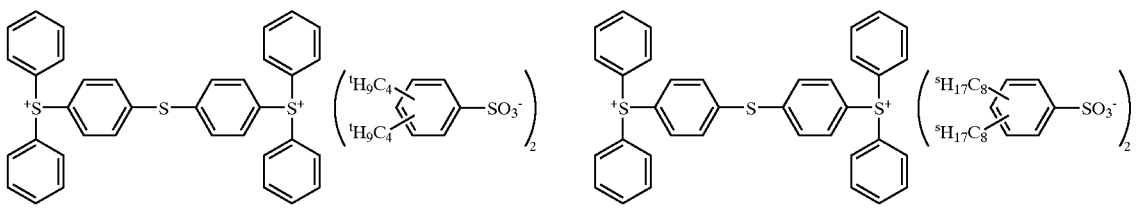
(A-4-12)
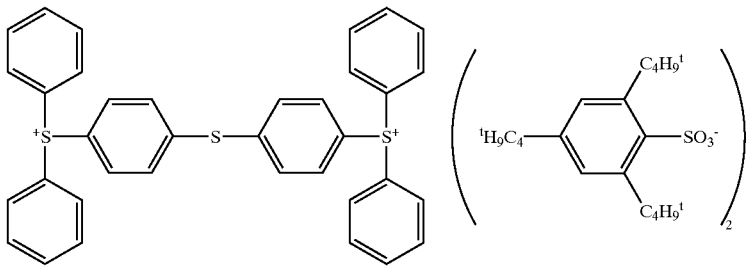
(A-4-13)
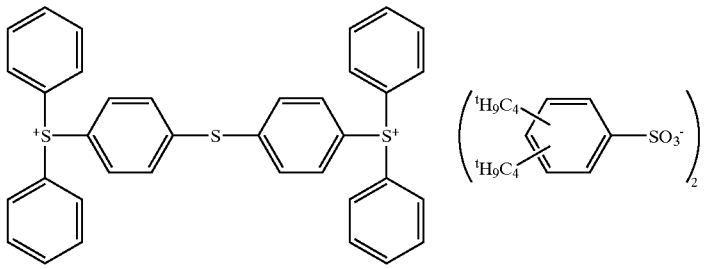

(A-4-14)
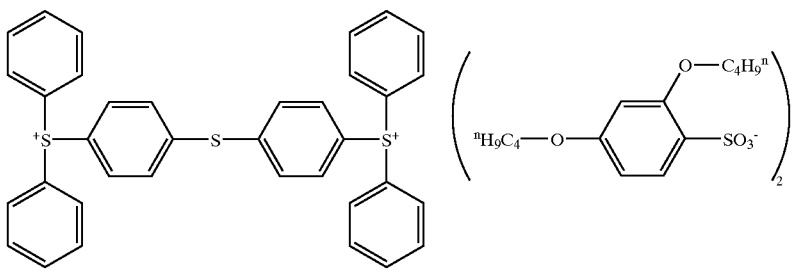
(A-4-15) (A-4-16)
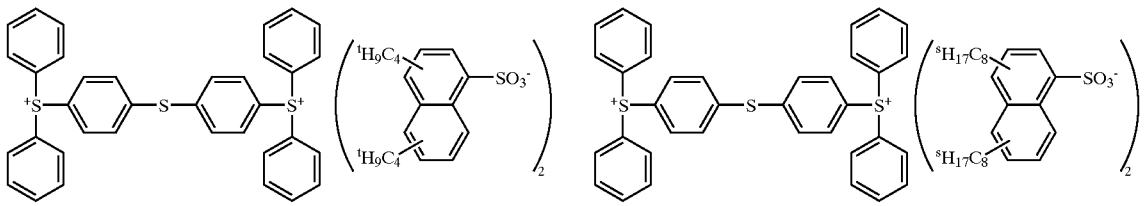
(A-4-17)
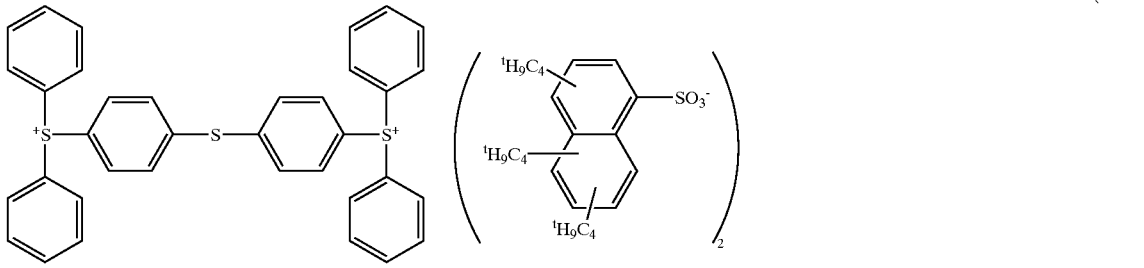
(A-4-18)
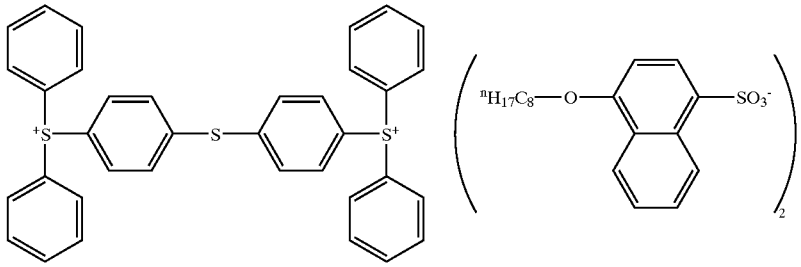
(A-4-19)
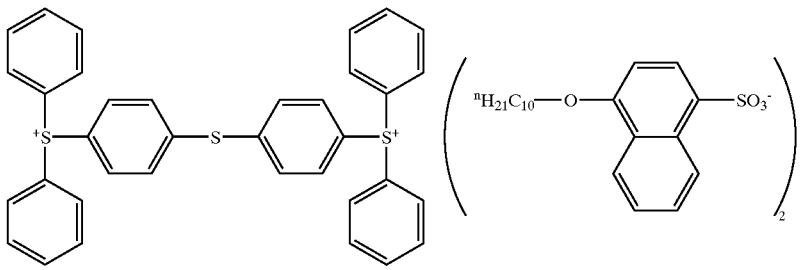
(A-4-20)
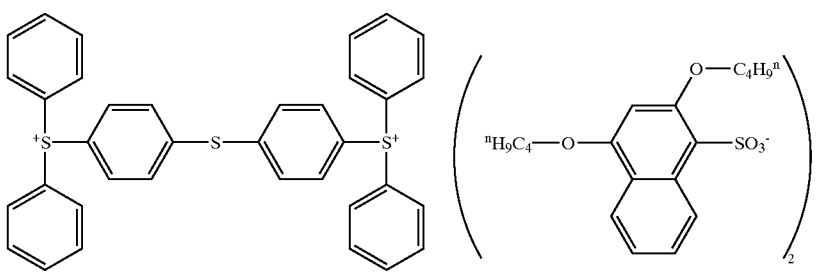

-continued
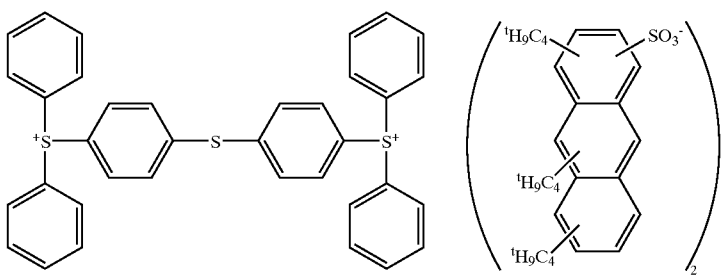
(A-4-21)
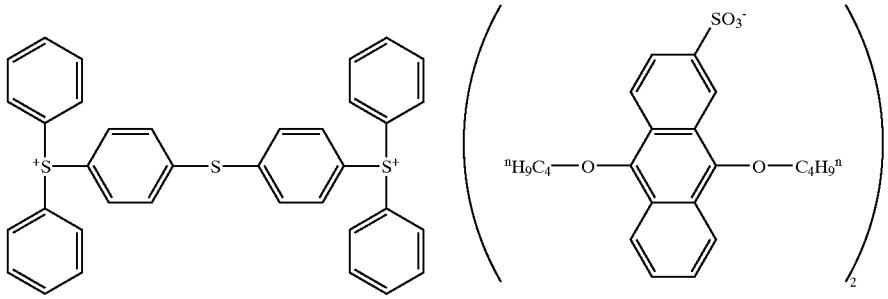
(A-4-22)
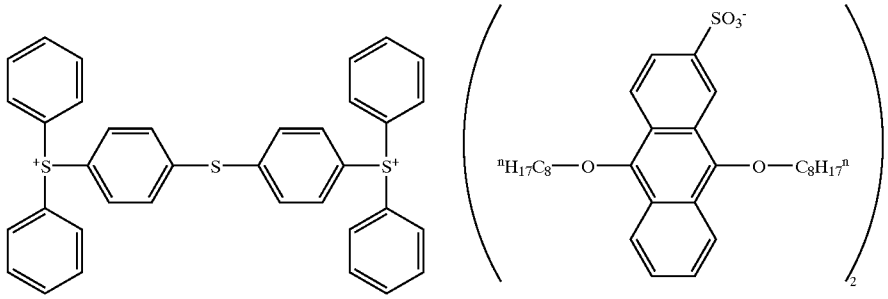
(A-4-23)
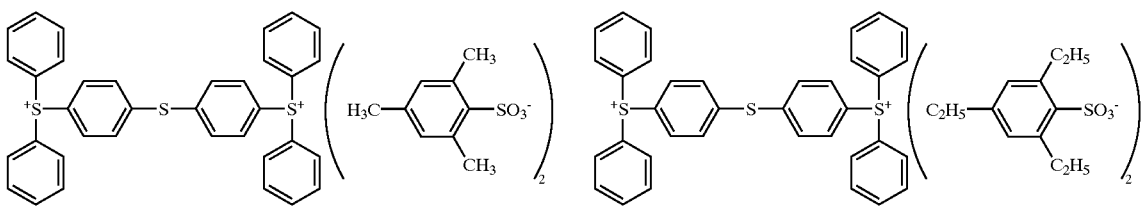
(A-4-24) (A-4-25)
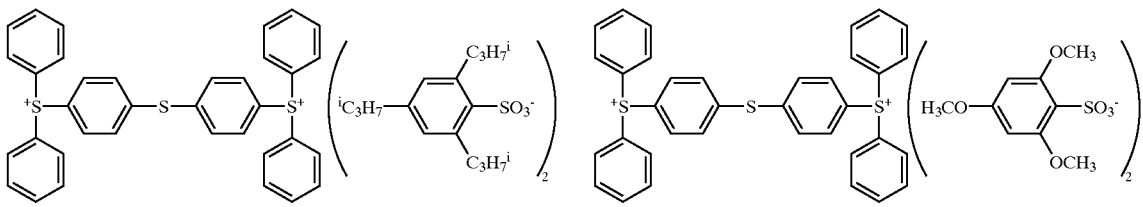
(A-4-26) (A-4-27)
(A-4-28)
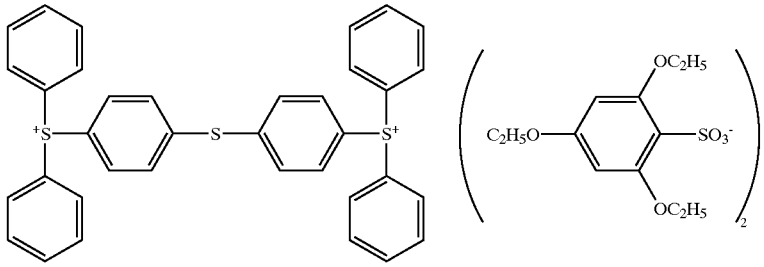

-continued
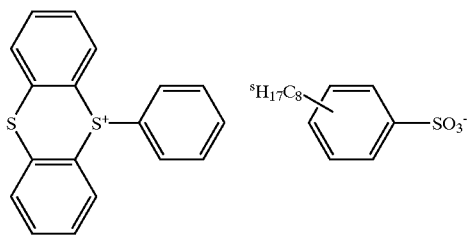 (A-5-1)
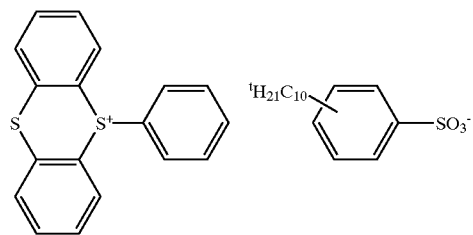 (A-5-2)
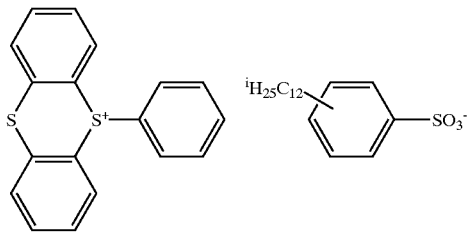 (A-5-3)
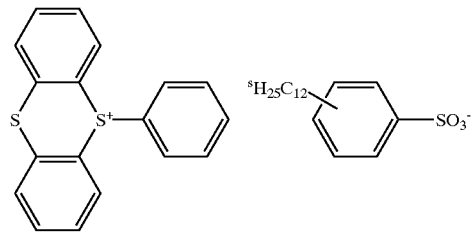 (A-5-4)
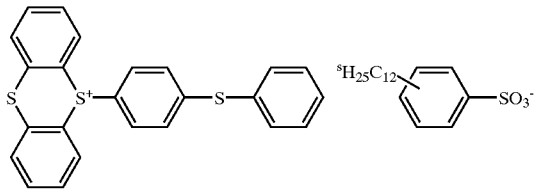 (A-5-5)
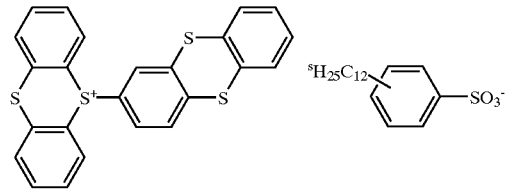 (A-5-6)
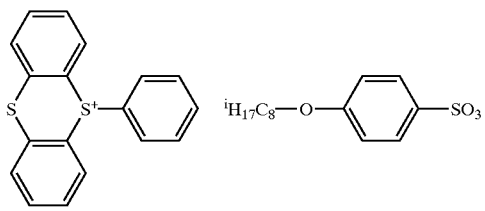 (A-5-7)
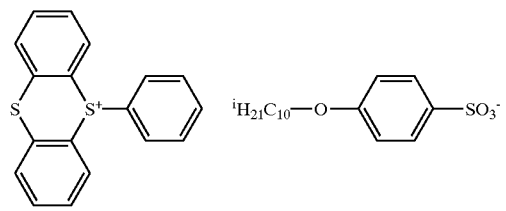 (A-5-8)
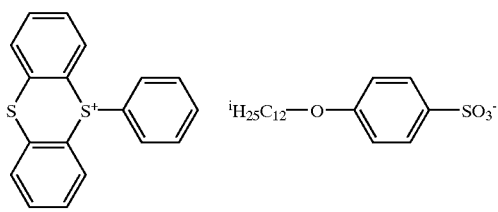 (A-5-9)
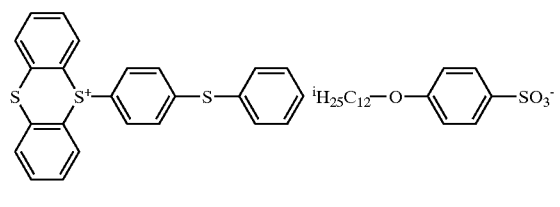 (A-5-10)
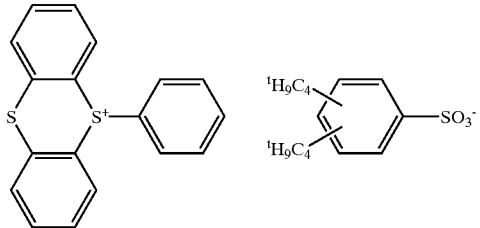 (A-5-11)
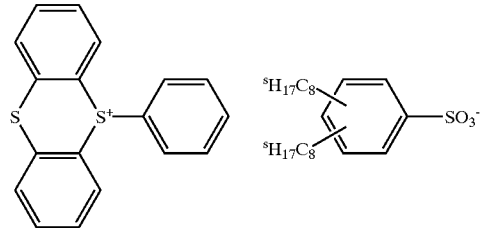 (A-5-12)

-continued
(A-5-13)
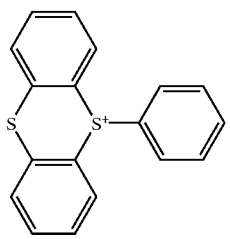 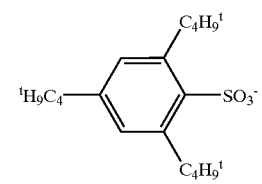
(A-5-14)
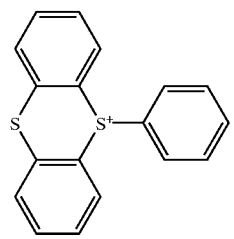
(A-5-15)
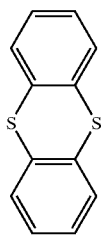 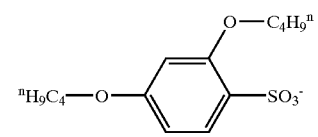
(A-5-16)
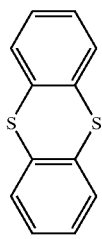 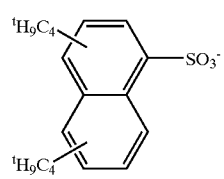
(A-5-17)
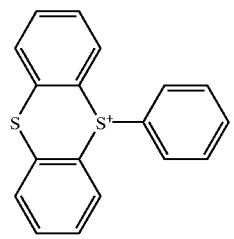 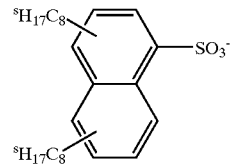
(A-5-18)
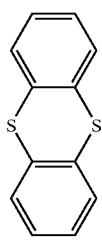 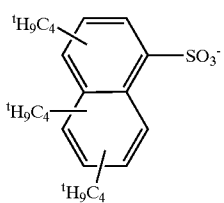
(A-5-19)
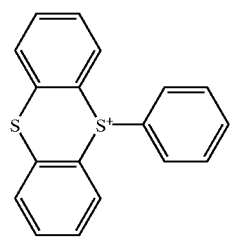 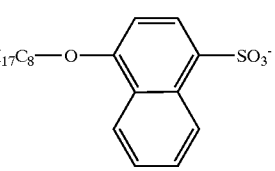
(A-5-20)
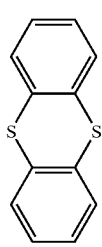 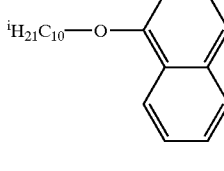
(A-5-21)
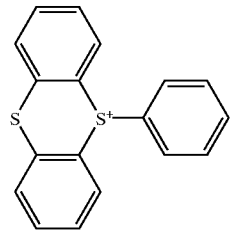 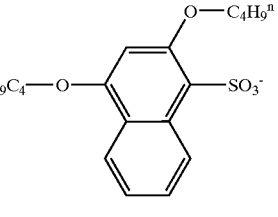
(A-5-22)
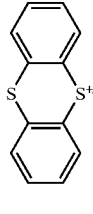 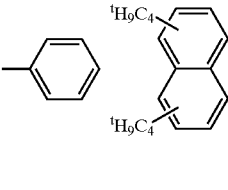
(A-5-23)
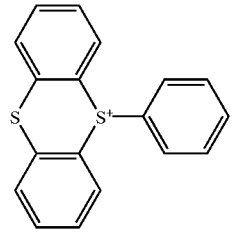 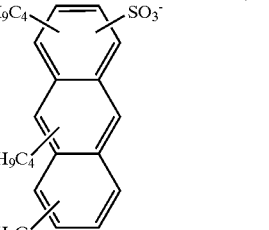

(A-5-24) 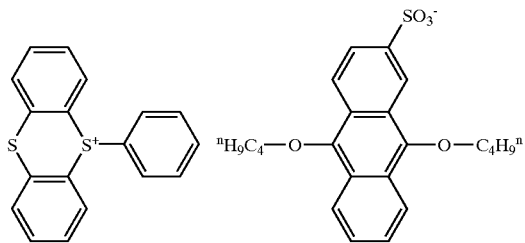

(A-5-25) 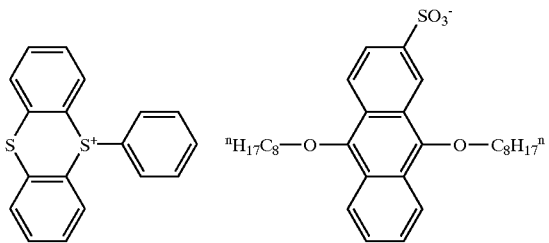

(A-5-26) 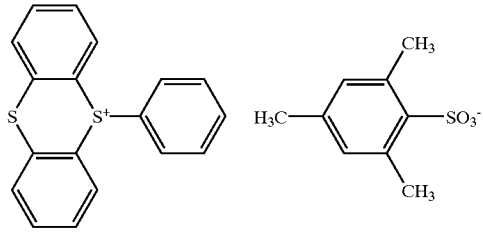

(A-5-27) 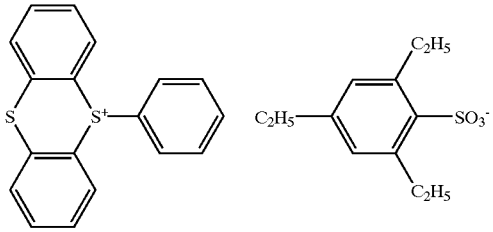

(A-5-28) 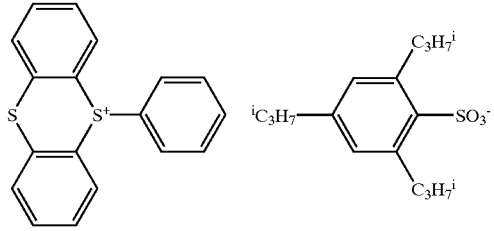

(A-5-29) 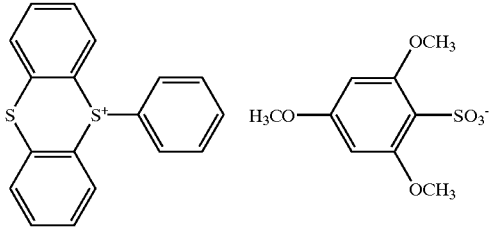

(A-5-30) 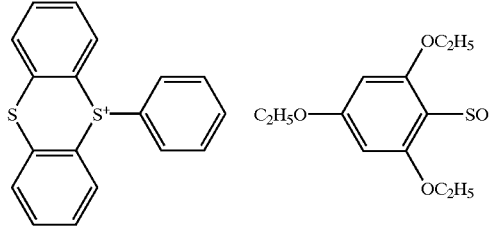

In these specific examples, "n", "s", "t" and "i" indicate "linear", "secondary", "tertiary" and "branched", respectively.

The compounds represented by formulae (A-4) and (A-5) may be synthesized, for example, by salt-exchanging a corresponding Cl⁻ salt (a compound resulting from replacing X⁻ by Cl⁻ in formulae (A-4) and (A-5)) and a compound represented by X⁻Y⁺ (wherein X⁻ has the same meaning as in formulae (A-4) and (A-5), and Y⁺ represents a cation such as $H^+$, $Na^+$, $K^+$, $NH_4^+$ and $N(CH_3)_4^+$) in an aqueous solution.

Photo-acid Generators Represented by Formula (A-6)

Examples of the linear, branched or cyclic alkyl group represented by any one of Y and $R_{31}$ to $R_{51}$ in formula (A-6) include a linear or branched alkyl group having from 1 to 20 carbon atoms, such as methyl group, ethyl group, propyl group, isopropyl group, n-butyl group, sec-butyl group, t-butyl group, hexyl group and octyl group, and a cyclic alkyl group such as cyclopropyl group, cyclopentyl group and cyclohexyl group. The substituent of the alkyl group is preferably an alkoxy group, an acyl group, an acyloxy group, chlorine atom, bromine atom or iodine atom.

Examples of the aralkyl group represented by Y include an aralkyl group having from 7 to 12 carbon atoms, such as benzyl group and phenethyl group. The substituent for the aralkyl group is preferably a lower alkyl group having from 1 to 4 carbon atoms, a lower alkoxy group having from 1 to 4 carbon atoms, a nitro group, an acetylamino group or a halogen atom.

Examples of the alkoxy group represented by any one of $R_{31}$ to $R_{51}$ include an alkoxy group having from 1 to 20 carbon atoms, such as methoxy group, ethoxy group, propoxy group, isopropoxy group, n-butoxy group, isobutoxy group, sec-butoxy group, t-butoxy group, octyloxy group and dodecyloxy group, and an alkoxy group having a substituent such as ethoxyethoxy group. Examples of the acyl group include an acetyl group, a propionyl group and a benzoyl group. Examples of the acylamino group include an acetylamino group, a propionylamino group and a benzoylamino group. Examples of the sulfonylamino group include a sulfonylamino group having from 1 to 4 carbon atoms, such as methanesulfonylamino group and ethanesulfonylamino group, and a substituted or unsubstituted benzenesulfonylamino group such as p-toluenesulfonylamino group. Examples of the aryl group include a phenyl group, a tolyl group and a naphthyl group. Examples of the alkoxycarbonyl group include an alkoxycarbonyl group having from 2 to 20 carbon atoms, such as methoxycarbonyl group, ethoxycarbonyl group, ethoxyethoxycarbonyl group, octyloxycarbonyl group and dodecyloxycarbonyl group.

Examples of the acyloxy group include an acyloxy group having from 2 to 20 carbon atoms, such as acetoxy group, propanoyloxy group, octanoyloxy group and benzoyloxy group.

Examples of the aralkyl group include an aralkyl group having from 7 to 15 carbon atoms, such as substituted or unsubstituted benzyl group and substituted or unsubstituted phenethyl group. Preferred examples of the substituent for the aralkyl group are the same as those described above.

In the substituents $R_{31}$ to $R_{51}$, two substituents in respective groups of $R_{31}$ to $R_{35}$, $R_{36}$ to $R_{42}$, and $R_{43}$ to $R_{51}$ may combine to form a 5-, 6-, 7- or 8-membered ring consisting of carbon and/or hetero atoms. Examples of the 5- to 8-membered ring include cyclohexane, pyridine, furan and pyrrolidine.

X and Y each may be bonded to another imido sulfonate compound residue or may form a dimer or trimer. Examples of the another imido sulfonate include compounds represented by formula (A-6) in which X or Y is a monovalent group.

Examples of the alkylene group represented by X include a linear or branched alkylene group having from 1 to 10 carbon atoms, and a monocyclic or polycyclic alkylene group which may contain a hetero atom. Examples of the linear or branched alkylene group include a methylene group, an ethylene group, a propylene group and an octylene group. The substituent for the alkylene group is preferably an alkoxy group, an acyl group, a formyl group, a nitro group, an acylamino group, a sulfonylamino group, a halogen atom, an aryl group or an alkoxycarbonyl group. These alkoxy group, acyl group, nitro group, acylamino group, sulfonylamino group, aryl group and alkoxycarbonyl group have the same meanings as those described for $R_{31}$ to $R_{51}$. Examples of the halogen atom include fluorine atom, chlorine atom, bromine atom and iodine atom.

Examples of the cyclic alkylene group include a monocyclic cycloalkylene group having from 4 to 8 carbon atoms, such as cyclopentylene group and cyclohexylene group, and a polycyclic cycloalkylene group having from 5 to 15 carbon atoms, such as 7-oxabicyclo[2,2,1]heptylene. The substituent for the cycloalkylene group is preferably an alkyl group having from 1 to 4 carbon atoms, an alkoxy group, an acyl group, a formyl group, a nitro group, an acylamino group, a sulfonylamino group, a halogen atom, an aryl group or an alkoxycarbonyl group. These alkoxy group, acyl group, nitro group, acylamino group, sulfonylamino group, aryl group and alkoxycarbonyl group have the same meanings as those described for $R_{31}$ to $R_{51}$. Examples of the halogen atom include fluorine atom, chlorine atom, bromine atom and iodine atom.

Examples of the arylene group include a phenylene group and a naphthylene group. The substituent for the arylene group is preferably an alkyl group, a cycloalkyl group, an alkoxy group, an acyl group, a formyl group, a nitro group, an acylamino group, a sulfonylamino group, a halogen atom, an aryl group or an alkoxycarbonyl group. These alkyl group, cycloalkyl group, alkoxy group, acyl group, formyl group, nitro group, acylamino group, sulfonylamino group, aryl group and alkoxycarbonyl group have the same meanings as those described for $R_{31}$ to $R_{51}$. Examples of the halogen atom include fluorine atom, chlorine atom, bromine atom and iodine atom.

Examples of the alkenylene group include an alkenylene group having from 2 to 4 carbon atoms, such as ethenylene group and butenylene group. The substituent for the alkenylene group is preferably an alkyl group, a cycloalkyl group, an alkoxy group, an acyl group, a formyl group, a nitro group, an acylamino group, a sulfonylamino group, a halogen atom, an aryl group or an alkoxycarbonyl group. These alkyl group, cycloalkyl group, alkoxy group, acyl group, formyl group, nitro group, acylamino group, sulfonylamino group, aryl group and alkoxycarbonyl group have the same meanings as those described for $R_{31}$ to $R_{51}$. Examples of the halogen atom include fluorine atom, chlorine atom, bromine atom and iodine atom.

Examples of the cyclic alkenylene group include a monocyclic cycloalkenylene group having from 4 to 8 carbon atoms, such as cyclopentenylene group and cyclohexenylene group, and a polycyclic cycloalkenylene group having from 5 to 15 carbon atoms, such as 7-oxabicyclo[2,2,1]heptenylene and norbornenylene.

Examples of the aralkylene group include a tolylene group and xylylene group. Examples of the substituent thereof include the substituents described for the arylene group.

Specific examples (A-6-1) to (A-6-49) of the compound represented by formula (A-6) are set forth below, however, the present invention is by no means limited thereto.

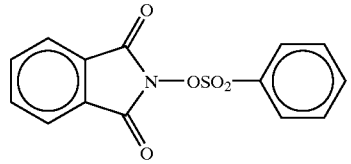
(A-6-1)

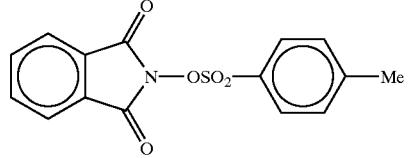
(A-6-2)

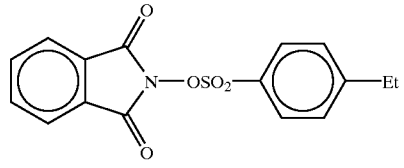
(A-6-3)

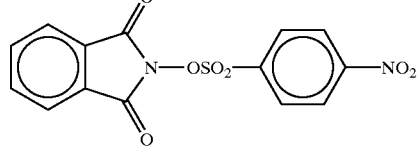
(A-6-4)

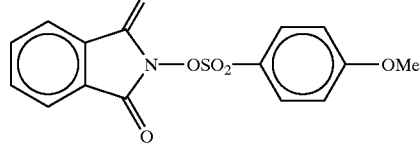
(A-6-5)

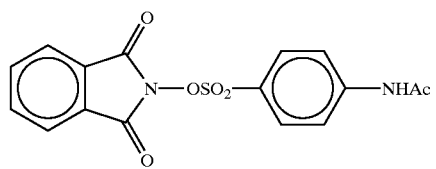 (A-6-6)
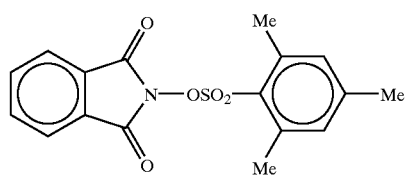 (A-6-7)
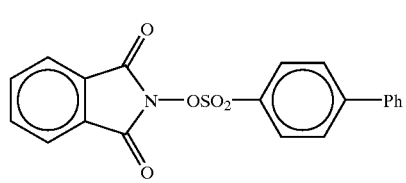 (A-6-8)
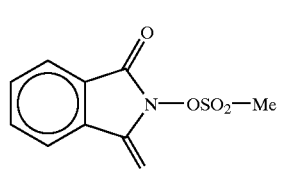 (A-6-9)
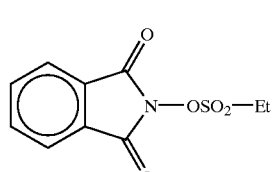 (A-6-10)
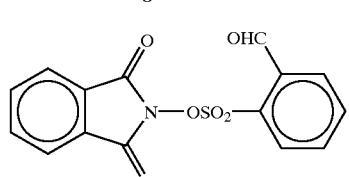 (A-6-11)
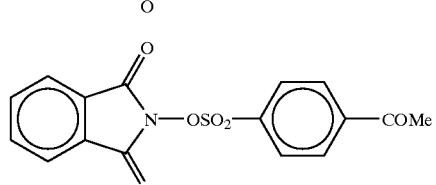 (A-6-12)
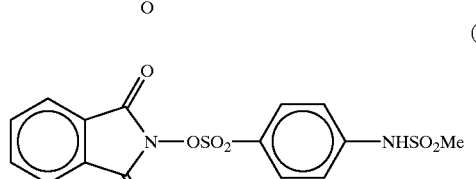 (A-6-13)
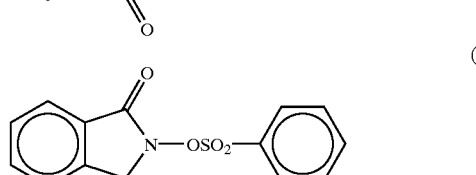 (A-6-14)
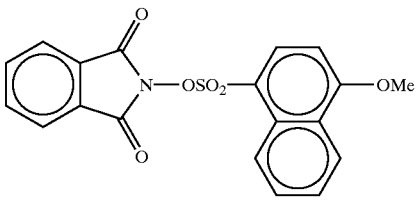 (A-6-15)
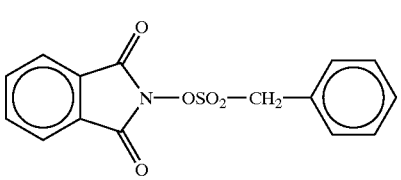 (A-6-16)
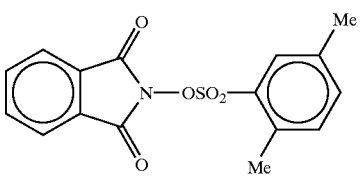 (A-6-17)
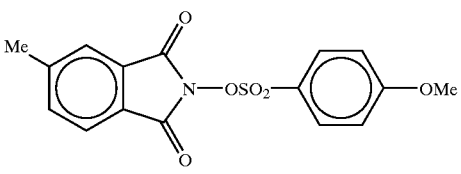 (A-6-18)
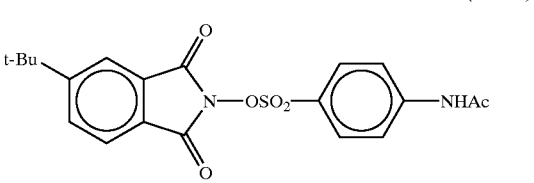 (A-6-19)
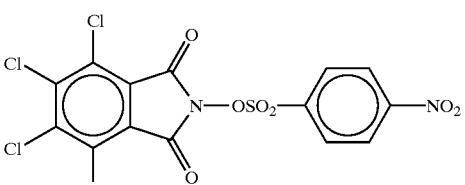 (A-6-20)
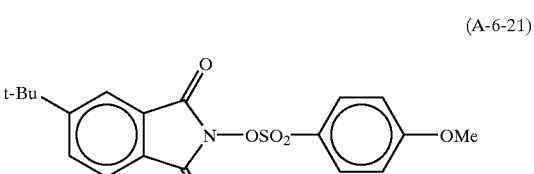 (A-6-21)
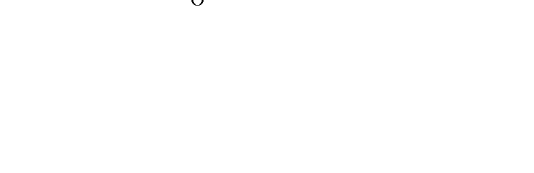 (A-6-22)

-continued

-continued

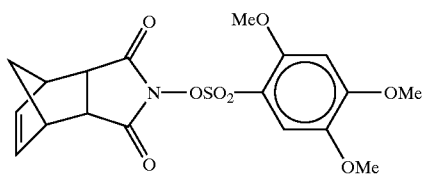 (A-6-41)

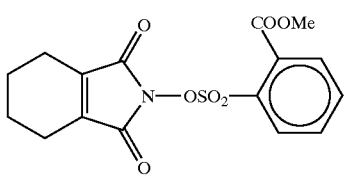 (A-6-42)

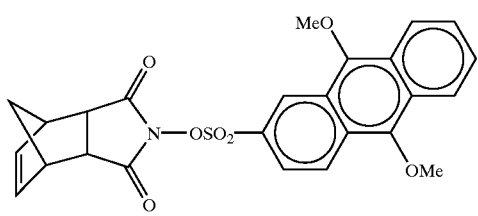 (A-6-43)

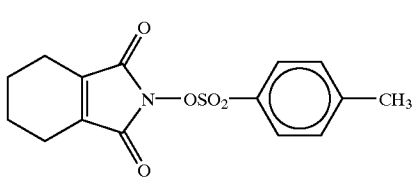 (A-6-44)

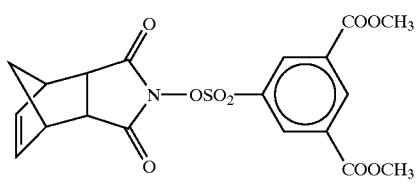 (A-6-45)

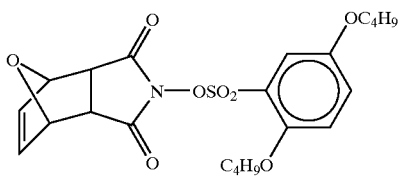 (A-6-46)

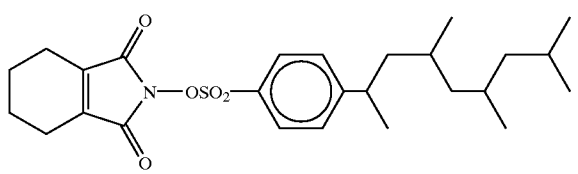 (A-6-47)

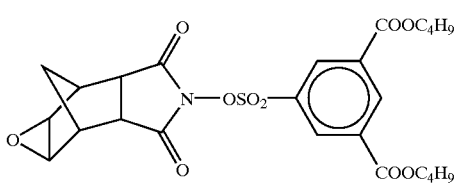 (A-6-48)

-continued

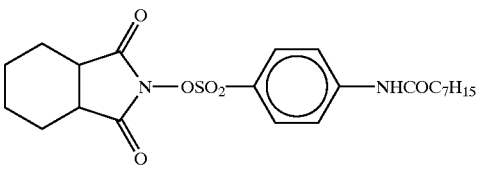 (A-6-49)

The compound represented by formula (A-6) can be synthesized from a N-hydroxyimide compound prepared by the method described in G. F. Jaubert, *Ber.*, 28, 360 (1895), the method described in D. E. Ames et al., *J. Chem. Soc.*, 3518 (1955) or the method described in M. A. Stolberg et al., *J. Am. Chem. Soc.*, 79, 2615 (1957), and sulfonic acid chloride under basic conditions according to the method described, for example, in L. Bauer et al., *J. Org. Chem.*, 24, 1294 (1959).

Photo-acid Generator Represented by Formula (A-7)

In formula (A-7), $Ar_1$ and $Ar_2$ each independently represents a substituted or unsubstituted aryl group.

Examples of the aryl group include a phenyl group, a tolyl group, a naphthyl group. The substituent for the aryl group is an alkyl group, a cycloalkyl group, an alkoxy group, an acyl group, a formyl group, a nitro group, an acylamino group, a sulfonylamino group, a halogen atom, an aryl group or an alkoxycarbonyl group. These alkyl group, cycloalkyl group, alkoxy group, acyl group, formyl group, nitro group, acylamino group, sulfonylamino group, aryl group and alkoxycarbonyl group have the same meanings as those described for $R_{31}$ to $R_{51}$. Examples of the halogen atom include fluorine atom, chlorine atom, bromine atom and iodine atom.

Specific examples of the photo-acid generator represented by formula (A-7) are set forth below as Compounds (A-7-1) to (A-7-14), however, the present invention is by no means limited thereto.

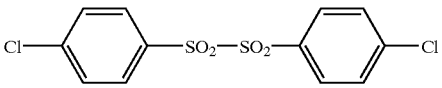 (A-7-1)

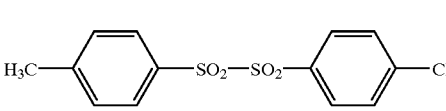 (A-7-2)

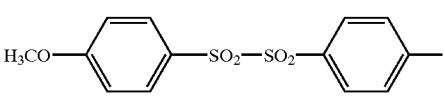 (A-7-3)

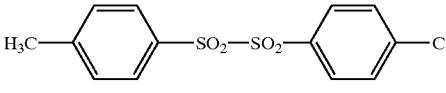 (A-7-4)

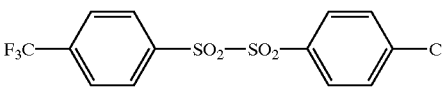 (A-7-5)

-continued

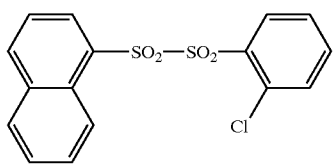
(A-7-6)

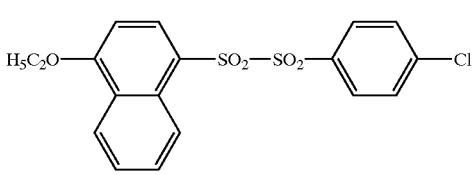
(A-7-7)

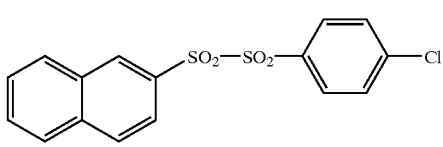
(A-7-8)

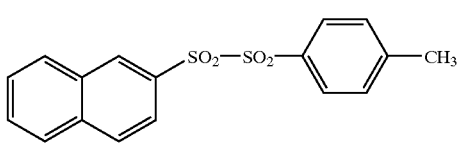
(A-7-9)

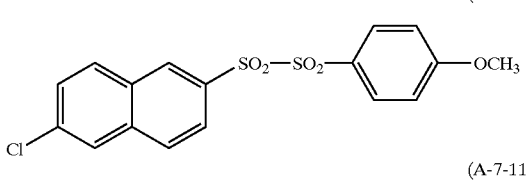
(A-7-10)

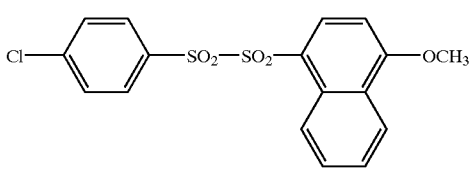
(A-7-11)

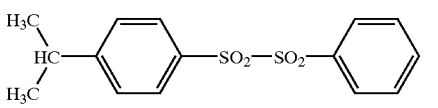
(A-7-12)

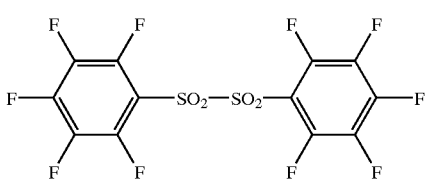
(A-7-13)

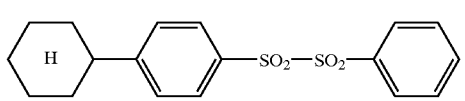
(A-7-14)

The photo-acid generator represented by formula (A-7) may be synthesized by the method described in G. C. Denser, Jr. et al., *Journal of Organic Chemistry*, 31, 3418–3419 (1966), the method described in T. P. Hilditch, *Journal of the Chemical Society*, 93, 1524–1527 (1908) or the method described in O. Hinsberg, *Berichte der Deutschen Chemischen Gesellscahft*, 49, 2593–2594 (1918). More specifically, a method of synthesizing a sulfinic acid represented by formula (a) using cobalt sulfate in an aqueous sulfuric acid solution, a method of synthesizing a sulfonic acid chloride represented by formula (b) using ethyl xanthate, or a method of synthesizing a sulfinic acid represented by formula (a) and a sulfonic acid chloride represented by formula (b) under basic conditions can be used:

$$Ar_1—SO_2H \quad (a)$$
$$Ar_2—SO_2Cl \quad (b)$$

(wherein $Ar_1$ and $Ar_2$ have the same meanings as those defined in formula (A-7)).

In the present invention, among the photo-acid generators represented by formulae (A-1) to (A-7), photo-acid generators represented by formulae (A-1) to (A-5) are preferred, and photo-acid generators represented by formulae (A-1) to (A-4) are more preferred. By using these, more excellent resolution and sensitivity can be attained.

The content of the compound represented by any one of formulae (A-1) to (A-7) in the composition is preferably from 0.1 to 20 wt %, more preferably from 0.5 to 10 wt %, still more preferably from 1 to 7 wt %, based-on the solid content of the entire composition.

In the composition of the present invention, an organic basic compound may be used. By using this compound, the storage stability is more improved and the line width change due to PED is advantageously more reduced.

Preferred examples of the organic basic compound which can be used in the present invention include compounds having basicity higher than that of phenol. In particular, nitrogen-containing basic compounds are preferred.

Examples of the preferred chemical environment include the structures represented by formulae (A) to (E):

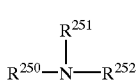
(A)

(wherein $R^{250}$, $R^{251}$ and $R^{252}$, which may be the same or different, each represents a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbon atoms, provided that $R^{251}$ and $R^{252}$ may be combined with each other to form a ring);

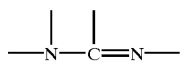
(B)

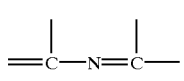
(C)

(D)

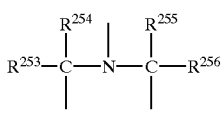
(E)

(wherein $R^{253}$, $R^{254}$, $R^{255}$ and $R^{256}$, which may be the same or different, each represents an alkyl group having from 1 to 6 carbon atoms).

More preferred compounds are a nitrogen-containing cyclic compound (also referred to as "cyclic amine compound") and a nitrogen-containing basic compound having two or more nitrogen atoms different in the chemical environment within one molecule.

The cyclic amine compound preferably has a polycyclic structure. Specific preferred examples of the cyclic amine compound include the compound represented by the following formula (F):

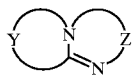

(F)

wherein Y and Z each independently represents a linear, branched or cyclic alkylene group which may contain a hetero atom or may-be substituted.

Examples of the hetero atom include nitrogen atom, sulfur atom and oxygen atom. The alkylene group is preferably an alkylene group having from 2 to 10 carbon atoms, more preferably from 2 to 5 carbon atoms. Examples of the substituent for the alkylene group include an alkyl group having from 1 to 6 carbon atoms, an aryl group or an alkenyl group having from 1 to 6 carbon atoms, a halogen atom and a halogen-substituted alkyl group. Furthermore, specific examples of the compound represented by formula (F) include the compounds shown below:

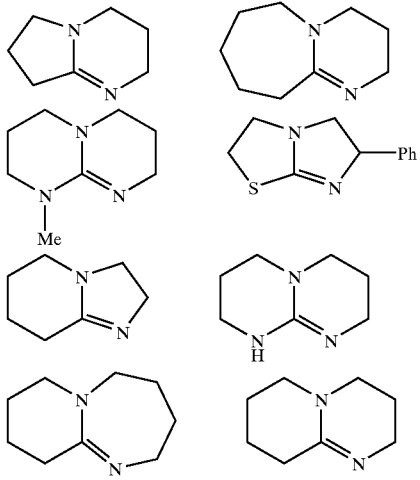

Among these, 1,8-diazabicyclo[5,4,0]undeca-7-ene and 1,5-diazabicyclo[4,3,0]nona-5-ene are more preferred.

The nitrogen-containing basic compound having two or more nitrogen atoms different in the chemical environment, within one molecule is more preferably a compound having both a ring structure containing a nitrogen atom and a substituted or unsubstituted amino group or a compound having an alkylamino group. Specific preferred examples of the compound include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine and a substituted or unsubstituted aminoalkylmorpholine. The substituent is preferably an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group or a cyano group.

Among those compounds, more preferred are guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpipridine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, trimethylimidazole, and triphenylimidazole and methyldiphenylimidazole. However, the present invention is by no means limited thereto.

These nitrogen-containing basic compounds are used either individually or in combination of two or more thereof. The amount of the nitrogen-containing basic compound used is usually from 0.001 to 10 parts by weight, preferably from 0.01 to 5 parts by weight, per 100 parts by weight of the photosensitive resin composition (exclusive of solvent). If the amount used is less than 0.001 part by weight, the above-described effect cannot be obtained, whereas if it exceeds 10 parts by weight, reduction in sensitivity or deterioration in developability of the unexposed area is liable to result.

The chemical amplification-type positive resist composition of the present invention may further contain, if desired, a surfactant, a dye, a pigment, a plasticizer, a photosensitizer, a compound having two or more phenolic OH groups capable of accelerating solubility in developer and the like.

The photosensitive resin composition of the present invention preferably contains a surfactant. Specific examples thereof include nonionic surfactants, for example, polyoxyethylene alkyl ethers such as polyoxyethylene lauryl ether, polyoxyethylene stearyl ether, polyoxyethylene cetyl ether and polyoxyethylene oleyl ether, polyoxyethylene alkylaryl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; fluorine surfactants such as Eftop EF 301, EF 303, EF 352 (produced by Shin Akita Kasei K.K.), Megafac F171, F173, F176, F189, R0B (produced by Dai-Nippon Ink & Chemicals, Inc.), FLORAD FC430, FC431 (produced by Sumitomo 3M K.K.), Asahiguard AG 710, SURFLON S-382, SC101, SC102, SC103, SC104, SC105 and SD106 (produced by Asahi Glass Co., Ltd.); and organosiloxane polymer KP341 (produced by Shin-Etsu Chemical Co., Ltd.), acrylic acid-base or methacrylic acid-base (co)polymer POLYFLOW No. 75, No. 95 (produced by Kyoeisha Yushi Kagaku Kogyo K.K.) and TOROYSOL S-366 (produced by Toroy Chemical K.K.).

Among these surfactants, fluorine or silicon surfactants are preferred in view of coatability and reduction in development defect.

The amount of the surfactant is usually from 0.01 to 2 wt %, preferably from 0.01 to 1 wt %, based on all the solid content of the composition of the present invention.

These surfactants may be used individually or in combination of two or more thereof.

Furthermore, a spectral sensitizer described below may be added to sensitize the composition in the wavelength region longer than far ultraviolet, where the photo-acid generator used has no absorption, so that the chemical amplification-type positive resist of the present invention can have sensitivity to the i- or g-line. Specific examples of suitable spectral sensitizers include benzophenone, p,p'-tetramethyldiaminobenzophenone, p,p'-tetraethylethylaminobenzophenone, 2-chlorothioxantone, anthrone, 9-ethoxyanthracene, anthracene, pyrene, perylene, phenothiazine, benzyl, acridine orange, benzoflavin, cetoflavin-T, 9,10-diphenylanthracene, 9-fluorenone, acetophenone, phenanthrene 2-nitrofluorenone, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthrquinone, 3-methyl-1,3-diaza-1,9-benzanthrone, dibenzalacetone, 1,2-naphthoquinone, 3,3'-carbonyl-bis(5,7-dimethoxycarbonylcoumarin) and coronene. However, the present invention is by no means limited thereto.

Examples of the compound having two or more phenolic OH groups capable of accelerating solubility in a developer include polyhydroxy compounds. Preferred examples of the polyhydroxy compound include phenols, resorcinol, phloroglucin, phloroglucide, 2,3,4-trihydroxybenzophenone, 2,3,4,4'-tetrahydroxybenzophenone, α,α',α"-tris(4-hydroxyphenyl)-1,3,5-triisopropylbenzene, tris(4-hydroxyphenyl)methane, tris(4-hydroxyphenyl)ethane and 1,1'-bis(4-hydroxyphenyl) cyclohexane.

The chemical amplification-type positive photoresist composition of the present invention is coated on a support after dissolving it in a solvent which can dissolve the above-described components. Examples of the solvent which can be used include ethylenedichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxy propionate, ethyl ethoxy propionate, methyl pyruvate, ethyl pyruvate, propyl pyruvate, N,N-dimethylformamide, dimethylsulfoxide, N-methylpyrrolidone and tetrahydrofuran. These solvents are used individually or in combination.

The chemical amplification-type positive resist composition is coated on a substrate (e.g., silicon/silicon dioxide coating) as used in the production of a precision integrated circuit device by an appropriate coating method such as spinner or coater, exposed through a predetermined mask and then developed by baking, so that a good resist pattern can be obtained.

Examples of the developer for the chemical amplification-type positive resist composition of the present invention include an aqueous solution alkalis, for example, inorganic alkalis such as sodium hydroxide, potassium hydroxide, sodium carbonate, sodium silicate, sodium phosphate, sodium metasilicate and aqueous ammonia, primary amines such as ethylamine and n-propylamine, secondary amines such as diethylamine and di-n-butylamine, tertiary amines such as triethylamine and methyldiethylamine, alcohola-mines such as dimethylethanolamine and triethanolamine, amides such as formamide and acetamide, quaternary ammonium salts such as tetramethylammonium hydroxide, trimethyl(2-hydroxyethyl)ammonium hydroxide, tetraethy-lammonium hydroxide, tributylmethylammonium hydroxide, tetraethanolammonium hydroxide, methyltri-ethanolammonium hydroxide, benzylmethyldiethanolam-monium hydroxide, benzyldimethylethanolammonium hydroxide, benzyltriethanolammonium hydroxide, tetrapro-pylammonium hydroxide and tetrabutylammonium hydroxide, and cyclic amines such as pyrrole and piperidine.

EXAMPLES

The present invention is described in greater detail below, however, the present invention should not be construed as being limited thereto.

Resin, Photoacid Generator, Organic Base, Surfactant Used in Examples

In the synthesis of the resin of the present invention, the acetalization can be performed by either a method using vinyl ether or an acetal exchange method using an alcohol and alkyl vinyl ether.

Synthesis Example I-1

Synthesis of Vinyl Ether

Ethyl vinyl ether was mixed in phenethyl alcohol and mercury acetate was added thereto. The mixture was stirred at room temperature for 12 hours and extracted and washed with ethyl acetate and water. The extract was distilled under reduced pressure to obtain the objective Phenethyl Vinyl Ether (X-1).

Synthesis Example I-2

Synthesis of Vinyl Ether

Ethyl vinyl ether was mixed in phenethyl alcohol and palladium-1,10-phenanthroline complex was mixed therewith. The mixture was stirred at room temperature for 20 hours and extracted and washed with ethyl acetate and water. The extract was distilled under reduced pressure to obtain the objective Phenethyl Vinyl Ether (X-1).

Synthesis Example I-3

Synthesis of Vinyl Ether

2-Chloroethyl vinyl ether was added to a THF solution of phenylmagnesium bromide or phenyl lithium. The mixture was heated under reflux for 16 hours and extracted and washed with ethyl acetate and water. The extract was distilled under reduced pressure to obtain the objective Phenethyl Vinyl Ether (X-1).

Synthesis Examples I-4 to I-10

Vinyl Ethers (X-2) to (X-6) were obtained by appropriately selecting the same method as in Synthesis Example I-1.

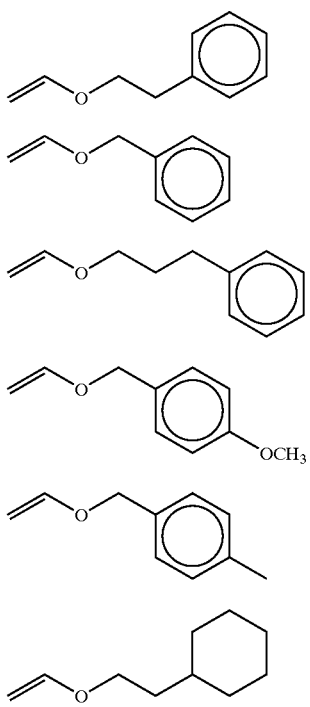

X-1
X-2
X-3
X-4
X-5
X-6

Synthesis Example II-1

32.4 g (0.2 mol) of p-acetoxystyrene was dissolved in 120 ml of butyl acetate and thereto, 0.033 g of azobisisobutyronitrile (AIBN) was added at 80° C. while stirring in a nitrogen stream 3 times every 2.5 hours. The stirring was further continued for 5 hours to perform the polymerization reaction. The reaction solution was charged into 1,200 ml of hexane and white resin was precipitated. The resin obtained was dried and then dissolved in 150 ml of methanol and thereto, an aqueous solution of 7.7 g (0.19 mol) of sodium hydroxide/50 ml of water was added. The mixed solution was heated under reflux for 3 hours to perform the hydrolysis, then diluted by adding 200 ml of water, and neutralized with hydrochloric acid to precipitate white resin. This resin was separated by filtration, washed with water, and dried. The resulting resin was dissolved in 200 ml of tetrahydrofuran. The resulting solution was added dropwise to 5 L of ultrapure water while vigorously stirring to reprecipitate the resin. This reprecipitation operation was repeated 3 times and the resin obtained was dried in a vacuum dryer at 120° C. for 12 hours to obtain poly(p-hydoxystyrene) Alkali-Soluble Resin R-1.

This resin had a weight average molecular weight of 15,000.

Synthesis Example II-2

35.25 g (0.2 mol) of p-tert-butoxystyrene monomer dehydrated and distillation-purified by an ordinary method and 5.21 g (0.05 mol) of t-Bu styrene monomer were dissolved in 100 ml of tetrahydrofuran. To the resulting solution, 0.033 g of azobisisobutyronitrile (AIBN) was added at 80° C. while stirring in a nitrogen stream 3 times every 2.5 hours. The stirring was further continued for 5 hours to perform the polymerization reaction. The reaction solution was charged into 1,200 ml of hexane to thereby precipitate a white resin. The resin obtained was dried and then dissolved in 150 ml of tetrahydrofuran.

After adding 4 N hydrochloric acid thereto, the mixed solution was heated under reflux for 6 hours to perform the hydrolysis and then reprecipitated in 5 L of ultrapure water. The resin precipitated was separated by filtration, washed with water, and dried. The resulting resin was dissolved in 200 ml of tetrahydrofuran. The resulting solution was added dropwise to 5 L of ultrapure water while vigorously stirring to reprecipitate the resin. This reprecipitation operation was repeated 3 times and the resin obtained was dried in a vacuum dryer at 120° C. for 12 hours to obtain poly(p-hydoxystyrene/t-butylstyrene) copolymer Alkali-Soluble Resin R-2.

This resin had a weight average molecular weight of 12,000.

Synthesis Example II-3

Poly(p-hydroxystyrene) (VP8000) produced by Nippon Soda K.K. was used as Alkali-Soluble Resin R-3. This resin had a weight average molecular weight of 9,800.

Synthesis Example III-1

| | |
|---|---|
| Alkali-Soluble Resin R-3 recited in Synthesis Example II-3 | 20 g |
| Propylene glycol monomethyl ether acetate (PGMEA) | 80 ml |

These were dissolved in a flask and distilled under reduced pressure to remove water and PGMEA by azeotropic distillation.

After confirming that the water content was satisfactorily reduced, 7.0 g of Vinyl Ether X-1 obtained in Synthesis Example I-1 and 50 mg of p-toluenesulfonic acid were added and stirred at room temperature for 1 hour, and then triethylamine was added thereto to terminate the reaction.

To the reaction solution, ethyl acetate was added and after further washing with water, ethyl acetate, water and azeotropic PGMEA were removed by distillation under reduced pressure to obtain Alkali-Soluble Resin B-1 having the speciic substituent according to the present invention. The resin obtained had a weight average molecular weight of 11,000.

Synthesis Example III-2

| | |
|---|---|
| Alkali-Soluble Resin R-3 obtained in Synthesis Example II-3 | 20 g |
| Propylene glycol monomethyl ether acetate (PGMEA) | 80 ml |

These were dissolved in a flask and distilled under reduced pressure to remove water and PGMEA by azeotropic distillation.

After confirming that the water content was satisfactorily reduced, 7.0 g of phenethyl alcohol, 6.5 g of t-butyl vinyl ether and 50 mg of p-toluenesulfonic acid were added and stirred at room temperature for 1 hour, and then triethylamine was added thereto to terminate the reaction.

To the reaction solution, ethyl acetate was added and after further washing with water, ethyl acetate, water and azeotropic PGMEA were removed by distillation under reduced pressure to obtain Alkali-Soluble Resin B-1 having a substituent according to the present invention. The resin obtained had a weight average molecular weight of 11,000.

Synthesis of Resins B-2 to B-24

Similarly, Resins B-2 to B-12, which are resins having the substituent specified according to the present invention, were prepared by using the alkali-soluble resins and vinyl ethers as indicated in Table 1 below. Furthermore, Alkali-soluble Resins B-13 to B-24 were prepared by synthesizing resins using the alkali-soluble resins and vinyl ethers as indicated in Table 1, and adding 1.5 g of pyridine and 1.5 g of acetic acid anhydride thereto and stirring the contents at room temperature for 1 hour.

TABLE 1

| Resin | Vinyl Ether Used | Backbone Polymer | Acid Anhydride Used |
|---|---|---|---|
| B-1 | X-1 | R-3 | none |
| B-2 | X-2 | R-3 | none |
| B-3 | X-3 | R-3 | none |
| B-4 | X-4 | R-3 | none |
| B-5 | X-5 | R-3 | none |
| B-6 | X-6 | R-3 | none |
| B-7 | X-1 | R-2 | none |
| B-8 | X-2 | R-2 | none |
| B-9 | X-3 | R-2 | none |
| B-10 | X-4 | R-2 | none |
| B-11 | X-5 | R-2 | none |
| B-12 | X-6 | R-2 | none |
| B-13 | X-1 | R-3 | acetic acid anhydride |
| B-14 | X-2 | R-3 | acetic acid anhydride |
| B-15 | X-3 | R-3 | acetic acid anhydride |
| B-16 | X-4 | R-3 | acetic acid anhydride |
| B-17 | X-5 | R-3 | acetic acid anhydride |
| B-18 | X-6 | R-3 | acetic acid anhydride |
| B-19 | X-1 | R-1 | acetic acid anhydride |
| B-20 | X-2 | R-1 | acetic acid anhydride |
| B-21 | X-3 | R-1 | acetic acid anhydride |
| B-22 | X-4 | R-1 | acetic acid anhydride |
| B-23 | X-5 | R-1 | acetic acid anhydride |
| B-24 | X-6 | R-1 | acetic acid anhydride |

Furthermore, Resins B-2 to B-24 were also prepared from the corresponding alcohol and t-butylvinyl ether by means of the above-described acetal exchange method.

Synthesis Example IV-1

Resin C-1 was obtained using the alkali-soluble resin shown in Table 2 and Ethyl Vinyl Ether (Y-1) shown below.

TABLE 2

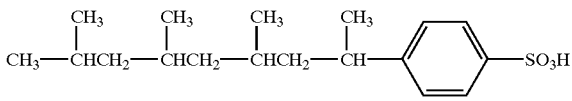

| Resin | Vinyl Ether Used | Backbone Polymer |
|---|---|---|
| C-1 | Y-1 | R-3 |

Poly(p-1-benzloxy-1-methylethoxystyrene/p-hydroxystyrene/p-tert-butoxystyrene) described in JP-A-8-123032 was used as Resin C-2.

Synthesis Example V-1

Synthesis of D-1

19.9 g (0.030 mol) of an aqueous solution of a mixture containing commercially available triarylsulfonium Cl salt (50% aqueous solution of triphenylsulfonium chloride, produced by Fluka), triphenylsulfonium, 4,4'-bis(diphenylsulfonio)diphenylsulfide and the like was dissolved in 200 ml of ion exchanged water. To the resulting solution, 400 ml of an ion exchanged water solution containing 10.5 g (0.030 mol) of Na salt of hard-type (branched) dodecylbenzenesulfonic acid having a structure shown below was added at room temperature while stirring.

$$CH_3-\underset{CH_3}{\overset{CH_3}{C}}HCH_2-\underset{CH_3}{\overset{CH_3}{C}}HCH_2-\underset{CH_3}{\overset{CH_3}{C}}HCH_2-\underset{CH_3}{\overset{CH_3}{C}}H-\phantom{x}-SO_3H$$

The viscous solid precipitated was separated by decantation and washed with 1 L of ion exchanged water.

The viscous solid obtained was dissolved in 100 ml of acetone and then charged into 500 ml of ion exchanged water while stirring to recrystallize it. The precipitate was dried at 50° C. under vacuum, and as a result, 15.5 g of vitrified solid was obtained. By the NMR measurement, this solid was identified as the objective Photo-acid generator (D-1) as a mixture mainly containing:

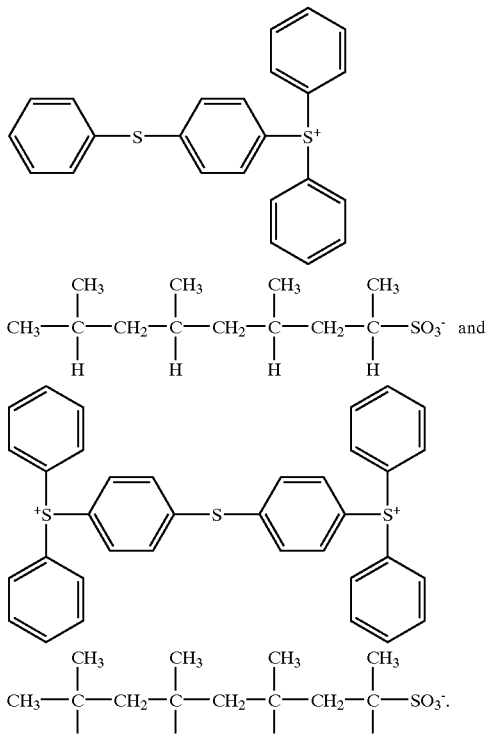

Synthesis Example V-2

Synthesis of D-2 (A-1-56 Exemplified Above)

68 g (0.174 mol) of triphenylsulfonium iodide and 42.5 g (0.183 mol) of silver oxide were dissolved in 500 ml of methanol and stirred at room temperature for 5 hours. Subsequently, insoluble matters were separated by filtration and 59.4 g (0.209 mol) of triisopropylbenzenesulfonic acid was added. The resulting solution was stirred at room temperature for 3 hours and concentrated into powder. This powder was washed with water and recrystallized with ethyl acetate/acetone=6/4 to obtain 50 g of the objective Photo-acid generator (D-2). The structure was identified by NMR.

Synthesis Example V-3

Synthesis of D-3 (A-1-63 Exemplified Above 7 g of phosphorus pentoxide and 70 g of methanesulfonic acid were mixed while stirring, dissolved and then stirred at room temperature. Thereto, 25 g (0.124 mol) of diphenyl sulfoxide and 20.4 g (0.136 mol) of n-butoxybenzene were added while stirring and stirred at 50° C. for 4 hours. The reaction solution obtained was poured into 500 ml of ice water, washed twice with 150 ml of toluene and rendered to be alkalescent by tetramethylammonium hydroxide, thereby obtaining an aqueous solution of butoxyphenyldiphenylsulfoniummethane sulfonate.

Thereto, 1,000 ml of ethyl acetate was added and stirred, and further a solution obtained by adding butanol to 26 g (0.14 mol) of 2-sulfobenzoic acid cyclic anhydride was added and stirred. The resulting solution was separated into organic phase and aqueous phase by washing it twice with 500 ml of 10% aqueous tetramethylammonium hydroxide solution, and then further washed 3 times with water. The organic phase was dried and concentrated to obtain the objective Photo-acid generator (D-3).

Synthesis Example V-4

Synthesis of D-4 (A-2-57 Exemplified Above
1) Synthesis of Tetramethylammonium Pentafluorobenzene Sulfonate 25 g of pentafluorobenzenesulfonyl chloride was dissolved in 100 ml of methanol under ice cooling and thereto, 100 g of a 25% aqueous tetramethylammonium hydroxide solution was gradually added. The resulting solution was stirred at room temperature for 3 hours, then, a solution of tetramethylammonium pentafluorobenzene sulfonate was obtained. This solution was used for the salt exchange with sulfonium salt or iodonium salt. 2) Synthesis of Di(4-t-Amylphenyl)iodonium Pentafluorobenzene Sulfonate (D-4)

60 g of t-amylbenzene, 39.5 g of potassium iodate, 81 g of acetic acid anhydride and 170 ml of dichloromethane were mixed and thereto, 66.8 g of concentrated sulfuric acid was gradually added dropwise under ice cooling. The mixed solution was stirred for 2 hours under ice cooling and then stirred at room temperature for 10 hours, and to the reaction solution, 500 ml of water was added under ice cooling. The resulting solution was extracted with dichloromethane and the organic phase was washed with sodium hydrogencarbonate and water and then concentrated, then, di(4-t-amylphenyl)iodonium sulfate was obtained. This sulfate was added to a solution containing an excess amount of tetramethylammonium pentafluorobenzene sulfonate. After adding 500 ml of water thereto, the solution was extracted with dichloromethane, and the organic phase was washed with 5% aqueous tetramethylammonium hydroxide solution and water and then concentrated to thereby obtain di(4-t-amylphenyl)iodonium pentafluorobenzene sulfonate (D-4).

Synthesis Example V-5

Synthesis of D-5 (A-1-60 Exemplified Above 50 g of diphenyl sulfoxide was dissolved in 800 ml of benzene and thereto, 200 g of aluminum chloride was added and refluxed for 24 hours. The reaction solution was gradually poured into 2 L of ice and thereto, 400 ml of concentrated hydrochloric acid was added and heated at 70° C. for 10 minutes. This aqueous solution was washed with 500 ml of ethyl acetate and filtered. Thus, a solution obtained by dissolving 200 g of ammonium iodide was added thereto. The powder precipitated was collected by filtration, washed with water, washed with ethyl acetate and then dried. Thus, 70 g of triphenylsulfonium iodide was obtained.

30.5 g of triphenylsulfonium iodide was dissolved in 1,000 ml of methanol and to this solution, 19.1 g of silver oxide was added and stirred at room temperature for 4 hours. The resulting solution was filtered and thereto, a solution containing an excess amount of tetramethylammonium pentafluorobenzene sulfonate was added. The reaction solution was concentrated and dissolved in 500 ml of dichloromethane and the resulting solution was washed with a 5% aqueous tetramethylammonium hydroxide solution and water. The organic phase was dried with anhydrous sodium sulfate and then concentrated. As a result, triphenylsulfonium pentafluorobenzene sulfonate (D-5) was obtained.

Synthesis Example V-6

Synthesis of D-6

50 g of triarylsulfonium chloride (50% aqueous solution of triphenylsulfonium chloride, produced by Fluka) was dissolved in 500 ml of water and a solution containing an excess amount of tetramethylammonium pentafluorobenzene sulfonate was added thereto, whereby an oily substance was precipitated. The supernatant was removed by decantation and the oily substance obtained was washed with water and dried to thereby obtain triarylsulfonium pentafluorobenzene sulfonate (D-6) as a mixture mainly containing:

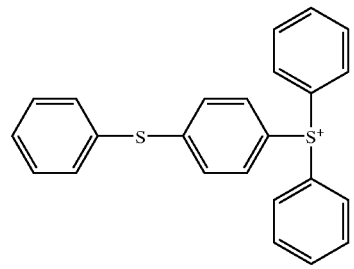

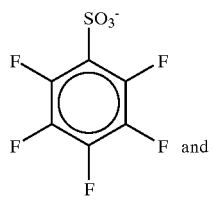

and

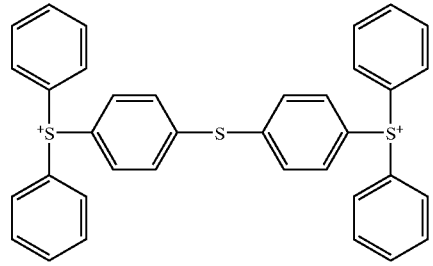

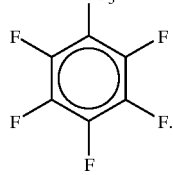

As Photo-acid generator D-7, 1-diazo-1-methylsulfonyl-4-phenylbutan-2-one described in JP-A-8-123032 was used.

Organic bases used had the following structure (E-1), (E-2) or (E-3).

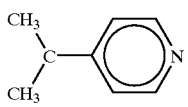
(E-1)

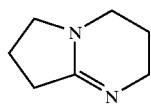
(E-2)

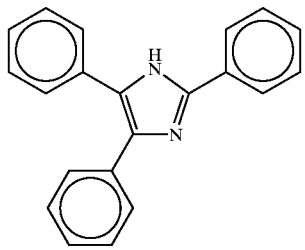
(E-3)

As Surfactant (F-1), Megafac ROB (produced by Dai-Nippon Ink & Chemicals, Inc.) was used.

As Surfactant (F-2), TOROYSOL S-366 (produced by Toroy Chemical K.K.) was used.

Examples 1 to 22 and
Comparative Examples 1 to 3

Preparation and Evaluation of Photosensitive Composition

Respective materials shown in Table 3 were dissolved in 8 g of PGMEA (propylene glycol monoethyl ether acetate) and passed through a 0.2-$\mu$m filter to prepare resist solutions. The content of the surfactant was 0.0035 g. Each resist solution was coated on a silicon wafer by means of a spin coater and dried on a vacuum adsorption-type hot plate at 130° C. for 60 seconds to obtain a resist film having a thickness of 0.8 $\mu$m.

TABLE 3

| | Resin | [Composition Ratio of Resin] | Amount of Resin (g) | Photo-acid generator | Amount of Photo-acid generator (g) | Organic base | Amount of Organic Base (g) | Surfactant |
|---|---|---|---|---|---|---|---|---|
| Example 1 | B-1 | 20/10/70 | 2.0 | D-1 | 0.05 | E-2 | 0.001 | F-2 |
| Example 2 | B-2 | 1//10/72 | 2.0 | D-1 | 0.05 | E-2 | 0.001 | F-1 |
| Example 3 | B-3 | 20/10/70 | 2.0 | D-1 | 0.05 | E-3 | 0.001 | F-1 |
| Example 4 | B-4 | 20/10/70 | 2.0 | D-1 | 0.05 | E-2 | 0.001 | F-1 |
| Example 5 | B-5 | 18/10/72 | 2.0 | D-2 | 0.05 | E-1 | 0.001 | F-2 |
| Example 6 | B-6 | 20/10/70 | 2.0 | D-3 | 0.05 | E-2 | 0.001 | F-1 |
| Example 7 | B-1 | 15/7/78 | 2.0 | D-2/D-3 | 0.05 | E-2 | 0.001 | F-2 |
| Example 8 | B-2 | 15/7/78 | 2.0 | D-2/D-3 | 0.05 | E-2 | 0.001 | F-1 |
| Example 9 | B-3 | 15/7/78 | 2.0 | D-2/D-3 | 0.05 | E-2 | 0.001 | F-1 |
| Example 10 | B-4 | 17/7/25 | 2.0 | D-2/D-3 | 0.05 | E-2 | 0.001 | F-2 |
| Example 11 | B-5 | 17/7/25 | 2.0 | D-2/D-3 | 0.05 | E-2 | 0.001 | F-1 |
| Example 12 | B-6 | 15/7/78 | 2.0 | D-2/D-3 | 0.05 | E-2 | 0.001 | F-1 |
| Example 13 | B-1 | 18/10/72 | 2.0 | D-4 | 0.05 | E-2 | 0.001 | F-2 |
| Example 14 | B-2 | 18/10/72 | 2.0 | D-5 | 0.05 | E-2 | 0.001 | F-2 |
| Example 15 | B-3 | 20/10/70 | 2.0 | D-4 | 0.05 | E-3 | 0.001 | F-1 |
| Example 16 | B-4 | 20/10/70 | 2.0 | D-5 | 0.05 | E-2 | 0.001 | F-1 |
| Example 17 | B-5 | 18/10/72 | 2.0 | D-4 | 0.05 | E-2 | 0.001 | F-2/F-1 |
| Example 18 | B-6 | 18/10/72 | 2.0 | D-2/D-4 | 0.05 | E-2 | 0.001 | F-2/F-1 |
| Example 19 | B-6 | 18/10/72 | 2.0 | D-2/D-6 | 0.05 | E-2/E-3 | 0.001 | F-2 |
| Example 20 | B-6 | 18/10/72 | 2.0 | D-2/D-5 | 0.05 | E-2/E-3 | 0.001 | F-2 |
| Example 21 | B-6 | 18/10/72 | 2.0 | D-4/D-5 | 0.05 | E-3 | 0.001 | F-1 |
| Example 22 | B-6 | 18/10/72 | 2.0 | D-2/D-3 | 0.05 | E-1/E-2 | 0.001 | F-1 |
| [Example 23 | B-2 | 18/10/72 | 2.0 | D-6 | 0.05 | E-3 | 0.001 | F-1 |
| Example 24 | B-12 | 15/7/78 | 2.0 | D-1 | 0.05 | E-2 | 0.001 | F-1 |
| Example 25 | B-12 | 15/7/78 | 2.0 | D-3 | 0.05 | E-2 | 0.001 | F-2 |
| Example 26 | B-12 | 15/7/78 | 2.0 | D-4 | 0.05 | E-2 | 0.001 | F-2 |
| Example 27 | B-12 | 15/7/78 | 2.0 | D-5 | 0.05 | E-3 | 0.001 | F-1 |
| Example 28 | B-12 | 15/7/78 | 2.0 | D-6 | 0.05 | E-2 | 0.001 | F-1 |
| Example 29 | B-2 | 18/10/72 | 2.0 | D-2/D-3 | 0.05 | E-2 | 0.001 | F-2/F-1 |
| Example 30 | B-12 | 15/7/78 | 2.0 | D-2/D-3 | 0.05 | E-2 | 0.001 | F-2/F-1 |
| Example 31 | B-2 | 18/10/72 | 2.0 | D-2/D-3 | 0.05 | E-2/E-3 | 0.001 | F-2 |
| Example 32 | B-12 | 15/7/78 | 2.0 | D-2/D-3 | 0.05 | E-2/E-3 | 0.001 | F-2 |
| Example 33 | B-2 | 18/10/72 | 2.0 | D-2/D-3 | 0.05 | E-3 | 0.001 | F-1 |
| Example 34] | B-12 | 15/7/78 | 2.0 | D-2/D-3 | 0.05 | E-2/E-3 | 0.001 | F-1 |
| Comparative Example 1 | C-1 | 40/0/60 | 2.0 | D-2 | 0.05 | E-2 | 0.001 | — |
| Comparative Example 2 | C-2 | 30/10/60 | 2.0 | D-7 | 0.05 | E-2 | 0.001 | — |
| Comparative Example 3 | C-1 | 40/0/60 | 2.0 | D-7 | 0.05 | E-2 | 0.001 | — |

In Table 3, the weight ratio of D-2/D-3, D-2/D-4, D-2/D-6, D-2/D-5, and D-4/D-5 each was 50:50.

The weight ratio of F-2/F-1 used in Examples 17 and 18 was 50:50.

The weight ratio of E-2/E-3 used in Examples 19 and 20 was 60:40.

The weight ratio of E-1/E-2 used in Example 22 was 50:50. These ratios are the same as in Table 5.

Each resist film was exposed using a 248 nm KrF excimer laser stepper (NA=0.45). After the exposure, the silicon wafer having thereon a resist film was heated on a hot plate at 100° C. for 60 seconds, then immediately dipped in an aqueous solution of 0.26 N tetramethylammonium hydroxide (TMAH) for 60 seconds, rinsed with water for 30 seconds, and dried. The thus-obtained pattern on the silicon wafer was observed through a scanning electron microscope and evaluated on the resist performance. The results are shown in Table 4.

The resolution shows a threshold resolution at an exposure amount necessary for reproducing a mask patter of 0.30-$\mu$m line and space.

The resist patterns each was observed through optical microscope or SEM to evaluate the surface roughness. Very clean surface was rated "A", clean surface was rated "B" and rough surface was rated "C".

The development defect was evaluated by coating a resist solution on a 6-inch wafer and counting the number of smuts corresponding to the development defect. A very small number of development defects was rated "A", a small number was rated "B" and a large number was rated "C".

TABLE 4

|  | Sensitivity (mj/cm$^2$) | Resolution ($\mu$m) | Surface Roughness | Development Defect |
|---|---|---|---|---|
| Example 1 | 20 | 0.24 | A | A |
| Example 2 | 21 | 0.25 | A | A |
| Example 3 | 21 | 0.25 | A | A |
| Example 4 | 20 | 0.25 | A | A |
| Example 5 | 19 | 0.26 | A | A |
| Example 6 | 22 | 0.24 | A | A |
| Example 7 | 21 | 0.25 | A | A |

TABLE 4-continued

|  | Sensitivity (mj/cm$^2$) | Resolution ($\mu$m) | Surface Roughness | Development Defect |
|---|---|---|---|---|
| Example 8 | 21 | 0.24 | A | A |
| Example 9 | 21 | 0.25 | A | A |
| Example 10 | 22 | 0.24 | A | A |
| Example 11 | 22 | 0.24 | A | A |
| Example 12 | 23 | 0.24 | A | A |
| Example 13 | 19 | 0.24 | A | A |
| Example 14 | 19 | 0.25 | A | A |
| Example 15 | 20 | 0.25 | A | A |
| Example 16 | 21 | 0.25 | A | A |
| Example 17 | 20 | 0.24 | A | A |
| Example 18 | 21 | 0.25 | A | A |
| Example 19 | 22 | 0.24 | A | A |
| Example 20 | 22 | 0.24 | A | A |
| Example 21 | 21 | 0.25 | A | A |
| Example 22 | 22 | 0.24 | A | A |
| Comparative Example 1 | 20 | 0.28 | C | C |
| Comparative Example 2 | 22 | 0.29 | C | C |
| Comparative Example 3 | 28 | 0.28 | C | C |

As apparent from the results in Table 4, in the case of positive photoresist compositions of Examples according to the present invention, satisfactory results were obtained, whereas in the case of photoresist compositions of Comparative Examples, satisfactory results were not obtained particularly with respect to the resist surface roughness and the development defect.

Examples 23 to 56 and
Comparative Examples 4 to 6

Each resist liquid was prepared in the same manner as in Examples 1 to 22 except for preparing each resin having structural unit represented by formulae (I), (II) and (III) as indicated in Table 5 below to thereby provide a resist film having 0.8 $\mu$m.

The prepared resist films were evaluated in terms of sensitivity, resolution, surface roughness, and development defect, and the obtained results are shown in Table 6 below.

TABLE 5

|  | Resin | Composition Ratio of Resin | Amount of Resin (g) | Photo-acid generator | Amount of Photo-acid generator (g) | Organic base | Amount of Organic Base (g) | Surfactant |
|---|---|---|---|---|---|---|---|---|
| Example 23 | B-13 | 20/10/70 | 2.0 | D-1 | 0.05 | E-2 | 0.001 | F-2 |
| Example 24 | B-14 | 18/10/72 | 2.0 | D-1 | 0.05 | E-2 | 0.001 | F-1 |
| Example 25 | B-15 | 20/10/70 | 2.0 | D-1 | 0.05 | E-3 | 0.001 | F-1 |
| Example 26 | B-16 | 20/10/70 | 2.0 | D-1 | 0.05 | E-2 | 0.001 | F-1 |
| Example 27 | B-17 | 18/10/72 | 2.0 | D-2 | 0.05 | E-1 | 0.001 | F-2 |
| Example 28 | B-18 | 20/10/70 | 2.0 | D-3 | 0.05 | E-2 | 0.001 | F-1 |
| Example 29 | B-7 | 15/7/78 | 2.0 | D-1 | 0.05 | E-3 | 0.001 | F-1 |
| Example 30 | B-8 | 15/7/78 | 2.0 | D-2 | 0.05 | E-2/E-3 | 0.001 | F-2 |
| Example 31 | B-9 | 15/7/78 | 2.0 | D-2 | 0.05 | E-3 | 0.001 | F-1 |
| Example 32 | B-10 | 17/7/25 | 2.0 | D-3 | 0.05 | E-2/E-3 | 0.001 | F-1 |
| Example 33 | B-11 | 17/7/25 | 2.0 | D-1 | 0.05 | E-2 | 0.001 | F-1 |
| Example 34 | B-12 | 15/7/78 | 2.0 | D-2 | 0.05 | E-2/E-3 | 0.001 | F-1 |
| Example 35 | B-19 | 18/10/72 | 2.0 | D-3 | 0.05 | E-2 | 0.001 | F-2 |
| Example 36 | B-20 | 18/10/72 | 2.0 | D-1 | 0.05 | E-2 | 0.001 | F-1 |
| Example 37 | B-21 | 20/10/70 | 2.0 | D-2 | 0.05 | E-3 | 0.001 | F-1 |
| Example 38 | B-22 | 20/10/70 | 2.0 | D-3 | 0.05 | E-2 | 0.001 | F-2 |
| Example 39 | B-23 | 18/10/72 | 2.0 | D-1 | 0.05 | E-3 | 0.001 | F-1 |
| Example 40 | B-24 | 18/10/72 | 2.0 | D-1 | 0.05 | E-2 | 0.001 | F-1 |
| Example 41 | B-14 | 18/10/72 | 2.0 | D-2 | 0.05 | E-2 | 0.001 | F-1 |
| Example 42 | B-14 | 18/10/72 | 2.0 | D-3 | 0.05 | E-2 | 0.001 | F-2 |
| Example 43 | B-14 | 18/10/72 | 2.0 | D-4 | 0.05 | E-2 | 0.001 | F-1 |

TABLE 5-continued

| | Resin | Composition Ratio of Resin | Amount of Resin (g) | Photo-acid generator | Amount of Photo-acid generator (g) | Organic base | Amount of Organic Base (g) | Surfactant |
|---|---|---|---|---|---|---|---|---|
| Example 44 | B-14 | 18/10/72 | 2.0 | D-5 | 0.05 | E-2 | 0.001 | F-1 |
| Example 45 | B-14 | 18/10/72 | 2.0 | D-6 | 0.05 | E-3 | 0.001 | F-1 |
| Example 46 | B-12 | 15/7/78 | 2.0 | D-1 | 0.05 | E-2 | 0.001 | F-1 |
| Example 47 | B-12 | 15/7/78 | 2.0 | D-3 | 0.05 | E-2 | 0.001 | F-2 |
| Example 48 | B-12 | 15/7/78 | 2.0 | D-4 | 0.05 | E-2 | 0.001 | F-2 |
| Example 49 | B-12 | 15/7/78 | 2.0 | D-5 | 0.05 | E-3 | 0.001 | F-1 |
| Example 50 | B-12 | 15/7/78 | 2.0 | D-6 | 0.05 | E-2 | 0.001 | F-1 |
| Example 51 | B-14 | 18/10/72 | 2.0 | D-2/D-3 | 0.05 | E-2 | 0.001 | F-2/F-1 |
| Example 52 | B-12 | 15/7/78 | 2.0 | D-2/D-3 | 0.05 | E-2 | 0.001 | F-2/F-1 |
| Example 53 | B-14 | 18/10/72 | 2.0 | D-2/D-3 | 0.05 | E-2/E-3 | 0.001 | F-2 |
| Example 54 | B-12 | 15/7/78 | 2.0 | D-2/D-3 | 0.05 | E-2/E-3 | 0.001 | F-2 |
| Example 55 | B-14 | 18/10/72 | 2.0 | D-2/D-3 | 0.05 | E-3 | 0.001 | F-1 |
| Example 56 | B-12 | 15/7/78 | 2.0 | D-2/D-3 | 0.05 | E-2/E-3 | 0.001 | F-1 |
| Comparative Example 4 | C-1 | 40/0/60 | 2.0 | D-2 | 0.05 | E-2 | 0.001 | — |
| Comparative Example 5 | C-2 | 30/10/60 | 2.0 | D-7 | 0.05 | E-2 | 0.001 | — |
| Comparative Example 6 | C-1 | 40/0/60 | 2.0 | D-7 | 0.05 | E-2 | 0.001 | — |

TABLE 6

| | Sensitivity (mj/cm²) | Resolution (μm) | Surface Roughness | Development Defect |
|---|---|---|---|---|
| Example 23 | 19 | 0.24 | A | A |
| Example 24 | 21 | 0.25 | A | A |
| Example 25 | 22 | 0.25 | A | A |
| Example 26 | 20 | 0.25 | A | A |
| Example 27 | 20 | 0.26 | A | A |
| Example 28 | 22 | 0.25 | A | A |
| Example 29 | 23 | 0.24 | A | A |
| Example 30 | 22 | 0.24 | A | A |
| Example 31 | 21 | 0.25 | A | A |
| Example 32 | 23 | 0.24 | A | A |
| Example 33 | 21 | 0.24 | A | A |
| Example 34 | 20 | 0.24 | A | A |
| Example 35 | 21 | 0.25 | A | A |
| Example 36 | 22 | 0.24 | A | A |
| Example 37 | 21 | 0.24 | A | A |
| Example 38 | 24 | 0.24 | A | A |
| Example 39 | 22 | 0.24 | A | A |
| Example 40 | 20 | 0.24 | A | A |
| Example 41 | 22 | 0.24 | A | A |
| Example 42 | 21 | 0.25 | A | A |
| Example 43 | 21 | 0.26 | A | A |
| Example 44 | 22 | 0.25 | A | A |
| Example 45 | 22 | 0.25 | A | A |
| Example 46 | 20 | 0.24 | A | A |
| Example 47 | 19 | 0.24 | A | A |
| Example 48 | 19 | 0.25 | A | A |
| Example 49 | 20 | 0.25 | A | A |
| Example 50 | 21 | 0.25 | A | A |
| Example 51 | 20 | 0.24 | A | A |
| Example 52 | 21 | 0.25 | A | A |
| Example 53 | 22 | 0.24 | A | A |
| Example 54 | 22 | 0.24 | A | A |
| Example 55 | 21 | 0.25 | A | A |
| Example 56 | 22 | 0.24 | A | A |
| Comparative Example 4 | 20 | 0.28 | C | C |
| Comparative Example 5 | 22 | 0.29 | C | C |
| Comparative Example 6 | 28 | 0.28 | C | C |

It can be seen from the results of Table 6 that the positive photoresist compositions of the present invention exhibited further improved surface roughness and development defect and satisfactory results, while the comparative photoresist compositions exhibited unsatisfactory results particularly in roughness of resist surface and development defect.

According to the present invention, a chemical amplification-type positive photoresist composition having high sensitivity and high resolution and being improved in the development defect and surface roughness is provided.

While the invention has been described in detail and with reference to specific embodiments thereof, it will be apparent to one skilled in the art that various changes and modifications can be made therein without departing from the spirit and scope thereof.

What is claimed is:

1. A positive photoresist composition comprising:
   (a) a resin having a structural unit represented by the following formula (I) and being capable of decomposing by the action of an acid to increase the solubility in an alkali developer, and
   (b) a compound capable of generating an acid with irradiation of actinic ray or radiation:

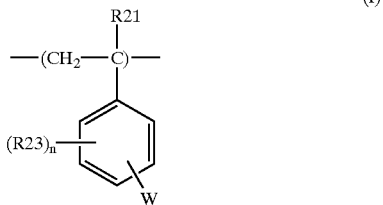

(I)

wherein R21 represents a hydrogen atom or a methyl group, R23 represents a hydrogen atom, a halogen atom, an alkyl group, an aryl group, an alkoxy group, an acyl group or an acyloxy group, n represents an integer of from 1 to 3 and W represents a group represented by the following formula:

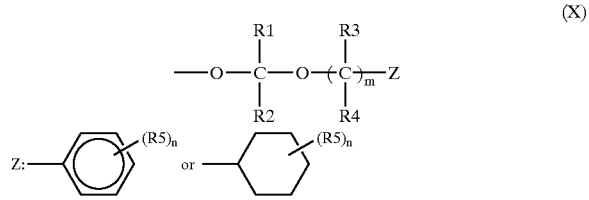

(X)

wherein R1 represents a hydrogen atom, R2 represents a hydrogen atom or an alkyl group having from 1 to 4 carbon atoms, R3 and R4, which may be the same or different, each represents a hydrogen atom or a linear, branched or cyclic alkyl group which may have a substituent, R5 represents a linear, branched or cyclic alkyl group which may have a substituent, an aryl group which may have a substituent or an aralkyl group which may have a substituent, m represents an integer of from 1 to 20, and n represents an integer of from 0 to 5.

2. The positive photoresist composition as claimed in claim 1, wherein the compound (b) capable of generating an acid with irradiation of actinic ray or radiation is at least one of the compounds capable of generating a sulfonic acid with irradiation of actinic ray or radiation, represented by the following formulae (A-1), (A-2), (A-3), (A-4), (A-5), (A-6) and (A-7);

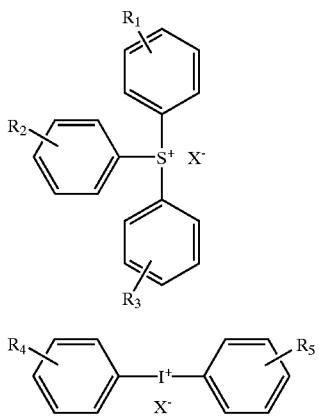

(A-1)

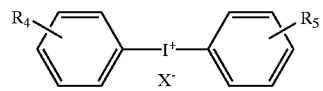

(A-2)

wherein $R_1$ to $R_5$, which may be the same or different, each represents a hydrogen atom, an alkyl group, a cycloalkyl group, an alkoxy group, a hydroxy group, a halogen atom, or —S—$R_6$ wherein $R_6$ represents an alkyl group or an aryl group, and $X^-$ represents an anion of benzene sulfonic acid, naphthalene sulfonic acid or anthracene sulfonic acid having at least one group selected from the group consisting of a branched or cyclic alkyl or alkoxy group having 8 or more carbon atoms, at least two groups selected from the group consisting of a linear, branched or cyclic alkyl or alkoxy group having from 4 to 7 carbon atoms, at least three groups selected from the group consisting of a linear or branched alkyl or alkoxy group having from 1 to 3 carbon atoms, from 1 to 5 halogen atoms, or a linear or branched ester group having from 1 to 10 carbon atoms;

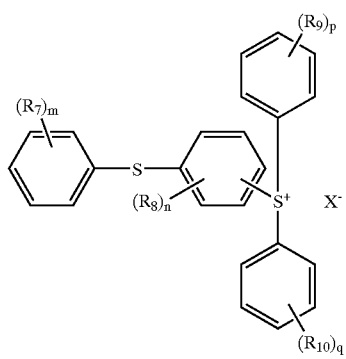

(A-3)

wherein $R_7$ to $R_{10}$, which may be the same or different, each represent a hydrogen atom, an alkyl group, a cycloalkyl group, an alkoxy group, a hydroxy group or a halogen atom, $X^-$ represents an anion of benzene sulfonic acid, naphthalene sulfonic acid or anthracene sulfonic acid having at least one group selected from the group consisting of a branched or cyclic alkyl or alkoxy group having 8 or more carbon atoms, at least two groups selected from the group consisting of a linear, branched or cyclic alkyl or alkoxy group having from 4 to 7 carbon atoms, at least three groups selected from the group consisting of a linear or branched alkyl or alkoxy group having from 1 to 3 carbon atoms, from 1 to 5 halogen atoms, or a linear or branched ester group having from 1 to 10 carbon atoms, and m, n, p and q each represents an integer of from 1 to 3;

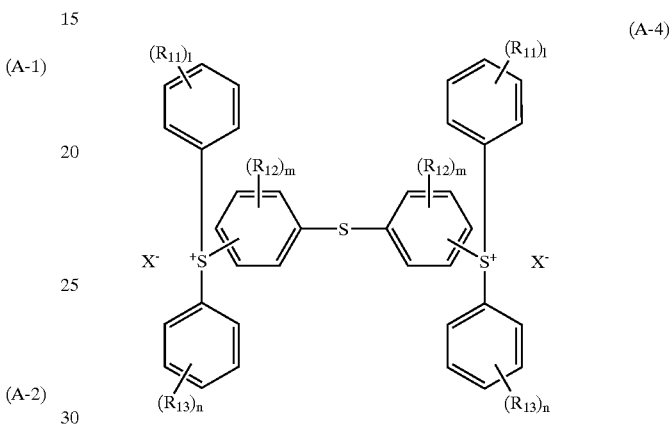

(A-4)

wherein $R_{11}$ to $R_{13}$, which may be the same or different, each represents a hydrogen atom, an alkyl group, a cycloalkyl group, an alkoxy group, a hydroxy group, a halogen atom or —S—$R_6$, $X^-$ has the same meaning as defined above, l, m and n, which may be the same or different, each represents an integer of from 1 to 3, and when l, m and n each is 2 or 3, two groups out of two or three $R_{11}$, $R_{12}$ or $R_{13}$ groups may be combined with each other to form a ring consisting of from 5 to 8 elements, including a carbocyclic, heterocyclic or aromatic ring;

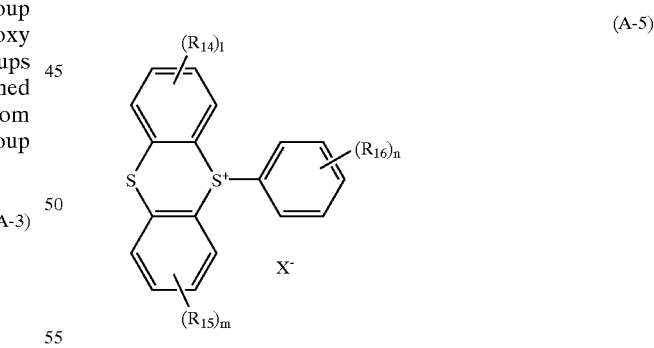

(A-5)

wherein $R_{14}$ to $R_{16}$, which may be the same or different, each represents a hydrogen atom, an alkyl group, a cycloalkyl group, an alkoxy group, a hydroxy group, a halogen atom or —S—$R_6$, $R_6$ and $X^-$ have the same meanings as defined above, l, m and n, which may be the same or different, each represents an integer of from 1 to 3, and when l, m and n each is 2 or 3, two out of 2 or 3 groups with respect to each of $R_{14}$, $R_{15}$ or $R_{16}$ may be combined with each other to form a ring consisting of from 5 to 8 elements, including a carbocyclic, heterocyclic or aromatic ring;

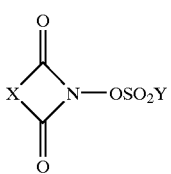
(A-6)

wherein Y represents a linear, branched or cyclic alkyl group which may be substituted, an aralkyl group which may be substituted, or

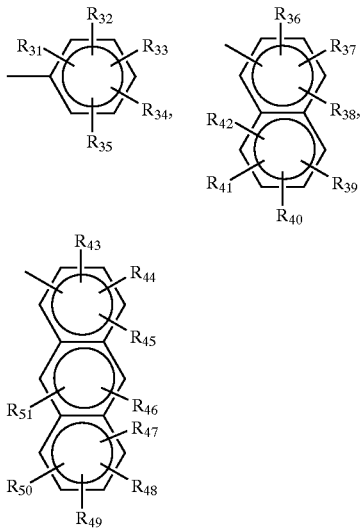

wherein $R_{31}$ to $R_{51}$, which may be the same, each represents a hydrogen atom, a linear, branched or cyclic alkyl, alkoxy, acyl, acylamino, sulfonylamino, aryl, acyloxy, aralkyl or alkoxycarbonyl group which may have a substituent, a formyl group, a nitro group, chlorine atom, bromine atom, iodine atom, a hydroxyl group or a cyano group, and two of $R_{31}$ to $R_{35}$, two of $R_{36}$ to $R_{42}$, or two of $R_{43}$ to $R_{51}$ may be combined to form a 5-, 6-, 7- or 8-membered ring consisting of a carbon and/or hetero atom, provided that Y may be combined with a residue of another imido sulfonate compound, and X represents a linear or branched alkylene group which may have a substituent, a monocyclic or polycyclic alkylene group which may have a substituent or may contain a hetero atom, a linear or branched alkylene group which may be substituent, a monocyclic or polycyclic alkenylene group which may be substituted or may contain a hetero atom, an arylene group which may be substituted, or an aralkylene group which may be substituted, provided that X may be combined with another imido sulfonate residue; and

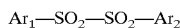  (A-7)

wherein $Ar_1$ and $Ar_2$, which may be the same or different, each represents a substituted or unsubstituted aryl group.

3. The positive photoresist composition as claimed in claim 1, which further contains a cyclic amine compound.

4. The positive photoresist composition as claimed in claim 3, wherein the cyclic amine compound is a compound represented by formula (F):

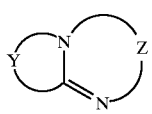  (F)

wherein Y and Z each independently represents a linear, branched or cyclic alkylene group which may contain a hetero atom or may be substituted.

5. The positive photoresist composition as claimed in claim 1, which further contains at least one of a fluorine surfactant and a silicon surfactant.

6. The positive photoresist composition as claimed in claim 1, which further contains a compound capable of decomposing by the action of an acid to increase the solubility in an alkali developer and having at least one aromatic ring.

7. The positive photoresist composition as claimed in claim 1, which further contains an organic basic compound having at least one structure represented by formulae (A) to (E):

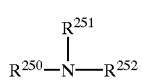  (A)

wherein $R^{250}$, $R^{251}$ and $R^{252}$, which may be the same or different, each represents a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbon atoms, provided that $R^{251}$ and $R^{252}$ may be combined with each other to form a ring;

  (B)

  (C)

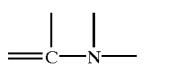  (D)

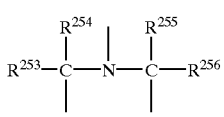  (E)

wherein $R^{253}$, $R^{254}$, $R^{255}$ and $R^{256}$, which may be the same or different, each represents an alkyl group having from 1 to 6 carbon atoms.

8. A positive photoresist composition comprising:

(a) a resin having structural units represented by the following formulae (I), (II) and (III) and being capable of decomposing by the action of an acid to increase the solubility in an alkali developer, and (b) a compound capable of generating an acid with irradiation of actinic ray or radiation:

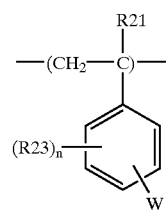

(I)

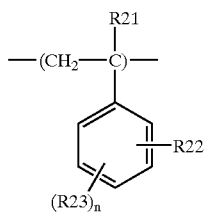

(II)

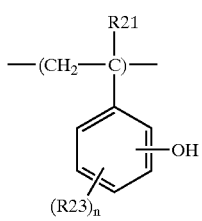

(III)

wherein R21 represents a hydrogen atom or a methyl group, R22 represents a group incapable of decomposing by the action of an acid, R23 represents a hydrogen atom, a halogen atom, an alkyl group, an aryl group, an alkoxy group, an acyl group or an acyloxy group, n represents an integer of from 1 to 3 and W represents a group represented by the following formula:

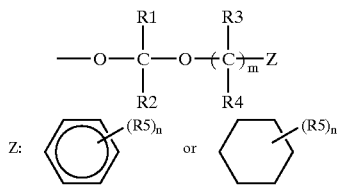

(X)

wherein R1 represents a hydrogen atom, R2 represents a hydrogen atom or an alkyl group having from 1 to 4 carbon atoms, R3 and R4, which may be the same or different, each represents a hydrogen atom or a linear, branched or cyclic alkyl group which may have a substituent, R5 represents a linear, branched or cyclic alkyl group which may have a substituent, an aryl group which may have a substituent or an aralkyl group which may have a substituent, m represents an integer of from 1 to 20, and n represents an integer of from 0 to 5.

9. The positive photoresist composition as claimed in claim 8, wherein the ratio of structural formulae (I), (II) and (III) satisfies the following conditions (1) to (4):

0.10<(I)/((I)+(II)+(III))<0.25, (1)

0.01<(II)/((I)+(II)+(III))<0.15, (2)

(I)>(II), and (3)

0.5<(I)/((I)+(II))<0.85 (4)

(wherein (I), (II) and (III) each represents a molar fraction of a structural units having a group represented by formula (I), (II) or (III), respectively).

10. The positive photoresist composition as claimed in claim 8, wherein the compound (b) capable of generating an acid with irradiation Df actinic ray or radiation is at least one of the compounds capable of generating a sulfonic acid with irradiation of actinic ray or radiation, represented by the following formulae (A-1), (A-2), (A-3), (A-4), (A-5), (A-6) and (A-7);

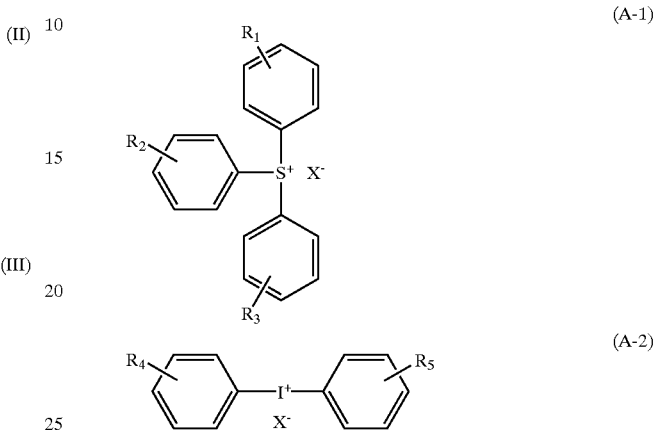

wherein $R_1$ to $R_5$, which may be the same or different, each represents a hydrogen atom, an alkyl group, a cycloalkyl group, an alkoxy group, a hydroxy group, a halogen atom, or —S—$R_6$ wherein $R_6$ represents an alkyl group or an aryl group, and $X^-$ represents an anion of benzene sulfonic acid, naphthalene sulfonic acid or anthracene sulfonic acid having at least one group selected from the group consisting of a branched or cyclic alkyl or alkoxy group having 8 or more carbon atoms, at least two groups selected from the group consisting of a linear, branched or cyclic alkyl or alkoxy group having from 4 to 7 carbon atoms, at least three groups selected from the group consisting of a linear or branched alkyl or alkoxy group having from 1 to 3 carbon atoms, from 1 to 5 halogen atoms, or a linear or branched ester group having from 1 to 10 carbon atoms;

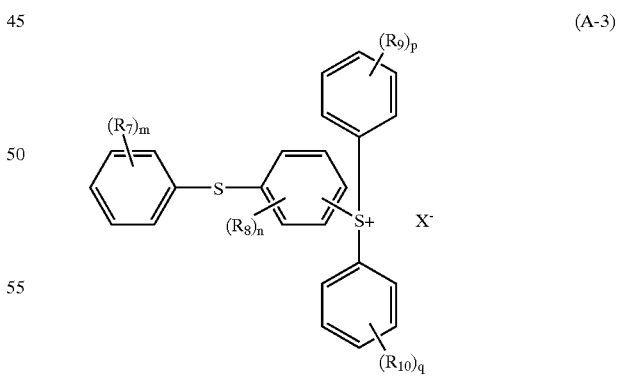

(A-3)

wherein $R_7$ to $R_{10}$, which may be the same or different, each represent a hydrogen atom, an alkyl group, a cycloalkyl group, an alkoxy group, a hydroxy group or a halogen atom, $X^-$ represents an anion of benzene sulfonic acid, naphthalene sulfonic acid or anthracene sulfonic acid having at least one group selected from the group consisting of a branched or cyclic alkyl or alkoxy group having 8 or more carbon atoms, at least two groups selected from the group consisting of a linear, branched or cyclic alkyl or alkoxy group having from 4 to 7 carbon atoms, at least three groups selected from the group consisting of a linear or branched alkyl or alkoxy group having from 1 to 3 carbon atoms, from 1 to 5 halogen atoms, or a linear or branched ester group having from 1 to 10 carbon atoms, and m, n, p and q each represents an integer of from 1 to 3;

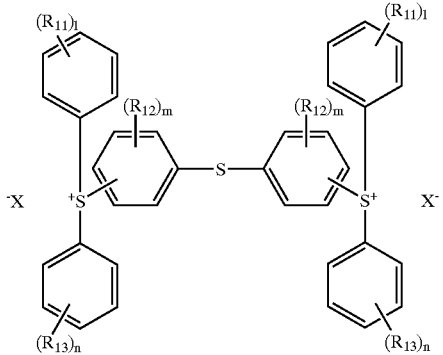

(A-4)

wherein $R_{11}$ to $R_{13}$, which may be the same or different, each represents a hydrogen atom, an alkyl group, a cycloalkyl group, an alkoxy group, a hydroxy group, a halogen atom or —S—$R_6$, $X^-$ has the same meaning as defined above, 1, m and n, which may be the same or different, each represents an integer of from 1 to 3, and when l, m and n each is 2 or 3, two groups out of two or three $R_{11}$, $R_{12}$ or $R_{13}$ groups may be combined with each other to form a ring consisting of from 5 to 8 elements, including a carbocyclic, heterocyclic or aromatic ring;

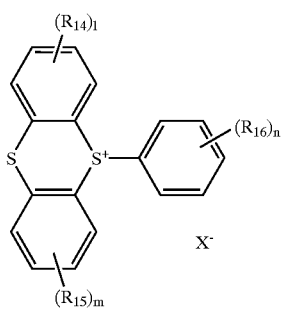

(A-5)

wherein $R_{14}$ to $R_{16}$, which may be the same or different, each represents a hydrogen atom, an alkyl group, a cycloalkyl group, an alkoxy group, a hydroxy group, a halogen atom or —S—$R_6$, $R_6$ and $X^-$ have the same meanings as defined above, 1, m and n, which may be the same or different, each represents an integer of from 1 to 3, and when l, m and n each is 2 or 3, two out of 2 or 3 groups with respect to each of $R_{14}$, $R_{15}$ or $R_{16}$ may be combined with each other to form a ring consisting of from 5 to 8 elements, including a carbocyclic, heterocyclic or aromatic ring;

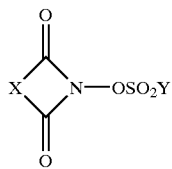

(A-6)

wherein Y represents a linear, branched or cyclic alkyl group which may be substituted, an aralkyl group which may be substituted, or

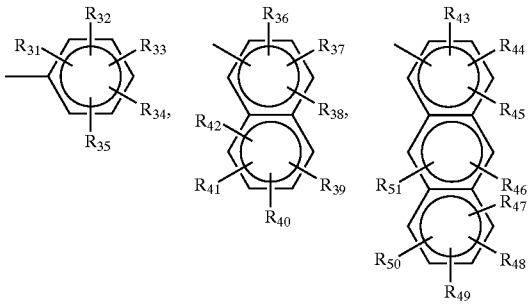

wherein $R_{31}$ to $R_{51}$, which may be the same, each represents a hydrogen atom, a linear, branched or cyclic alkyl, alkoxy, acyl, acylamino, sulfonylamino, aryl, acyloxy, aralkyl or alkoxycarbonyl group which may have a substituent, a formyl group, a nitro group, chlorine atom, bromine atom, iodine atom, a hydroxyl group or a cyano group, and two of $R_{31}$ to $R_{35}$, two of $R_{36}$ to $R_{42}$, or two of $R_{43}$ to $R_{51}$ may be combined to form a 5-, 6-, 7- or 8-membered ring consisting of a carbon and/or hetero atom, provided that Y may be combined with a residue of another imido sulfonate compound, and X represents a linear or branched alkylene group which may have a substituent, a monocyclic or polycyclic alkylene group which may have a substituent or may contain a hetero atom, a linear or branched alkylene group which may be substituent, a monocyclic or polycyclic alkenylene group which may be substituted or may contain a hetero atom, an arylene group which may be substituted, or an aralkylene group which may be substituted, provided that X may be combined with another imido sulfonate residue; and $$Ar_1-SO_2-SO_2-Ar_2 \quad (A-7)$$

wherein $Ar_1$ and $Ar_2$, which may be the same or different, each represents a substituted or unsubstituted aryl group.

11. The positive photoresist composition as claimed in claim 8, which further contains a cyclic amine compound.

12. The positive photoresist composition as claimed in claim 8, which further contains at least one of a fluorine surfactant and a silicon surfactant.

13. The positive photoresist composition as claimed in claim 8, which further contains a compound capable of decomposing by the action of an acid to increase the solubility in an alkali developer and having at least one aromatic ring.

* * * * *